United States Patent
You et al.

(10) Patent No.: US 9,655,288 B2
(45) Date of Patent: May 16, 2017

(54) ELECTRONIC DEVICE AND CAR BATTERY CHARGER

(71) Applicant: Delta Electronics (Shanghai) Co., Ltd., Shanghai (CN)

(72) Inventors: Pei-Ai You, Shanghai (CN); Xing-Xian Lu, Shanghai (CN); Gang Liu, Shanghai (CN); Jin-Fa Zhang, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 173 days.

(21) Appl. No.: 14/549,562

(22) Filed: Nov. 21, 2014

(65) Prior Publication Data

US 2015/0145469 A1 May 28, 2015

(30) Foreign Application Priority Data

Nov. 26, 2013 (CN) .......................... 2013 1 0617615

(51) Int. Cl.
*H05K 7/20* (2006.01)
*H02J 7/00* (2006.01)
*H05K 7/14* (2006.01)
*H05K 1/18* (2006.01)

(52) U.S. Cl.
CPC ............ *H05K 7/209* (2013.01); *H02J 7/0042* (2013.01); *H05K 1/182* (2013.01); *H05K 7/1432* (2013.01); *H05K 7/20909* (2013.01); *H05K 7/20927* (2013.01)

(58) Field of Classification Search
CPC ....... H02J 7/0042; H05K 7/20; H05K 7/2009; H05K 1/182; H05K 1/141; H05K 5/00; G06F 1/18; G06F 1/20

USPC ..... 361/679.46, 679.54, 704, 709, 710, 714, 361/719–724, 730, 752, 794–797; 174/16.3, 35, 50, 50.52, 52.1, 35 R, 174/35 GC; 165/80.2, 80.3, 80.4, 104.33, 165/185; 363/56.02, 64, 65
See application file for complete search history.

(56) References Cited

U.S. PATENT DOCUMENTS

| 6,091,604 | A | 7/2000 | Plougsgaard et al. |
| 6,700,795 | B1 * | 3/2004 | Jones ................... H05K 1/141 |
| | | | 307/10.8 |
| 6,894,906 | B2 * | 5/2005 | Sivertsen ............. H04L 67/025 |
| | | | 361/704 |

(Continued)

FOREIGN PATENT DOCUMENTS

| CN | 102611177 A | 7/2012 |
| CN | 102646999 A | 8/2012 |

(Continued)

*Primary Examiner* — Zachary M Pape
(74) *Attorney, Agent, or Firm* — CKC & Partners Co., Ltd.

(57) ABSTRACT

An electronic device includes a heat-dissipating base, a first printed wiring board assembly, and a second printed wiring board assembly. The first printed wiring board assembly is disposed on the heat-dissipating base. The first printed wiring board assembly includes a first printed wiring board and at least one first electronic component. The first electronic component is disposed on the first printed wiring board, such that the first printed wiring board assembly has a raised portion and a concave portion relative to the raised portion. The second printed wiring board assembly is at least partially disposed in the concave portion.

37 Claims, 55 Drawing Sheets

(56) References Cited

U.S. PATENT DOCUMENTS

| | | | | |
|---|---|---|---|---|
| 7,269,019 B2* | 9/2007 | Hirata | ............... | H05K 1/0203 |
| | | | | 361/707 |
| 7,746,654 B2* | 6/2010 | Franz | ............... | H05K 7/1487 |
| | | | | 361/679.02 |
| 8,385,073 B2* | 2/2013 | Tam | ............... | H01L 25/0652 |
| | | | | 361/679.54 |
| 8,625,284 B2* | 1/2014 | Rai | ............... | H05K 1/0204 |
| | | | | 165/104.33 |
| 8,971,038 B2* | 3/2015 | Sharaf | ............... | H05K 7/209 |
| | | | | 165/104.33 |
| 2008/0089020 A1* | 4/2008 | Hiew | ............... | H05K 9/0067 |
| | | | | 361/679.31 |
| 2009/0185352 A1* | 7/2009 | Ellsworth | ............... | H05K 1/0204 |
| | | | | 361/720 |
| 2013/0100632 A1* | 4/2013 | Ibori | ............... | H02M 7/003 |
| | | | | 361/807 |

FOREIGN PATENT DOCUMENTS

| | | |
|---|---|---|
| EP | 0751540 A1 | 1/1997 |
| GB | 2336254 A | 10/1999 |
| JP | 61-212100 | 9/1986 |
| JP | U4-105505 | 9/1992 |
| JP | 10-210762 A | 8/1998 |
| JP | 2000-116118 A | 4/2000 |
| JP | 2001-257442 A | 9/2001 |
| JP | 2006-261387 A | 9/2006 |
| JP | 2012-156402 A | 8/2012 |
| JP | 3186607 U | 9/2013 |
| JP | 2013-214770 A | 10/2013 |
| WO | 2013088217 A1 | 6/2013 |
| WO | 2013/140502 A1 | 9/2013 |

* cited by examiner

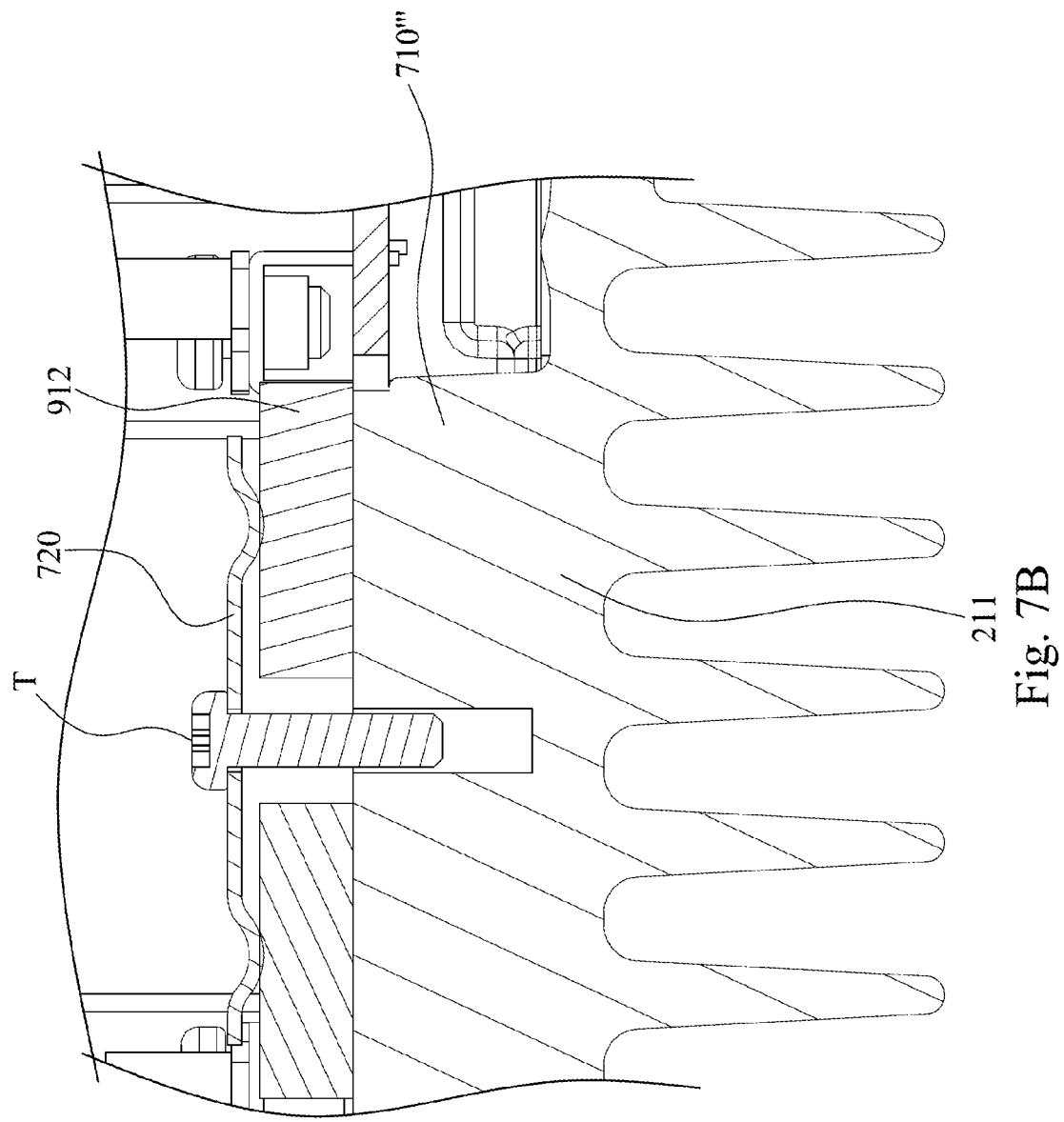

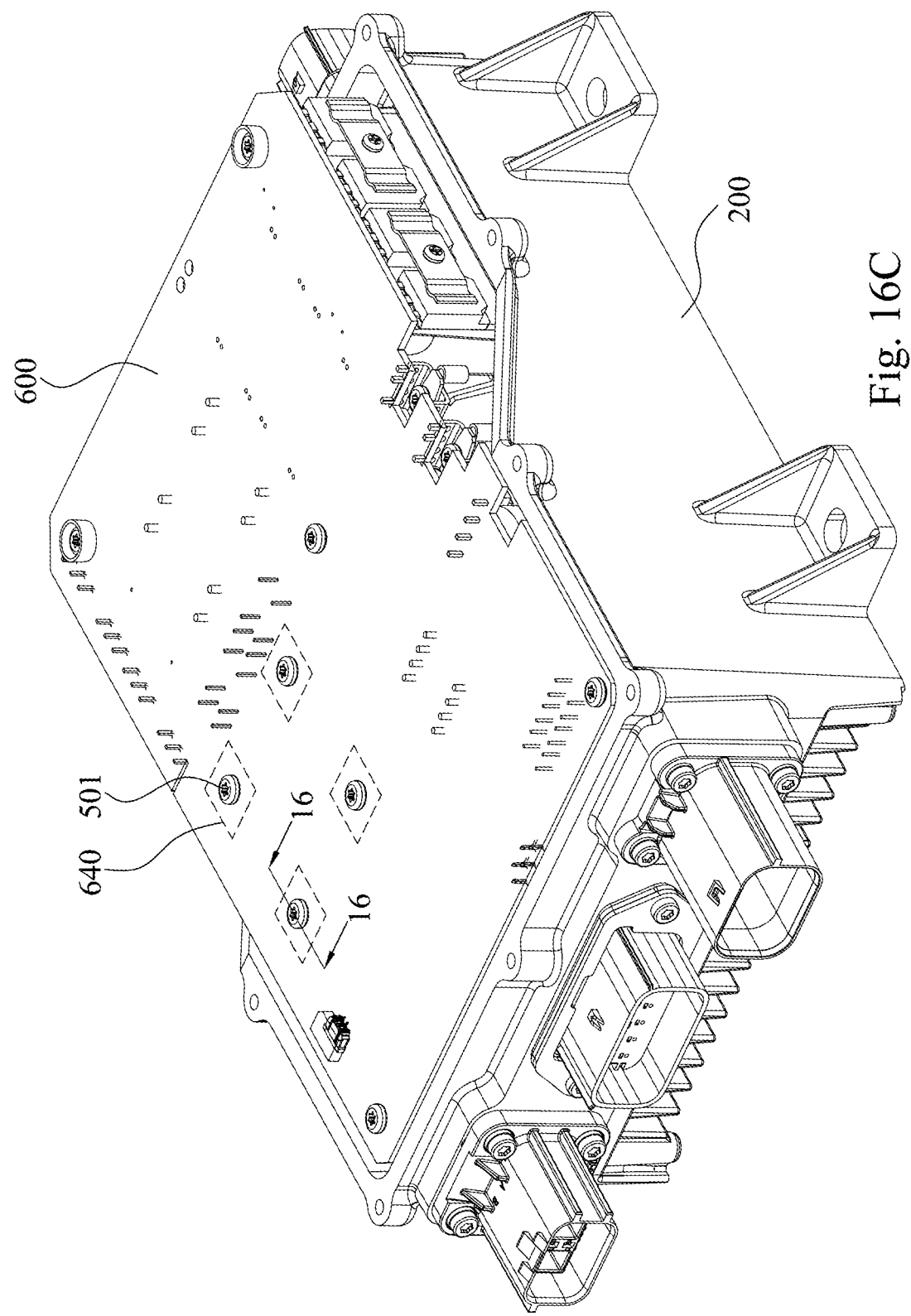

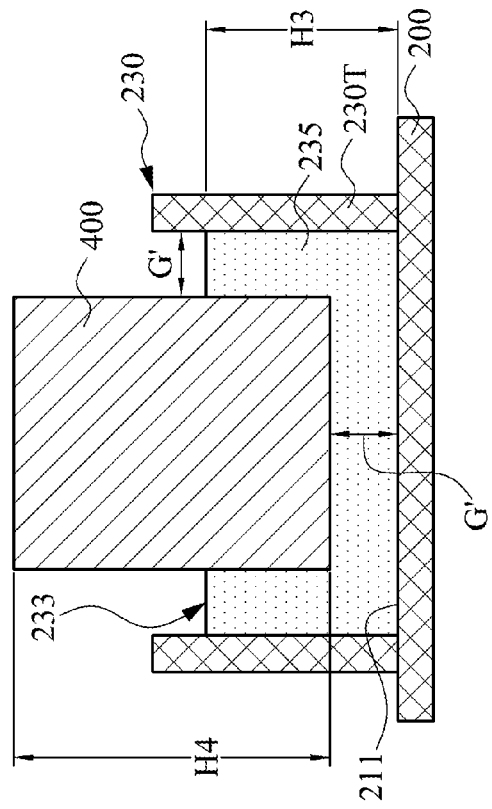
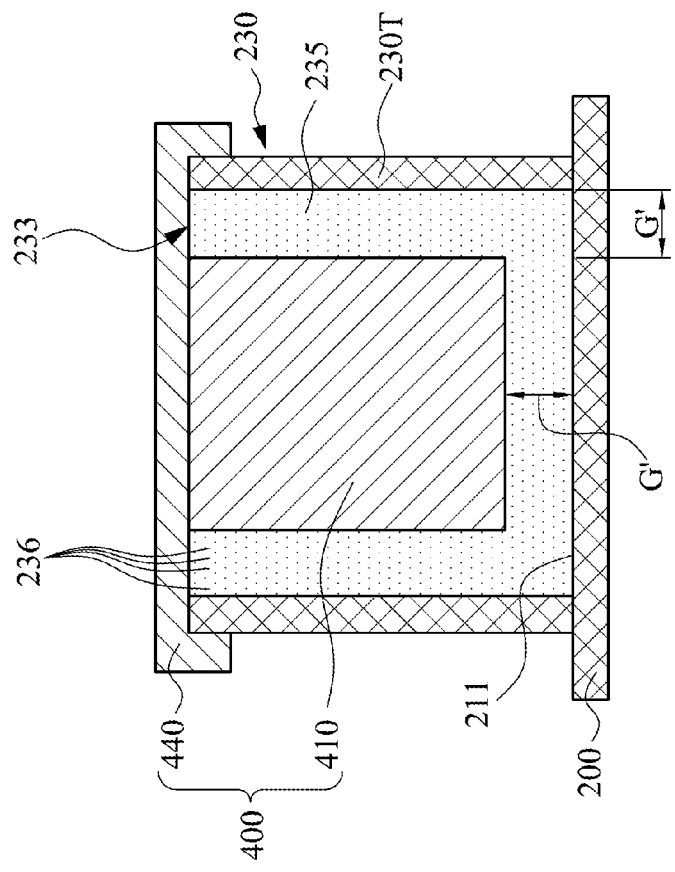
Fig. 19B
Fig. 19A

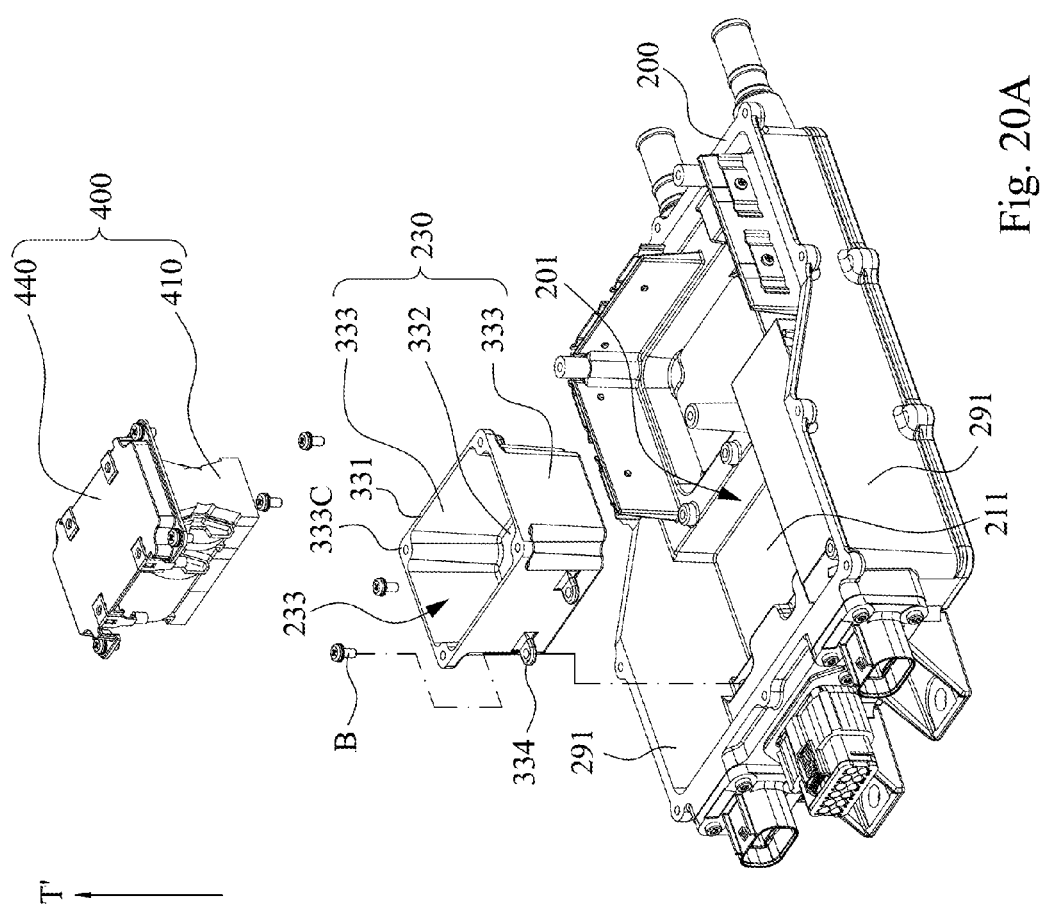

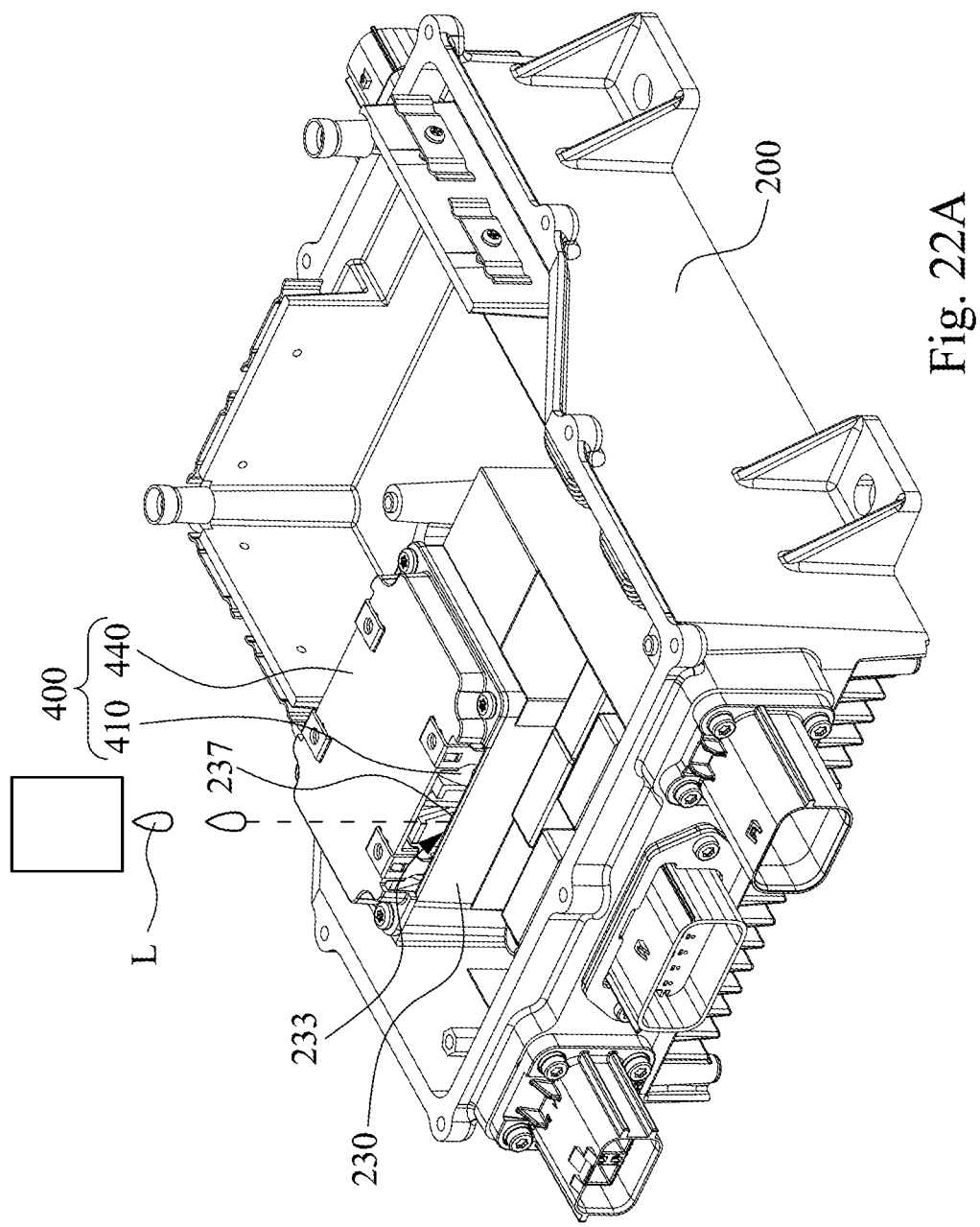

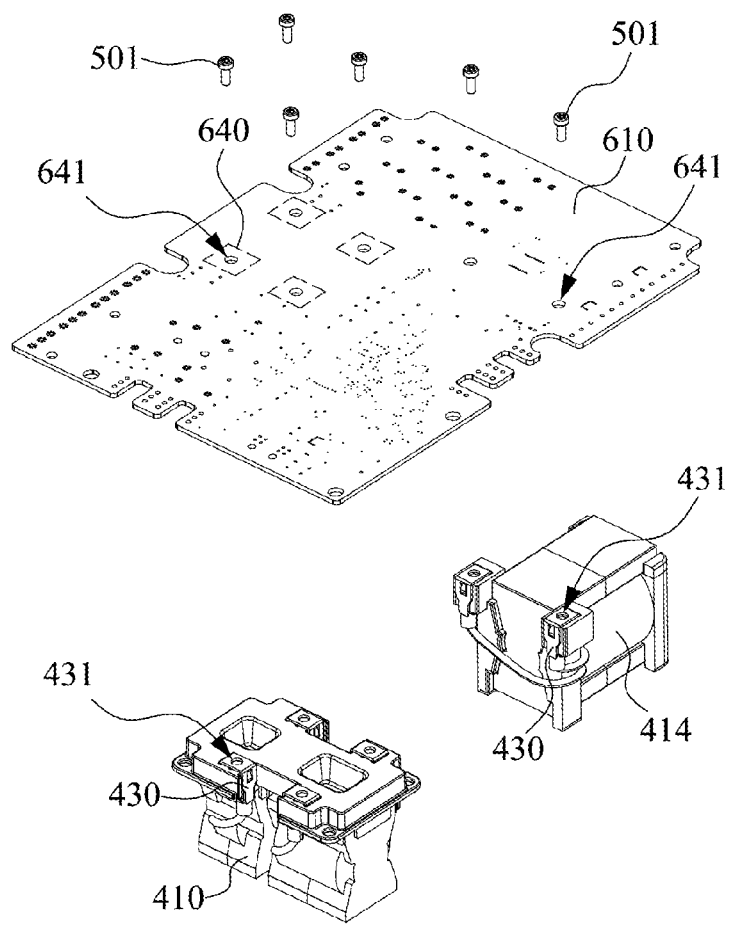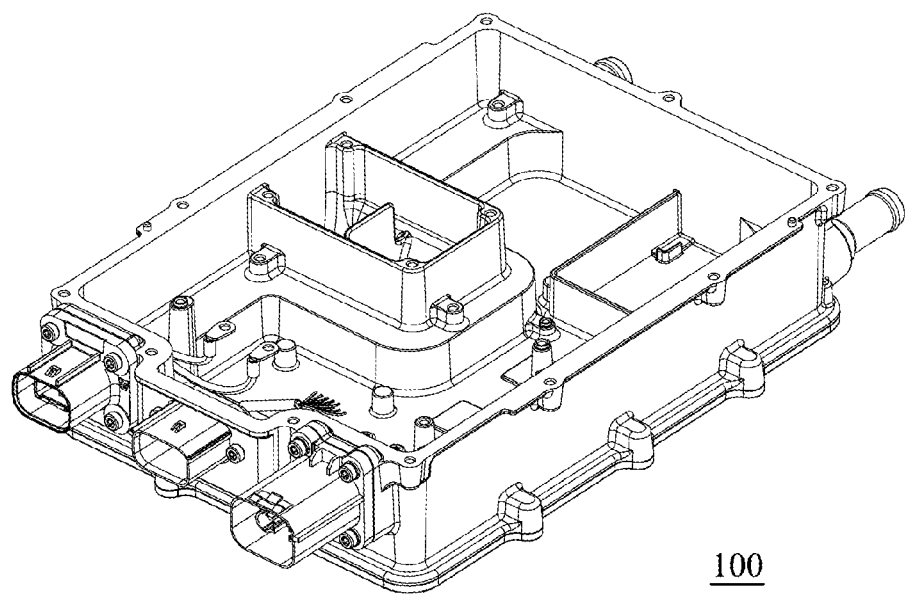
Fig. 24

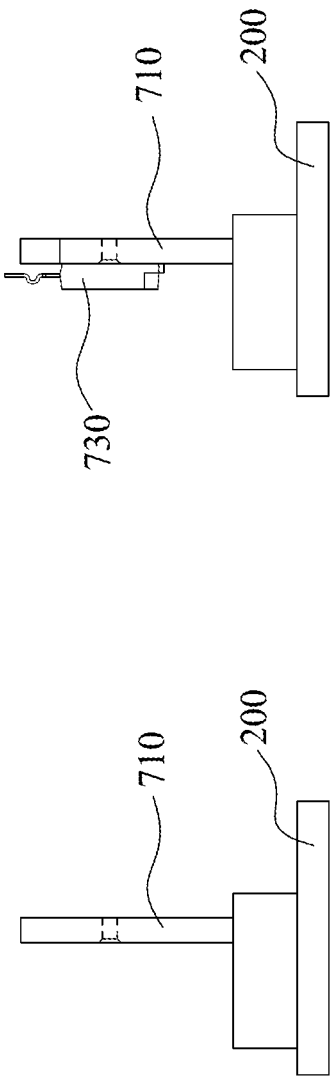
Fig. 39A
Fig. 39B
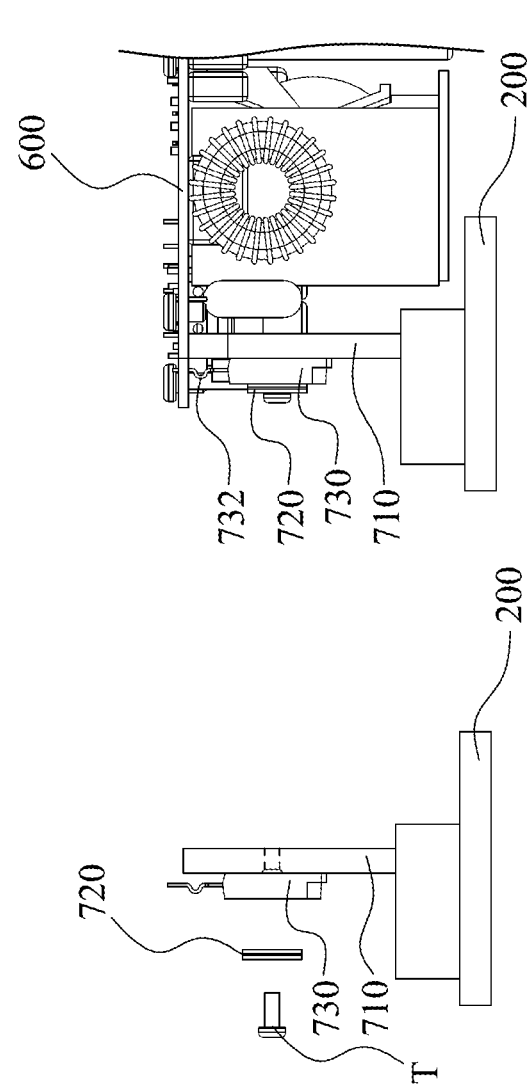
Fig. 39C
Fig. 39D

US 9,655,288 B2

ELECTRONIC DEVICE AND CAR BATTERY CHARGER

RELATED APPLICATIONS

This application claims priority to Chinese Application Serial Number 201310617615.4, filed Nov. 26, 2013, which is herein incorporated by reference.

BACKGROUND

In recent years, the electric vehicles have achieved great improvements in the core technologies and have been gradually entering the stage of practical use and small scale industrialization.

As one of the key components of electric vehicle, the OBCM (on board charge module) is an electronic device mounted on board for charging battery packs. The OBCM uses input wires to receive alternative current from the AC power grid, and outputs high voltage direct current to charge the on board high voltage battery pack, and uses a communication port to maintain real-time interactive communications with a battery management system (BMS). Due to the severe on board operation conditions, the structure and packaging design and as well as the thermal management are the key challenges for OBCM design.

SUMMARY

In one embodiment, an electronic device is provided. The electronic device includes a heat-dissipating base, a first printed wiring board assembly, and a second printed wiring board assembly. The first printed wiring board assembly is disposed on the heat-dissipating base. The first printed wiring board assembly includes a first printed wiring board and at least one first electronic component. The first electronic component is disposed on the first printed wiring board, such that the first printed wiring board assembly has a raised portion and a concave portion relative to the raised portion. The second printed wiring board assembly is at least partially disposed in the concave portion.

In another embodiment, a car battery charger is provided. The car battery charger includes a heat-dissipating base, an input board assembly, an output board assembly, and a main power board assembly. The input board assembly is connected to an input and receives an input signal. The output board assembly is connected to an output and outputs an output signal. The main power board assembly is disposed on the heat-dissipating base and electrically connected to the input board assembly and the output board assembly, for converting the input signal to the output signal. The main power board assembly includes a main printed wiring board and at least one first electronic component. The first electronic component is disposed on the main printed wiring board, such that the main power board assembly has a raised portion and a concave portion relative to the raised portion. At least one of the input board assembly and the output board assembly is at least partially disposed in the concave portion.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 7B is a cross-sectional view of FIG. 7A

FIG. 16C is an assembled view of the heat-dissipating base and the first printed wiring board assembly of FIG. 16A;

FIG. 19A is a schematic cross-sectional view after the heat-dissipating base and the first electromagnetic induction module are assembled according to one embodiment of this disclosure;

FIG. 19B is a schematic cross-sectional view after the heat-dissipating base and the first electromagnetic induction module are assembled according to one embodiment of this disclosure;

FIG. 20A is an exploded view of the heat-dissipating base, an independent three-dimensional structure, and the first electromagnetic induction module according to one embodiment of this disclosure;

FIG. 22A is a 3-D view illustrating a potting glue injected between the three-dimensional structure and the magnetic component;

FIG. 24 is an exploded view of the electronic device according to another embodiment of this disclosure;

FIGS. 39A to 39D are diagrams of intermediate sequential stages showing the method of FIG. 38.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
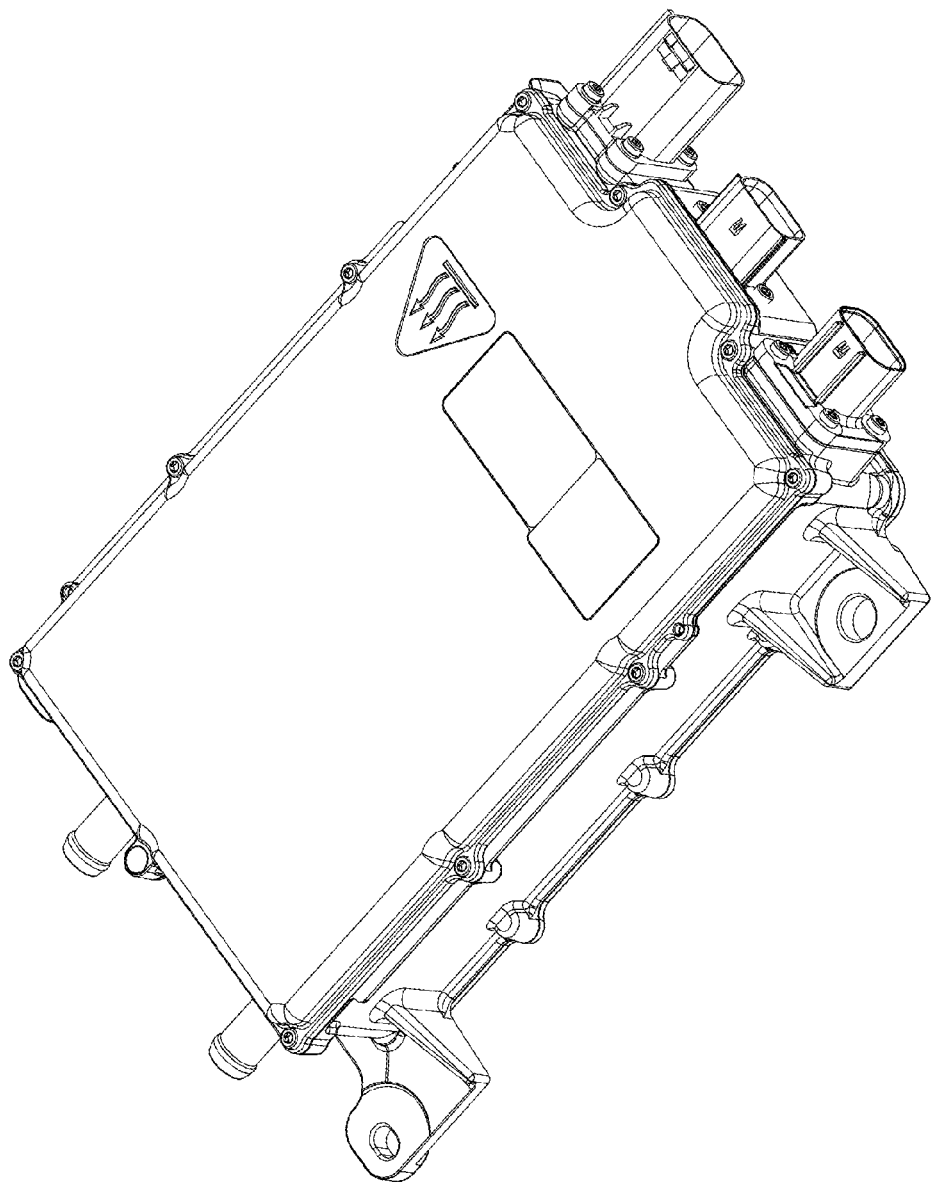
FIG. 1 is a 3-D view of an electronic device according to one embodiment of this disclosure.

FIG. 1 is a 3-D view of an electronic device 100 according to one embodiment of this disclosure. The electronic device 100 can be a power conversion device. Specifically, the electronic device 100 can be a car battery charger for a hybrid electric vehicle or an electric vehicle.

Figure 2:
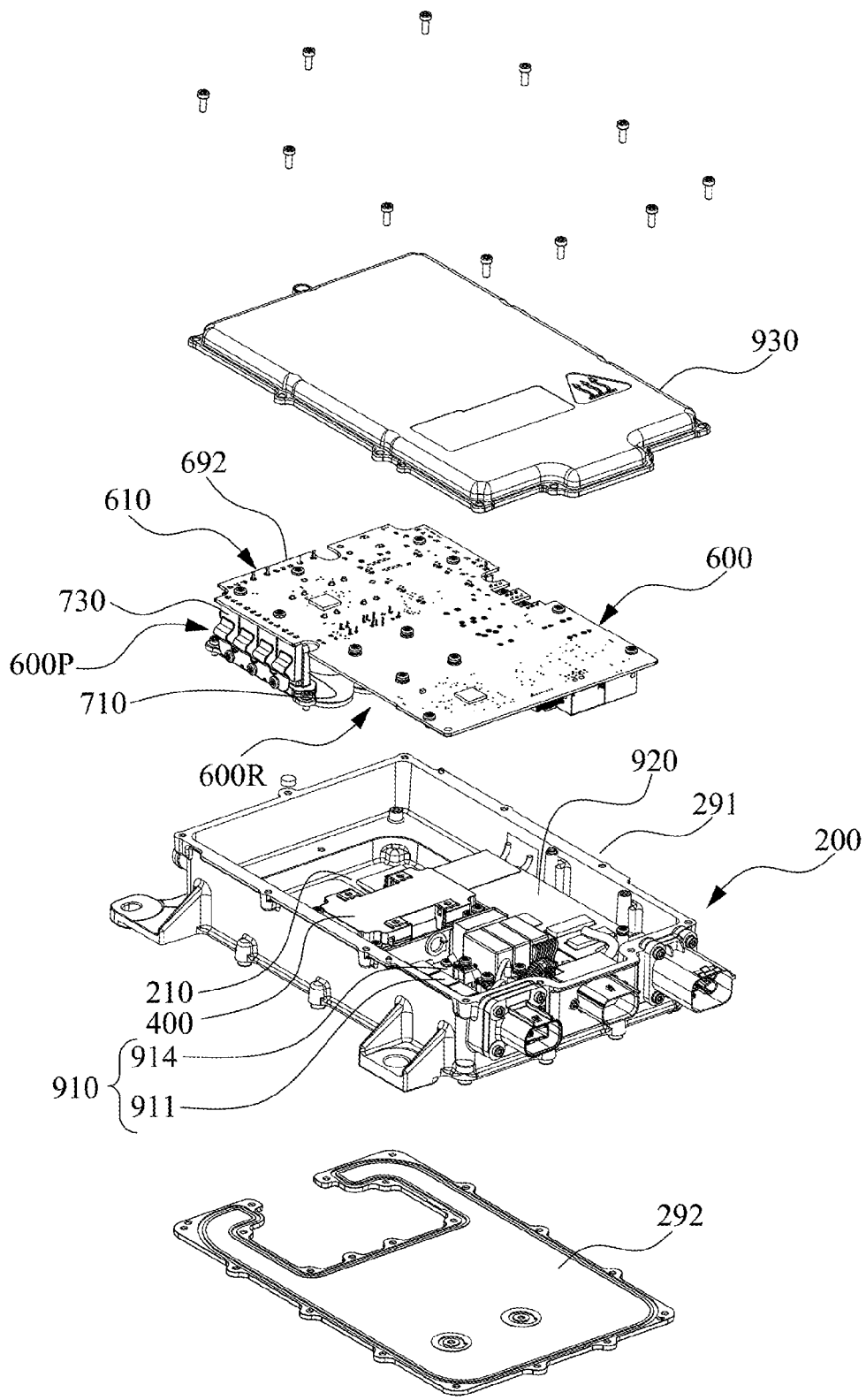
FIG. 2 is an exploded view of the electronic device according to one embodiment of this disclosure.

FIG. 2 is an exploded view of the electronic device 100 according to one embodiment of this disclosure. As shown in FIG. 2, the electronic device 100 includes a heat-dissipating base 200, a first printed wiring board assembly 600, and a second printed wiring board assembly 910. The first printed wiring board assembly 600 is disposed on the heat-dissipating base 200.

Figure 3:
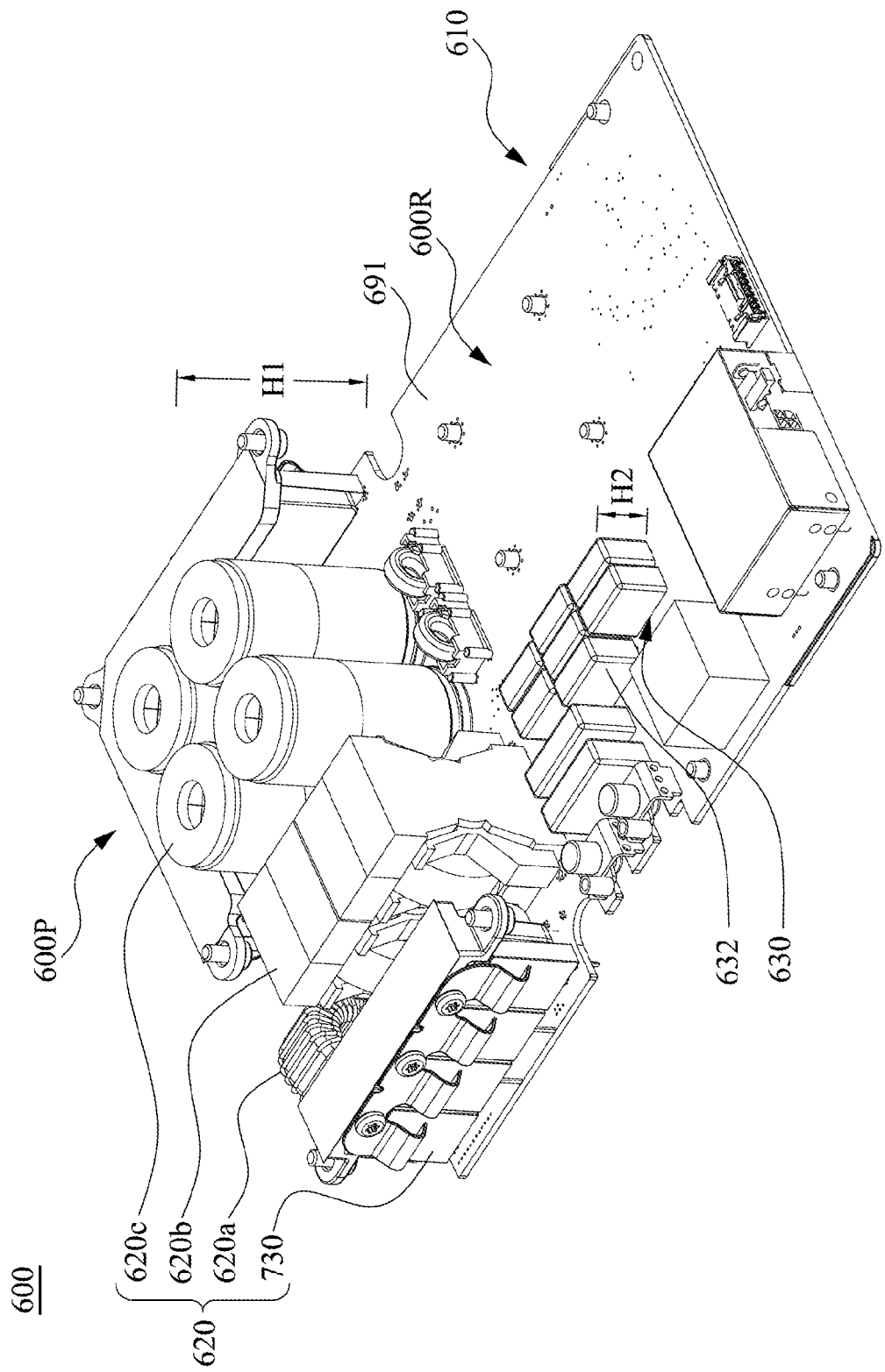
FIG. 3 is a 3-D view of a first printed wiring board assembly according to one embodiment of this disclosure.

FIG. 3 is a 3-D view of the first printed wiring board assembly 600 according to one embodiment of this disclosure. As shown in FIG. 2 and FIG. 3, the first printed wiring board assembly 600 includes a first printed wiring board 610 and at least one first electronic component 620. The first electronic component 620 is disposed on the first printed wiring board 610, such that the first printed wiring board assembly 600 has a raised portion 600P and a concave portion 600R relative to the raised portion 600P. The second printed wiring board assembly 910 is at least partially disposed in the concave portion 600R.

The first printed wiring board assembly 600 and the second printed wiring board assembly 910 is disposed in an internal space of the electronic device 100. By properly arranging the position of the first electronic component 620 on the first printed wiring board 610, the second printed wiring board assembly 910 can be staggered with the first electronic component 620, such that the second printed wiring board assembly 910 can be received in the concave portion 600R. Therefore, the internal space of the electronic device 100 is effectively used, and the volume of the electronic device 100 is reduced.

Specifically, the first electronic component 620 is disposed between the first printed wiring board 610 and the heat-dissipating base 200. More specifically, the first printed wiring board assembly 600 has a first surface 691 and a second surface 692 opposite to the first surface 691. The first surface 691 faces the heat-dissipating base 200, and the first electronic component 620 is disposed on the first surface 691. In other words, the first printed wiring board assembly 600 is disposed upside down on the heat-dissipating base 200.

Because the first printed wiring board assembly 600 is disposed upside down on the heat-dissipating base 200, the first electronic component 620 is disposed near the heat-dissipating base 200. At least portions of the first electronic components 620 thermally contact the heat-dissipating base 200, and thus the heat-dissipating efficiency of the heat-dissipating base 200 for the first electronic component 620 is greatly enhanced.

Because the heat-dissipating efficiency of the first electronic component 620 is enhanced, the first electronic component 620 can operate with a higher efficiency without encountering overheating problems. Therefore, the overall operating performance of the electronic device 100 is enhanced.

Specifically, as shown in FIG. 2, because the first printed wiring board assembly 600 is disposed upside down on the heat-dissipating base 200, and the second printed wiring board assembly 910 is at least partially disposed in the concave portion 600R, the second printed wiring board assembly 910 is disposed between the first printed wiring board 610 and the heat-dissipating base 200.

Specifically, an orthogonal projection of the second printed wiring board assembly 910 onto the first printed wiring board 610 is separated from the first electronic component 620. Therefore, the position of the first electronic component 620 does not overlap with the position of the second printed wiring board assembly 910, such that an overall height of the electronic device 100 is reduced and the interior space of the electronic device 100 can be used more efficiently.

Specifically, the second printed wiring board assembly 910 is flatly disposed relative to the first printed wiring board 610, and a height of the second printed wiring board assembly 910 is smaller than or approximately equal to a maximum height H1 of the first electronic component 620, and thus the second printed wiring board assembly 910 can be disposed in the concave portion 600R, such that the overall height of the electronic device 100 is reduced.

Specifically, the first printed wiring board assembly 600 can be a motherboard assembly or a main power board assembly, and the second printed wiring board assembly 910 can be an output board assembly or an input board assembly, and the first printed wiring board 610 can be the main power board. People having ordinary skill in the art can make proper modification on the first printed wiring board assembly 600, the second printed wiring board assembly 910, and the first printed wiring board 610 according to actual application.

Specifically, as shown in FIG. 1 and FIG. 2, the heat-dissipating base 200 further includes a main body 210, at least one side wall 291, and a bottom board 292. The side wall 291 is connected to and surrounds the main body 210. The bottom board 292 is disposed beneath the main body 210. The electronic device 100 may further include a top cover 930. The first printed wiring board assembly 600 and the second printed wiring board assembly 910 can be disposed in the heat-dissipating base 200, and the top cover 930 covers the first printed wiring board assembly 600 to form a three-dimensional structure as shown in FIG. 1.

Specifically, as shown in FIG. 3, the first printed wiring board assembly 600 further includes at least one second electronic component 630 disposed in the concave portion 600R of the first printed wiring board assembly 600 and on the first printed wiring board 610. More specifically, an orthogonal projection of the second printed wiring board assembly 910 on the first printed wiring board 610 at least partially overlaps with the second electronic component 630, and a height H2 of the second electronic component 630 is smaller than a maximum height H1 of the first electronic component 620. More specifically, the second electronic component 630 is disposed on the first surface 691.

Figure 4:
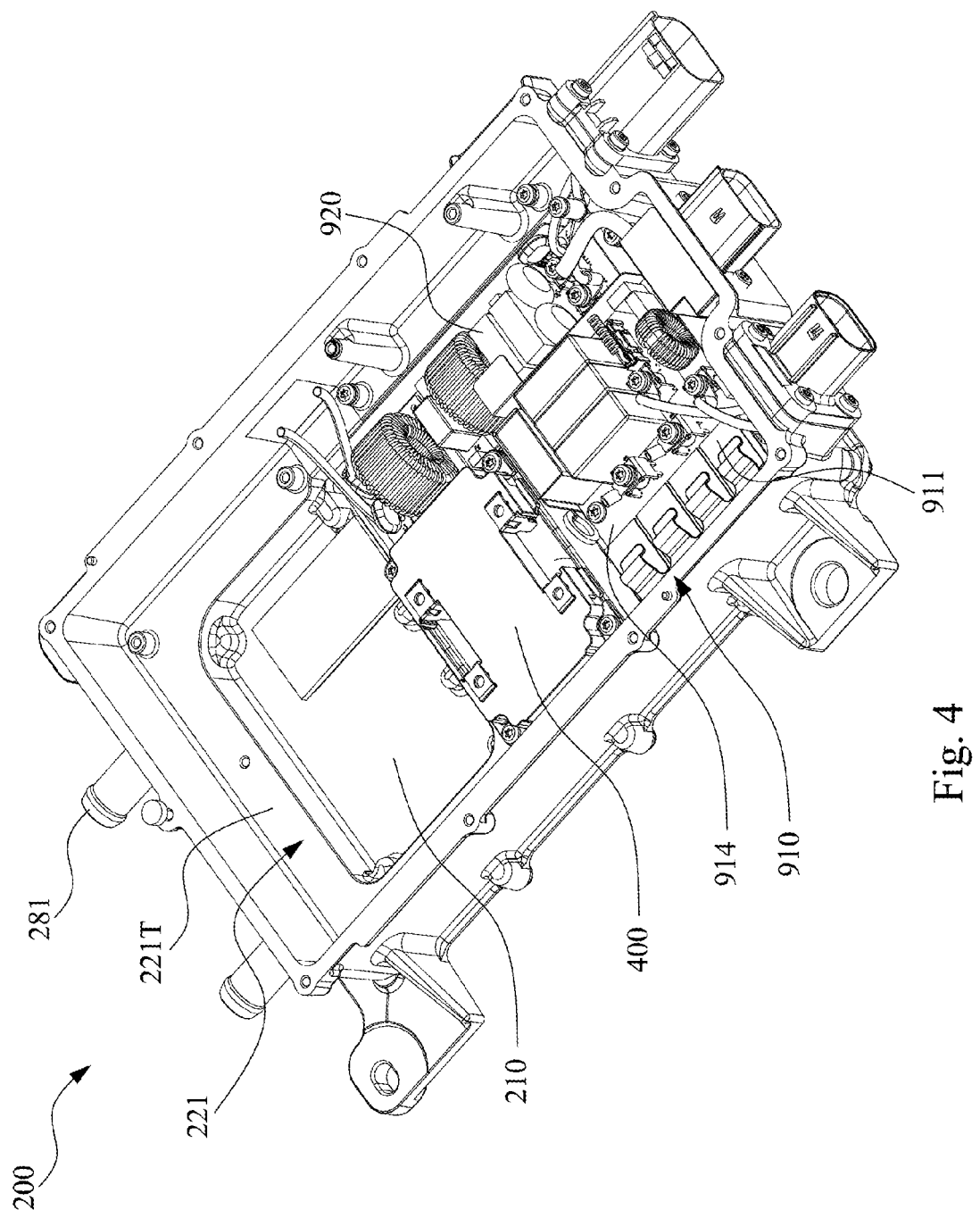
FIG. 4 is a 3-D view of a heat-dissipating base, a second printed wiring board assembly, and a third printed wiring board assembly according to one embodiment of this disclosure.

FIG. 4 is a 3-D view of the heat-dissipating base 200, the second printed wiring board assembly 910, and a third printed wiring board assembly 920 according to one embodiment of this disclosure. Specifically, as shown in FIG. 3 and FIG. 4, the first electronic component 620 includes at least one switching element 730, and the second printed wiring board assembly 910 includes a second printed wiring board 914 and at least one switching element 911. More specifically, the switching element 730 is uprightly disposed relative to the first printed wiring board 610, and the switching element 911 is flatly disposed relative to the first printed wiring board 610 and the second printed wiring board 914. The second printed wiring board 914 can be an output board or an input board.

In some embodiments, the first electronic component 620 includes a plurality of switching elements 730. In order to dispose the switching elements 730 more densely, the switching elements 730 are uprightly disposed on the first printed wiring board 610, and thus more electronic components can be disposed on the first printed wiring board 610. On the other hand, because the switching element 911 is disposed between the first printed wiring board 610 and the second printed wiring board 914, to avoid an interference between the switching element 911 and the first printed wiring board 610, the switching element 911 is flatly disposed on the second printed wiring board 914 or a portion of the heat-dissipating base 200 near the second printed wiring board 914.

Specifically, in embodiments where there are a plurality of first electronic components 620, the first electronic components 620 include at least one choke 620a, at least one second electromagnetic induction module 620b, or at least one capacitor 620c. People having ordinary skill in the art can make proper modification on the first electronic components 620 according to actual application.

Figure 5:
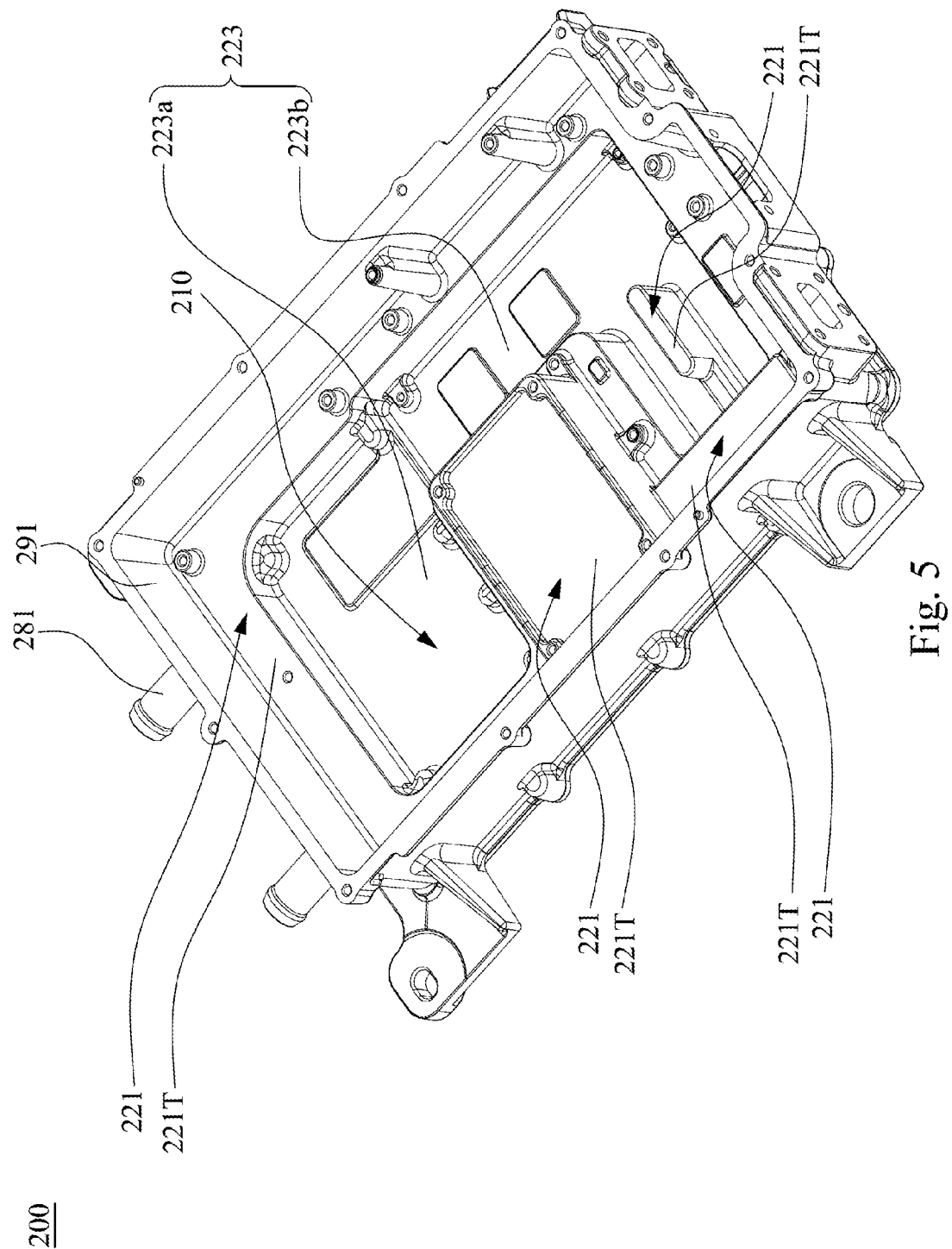
FIG. 5 is a 3-D view of the heat-dissipating base according to one embodiment of this disclosure.

FIG. 5 is a 3-D view of the heat-dissipating base 200 according to one embodiment of this disclosure. As shown in FIG. 2, FIG. 4, and FIG. 5, the electronic device 100 further includes a third printed wiring board assembly 920, and the second printed wiring board assembly 910 and the third printed wiring board assembly 920 are respectively disposed on the heat-dissipating base 200. Specifically, the second printed wiring board assembly 910 and the third printed wiring board assembly 920 are respectively disposed on the main body 210 and accommodated in the heat-dissipating base 200. The third printed wiring board assembly 920 is at least partially disposed in the concave portion 600R.

More specifically, the first printed wiring board assembly 600 further includes an electronic component, and the electronic component can be a first electromagnetic induction module 400. The first electromagnetic induction module 400 is disposed between the first printed wiring board 610 and the heat-dissipating base 200 and on the main body 210 and is accommodated in the heat-dissipating base 200. The second printed wiring board assembly 910 and the third printed wiring board assembly 920 are respectively disposed at different sides of the first electromagnetic induction module 400, and the second printed wiring board assembly 910 is adjacent to the third printed wiring board assembly 920. The first electromagnetic induction module 400 is at least partially disposed in the concave portion 600R.

Specifically, the third printed wiring board assembly 920 can be the input board assembly or the output board assembly. People having ordinary skill in the art can make proper modification on the third printed wiring board assembly 920 according to actual application.

In an embodiment, the third printed wiring board assembly 920 is the input board assembly adapted to be connected to an input end for receiving an input signal. The second printed wiring board assembly 910 is the output board assembly adapted to be connected to an output end for outputting an output signal. The first printed wiring board assembly 600 acts as the main power board assembly electrically connected to the second printed wiring board assembly 910 and the third printed wiring board assembly 920 for converting the input signal to the output signal.

Figure 6:
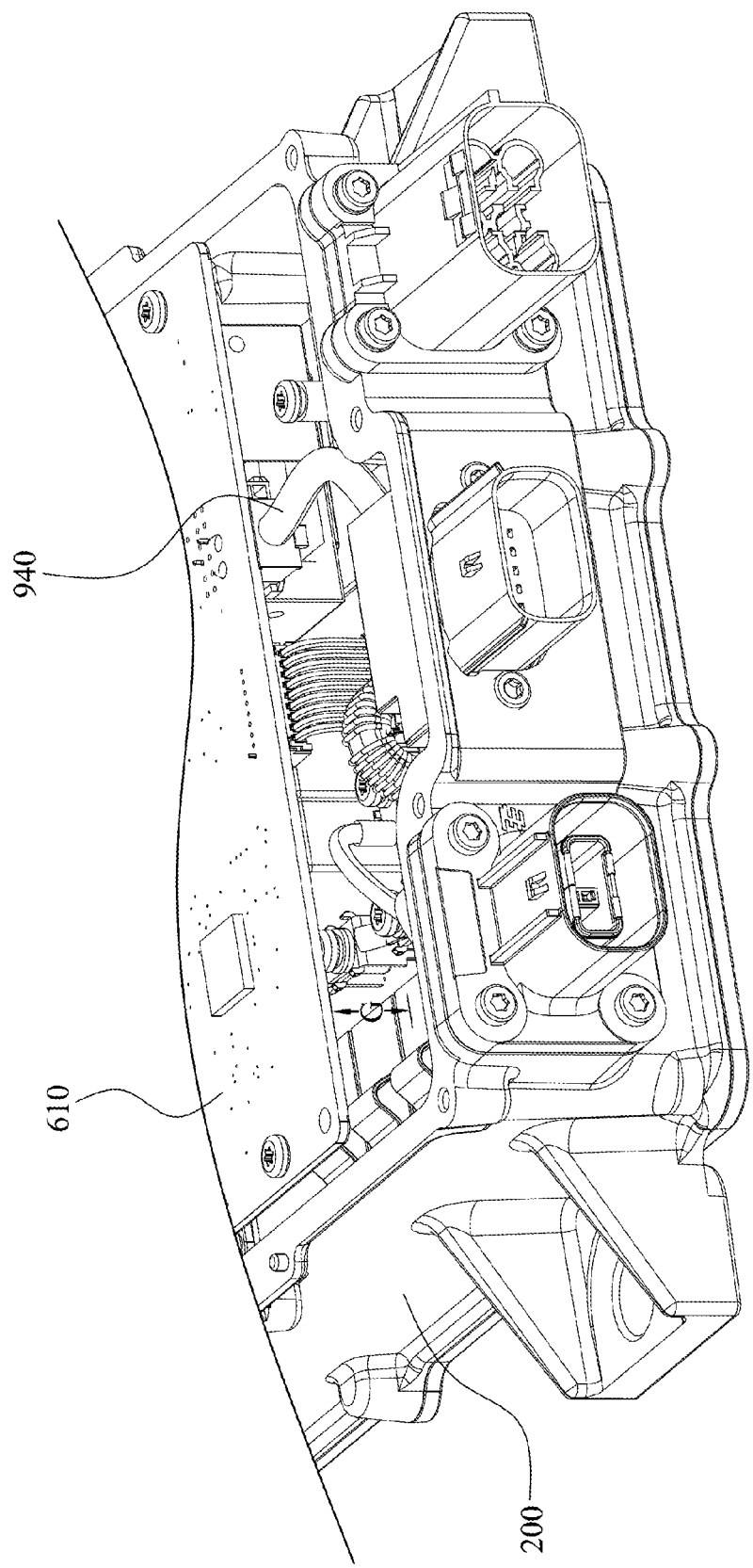
FIG. 6 is a partially enlarged view of the electronic device according to one embodiment of this disclosure.

FIG. 6 is a partially enlarged view of the electronic device 100 according to one embodiment of this disclosure. There is a gap G between the first printed wiring board 610 and the heat-dissipating base 200. The electronic device 100 further includes at least one connecting line 940 electrically connected to different printed wiring board components, such as the first printed wiring board assembly 600. The connecting line 940 is at least partially received in the gap G.

By properly arranging the position of the first electronic component 620 in the first printed wiring board assembly 600, the second printed wiring board assembly 910 can be at least partially received in the concave portion 600R of the first printed wiring board assembly 600, such that the overall height of the electronic device 100 is reduced and the volume of the electronic device 100 is reduced.

The heat-dissipating base 200 of the disclosure can be specially designed according to the configuration of the heat-dissipating base 200, the first printed wiring board assembly 600, the second printed wiring board assembly 910, and the first electromagnetic induction module 400, so as to enhance the overall heat-dissipating efficiency of the electronic device 100. As shown in FIG. 5, the heat-dissipating base 200 further includes at least one first protrusion 221. The first protrusion 221 is disposed on the main body 210. The first protrusion 221 has at least one first protrusion top surface 221T for thermally contacting at least one first component above the main body 210. Specifically, as shown in FIG. 2, FIG. 4, and FIG. 5, the first component can be a heat-dissipating component 710 for dissipating heat in the switching element 730. The first protrusion top surface 221T of the first protrusion 221 thermally contacts the heat-dissipating component 710.

Specifically, when the first component is the heat-dissipating component 710, the first component (or the heat-dissipating component 710) can be disposed between the first printed wiring board 610 and the first protrusion top surface 221T of the first protrusion 221. Because the first component (or the heat-dissipating component 710) is located near the heat-dissipating base 200 (the first printed wiring board assembly 600 is disposed upside down on the heat-dissipating base 200), and at least one portion of the first component (or the heat-dissipating component 710) can directly contact the heat-dissipating base 200, the heat-dissipating efficiency of the heat-dissipating base 200 for the first component (or the heat-dissipating component 710) is greatly enhanced.

Because the heat-dissipating efficiency of the first component (or the heat-dissipating component 710) is enhanced, the first component or the associated electronic component such as the switching element 730 can operate with a higher efficiency without encountering overheating problems. Therefore, the overall operating efficiency of the electronic device 100 is enhanced.

In addition, as shown in FIG. 4 and FIG. 5, the first component can be a printed wiring board assembly such as the second printed wiring board assembly 910 and the third printed wiring board assembly 920 of FIG. 4. For example, the first protrusion 221 is disposed beneath the second printed wiring board assembly 910, and the first protrusion top surface 221T of the first protrusion 221 thermally contacts the second printed wiring board assembly 910 to dissipate heat.

Figure 7A:
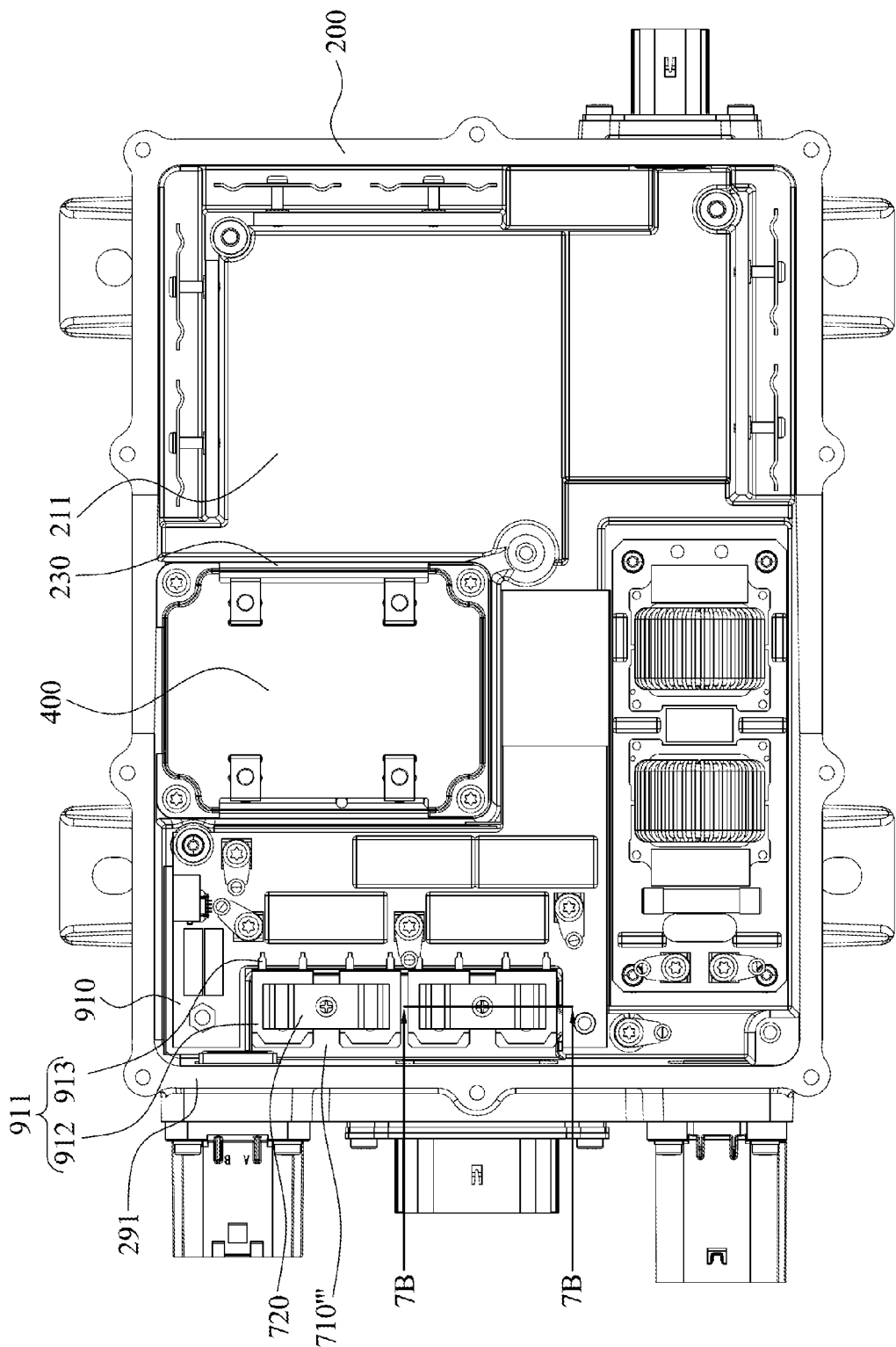
FIG. 7A is a top view of a heat-dissipating base, a second printed wiring board assembly, and a first electromagnetic induction module according to another embodiment of this disclosure.
Figure 8:
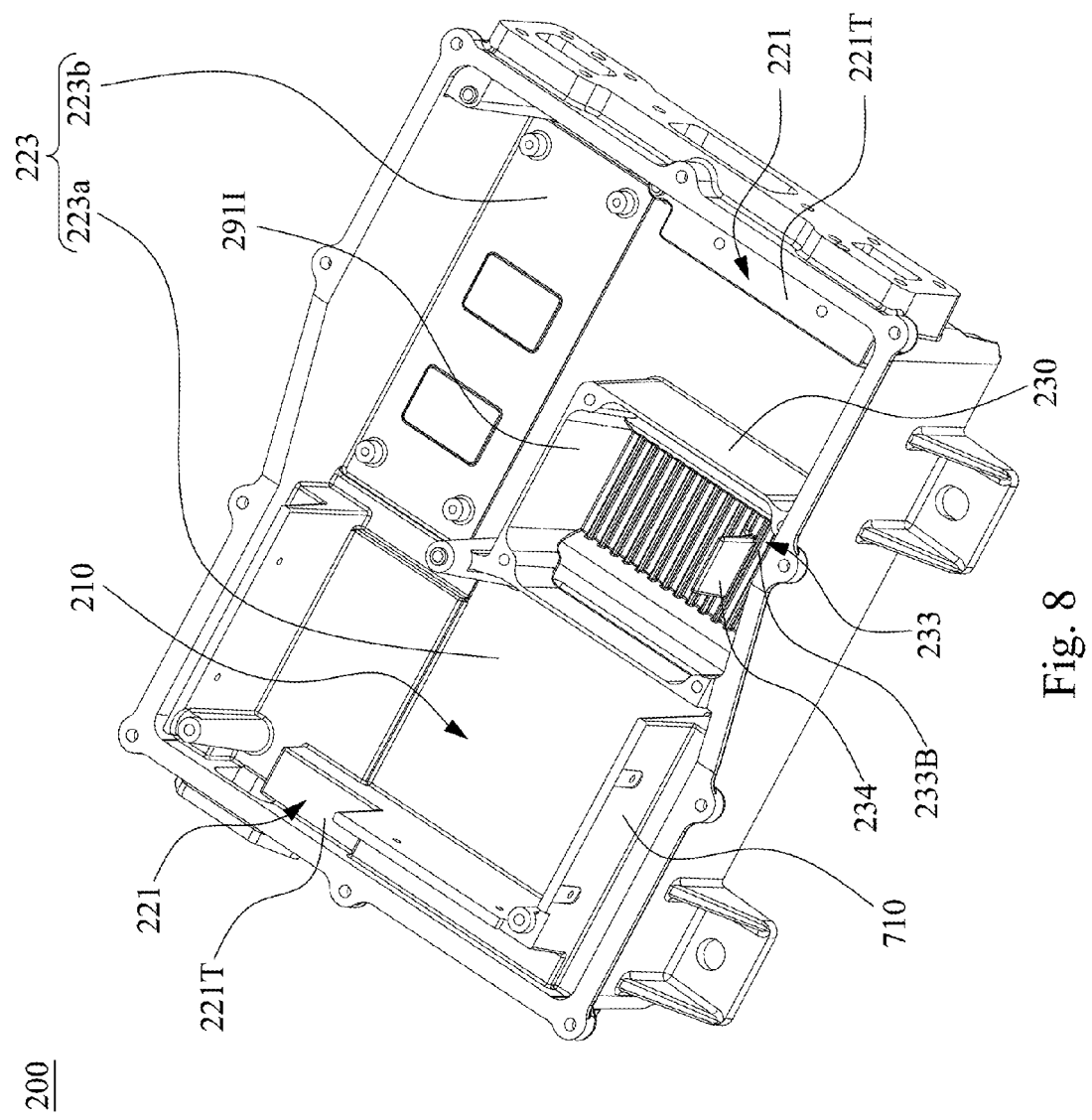
FIG. 8 is a 3-D view of the heat-dissipating base according to another embodiment of this disclosure.

FIG. 7A is a top view of the heat-dissipating base 200, the second printed wiring board assembly 910, and the first electromagnetic induction module 400 according to another embodiment of this disclosure. FIG. 8 is a 3-D view of the heat-dissipating base 200 according to another embodiment of this disclosure. As shown in FIG. 7A and FIG. 8, the electronic device 100 further includes a heat-dissipating component 710''', and the first component can be the switching element 911. The switching element 911 is disposed on the heat-dissipating component 710''' and the heat-dissipating component 710''' dissipates heat in the switching element 911. The heat-dissipating component 710''' can be a portion of the heat-dissipating base 200 to be the first protrusion. In one embodiment, a heat-dissipating sheet can be disposed between the heat-dissipating component 710''' and the heat-dissipating base 200 to enhance the heat-dissipating efficiency of the switching element 911.

The heat-dissipating base 200 can further include at least one second protrusion disposed on the main body 210. The second protrusion has at least one second protrusion side surface for thermally contacting at least the second component.

Figure 9:
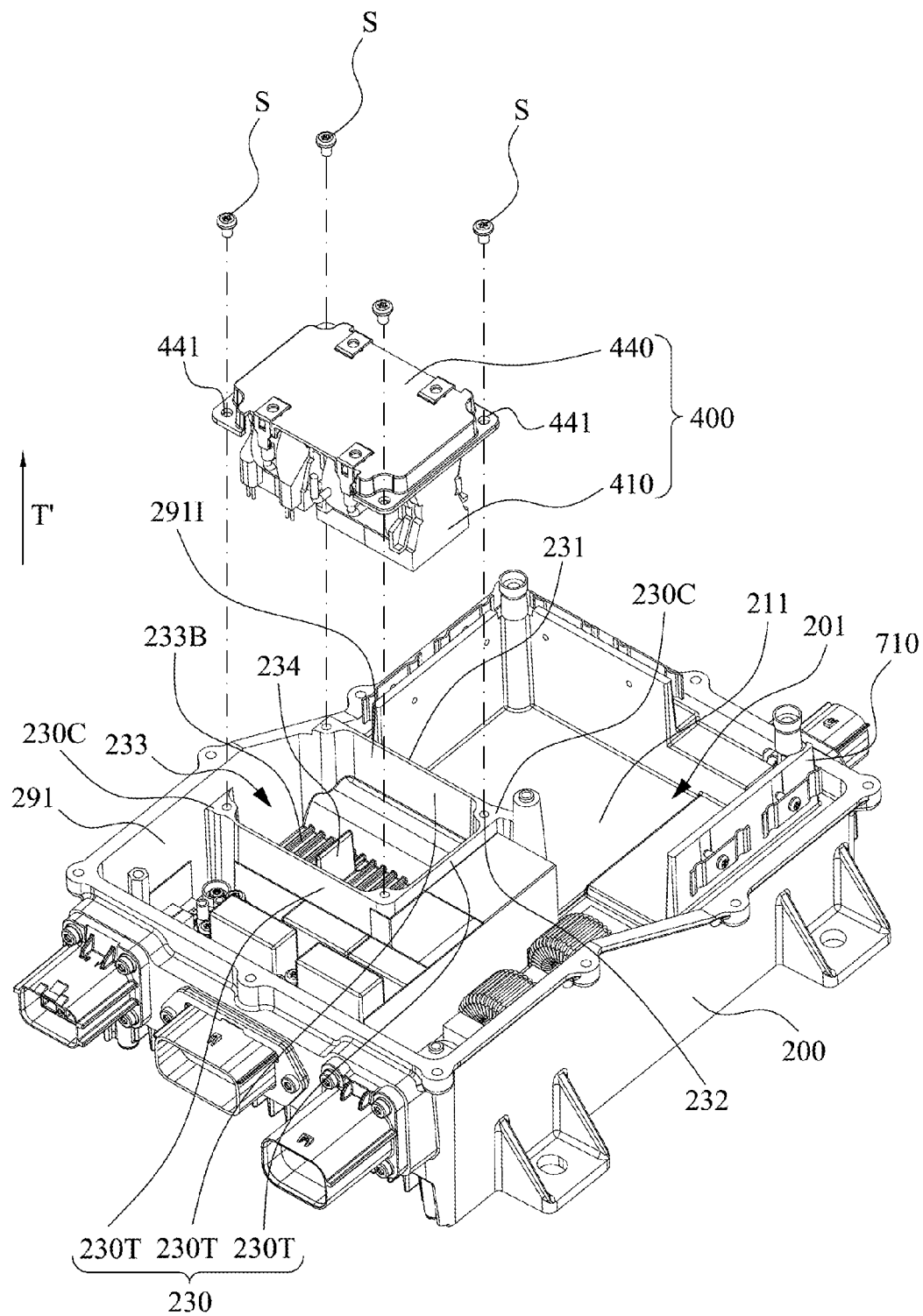
FIG. 9 is an exploded view of the heat-dissipating base and the first electromagnetic induction module according to another embodiment of this disclosure.

FIG. 9 is an exploded view of the heat-dissipating base 200 and the electromagnetic induction module 400 according to another embodiment of this disclosure. As shown in FIG. 8 and FIG. 9, the heat-dissipating base 200 includes at least one three-dimensional structure 230. The three-dimensional structure 230 has an accommodation trough 233, and the accommodation trough 233 is formed by the three-dimensional structure 230. A portion of the first electromagnetic induction module 400 is disposed in the accommodation trough 233 (see FIG. 4), and the other portion of the first electromagnetic induction module 400 is disposed outside the accommodation trough 233. The second component can include an electronic component, such as the first electromagnetic induction module 400 of FIG. 9. In this embodiment, the second protrusion can be the three-dimensional structure 230, and the second protrusion side surface can be an inner wall 291I of the three-dimensional structure 230. That is, the second protrusion (or the three-dimensional structure 230) forms the accommodation trough 233, and the second component (or the first electromagnetic induction module 400) is disposed in the accommodation trough 233, such that the second protrusion side surface (or the inner wall 291I) of the second protrusion (or the three-dimensional structure) can thermally contact the second component (or the first electromagnetic induction module 400) multi-dimensionally to enhance the heat-dissipating efficiency of the second component (or the first electromagnetic induction module 400). In addition, the first electromagnetic induction module 400 includes magnetic components 410, and the second protrusion can be a separating rib 234 in the accommodation trough 233. Side surfaces of the separating rib 234 are used to dissipate heat in the magnetic components 410.

Figure 10:
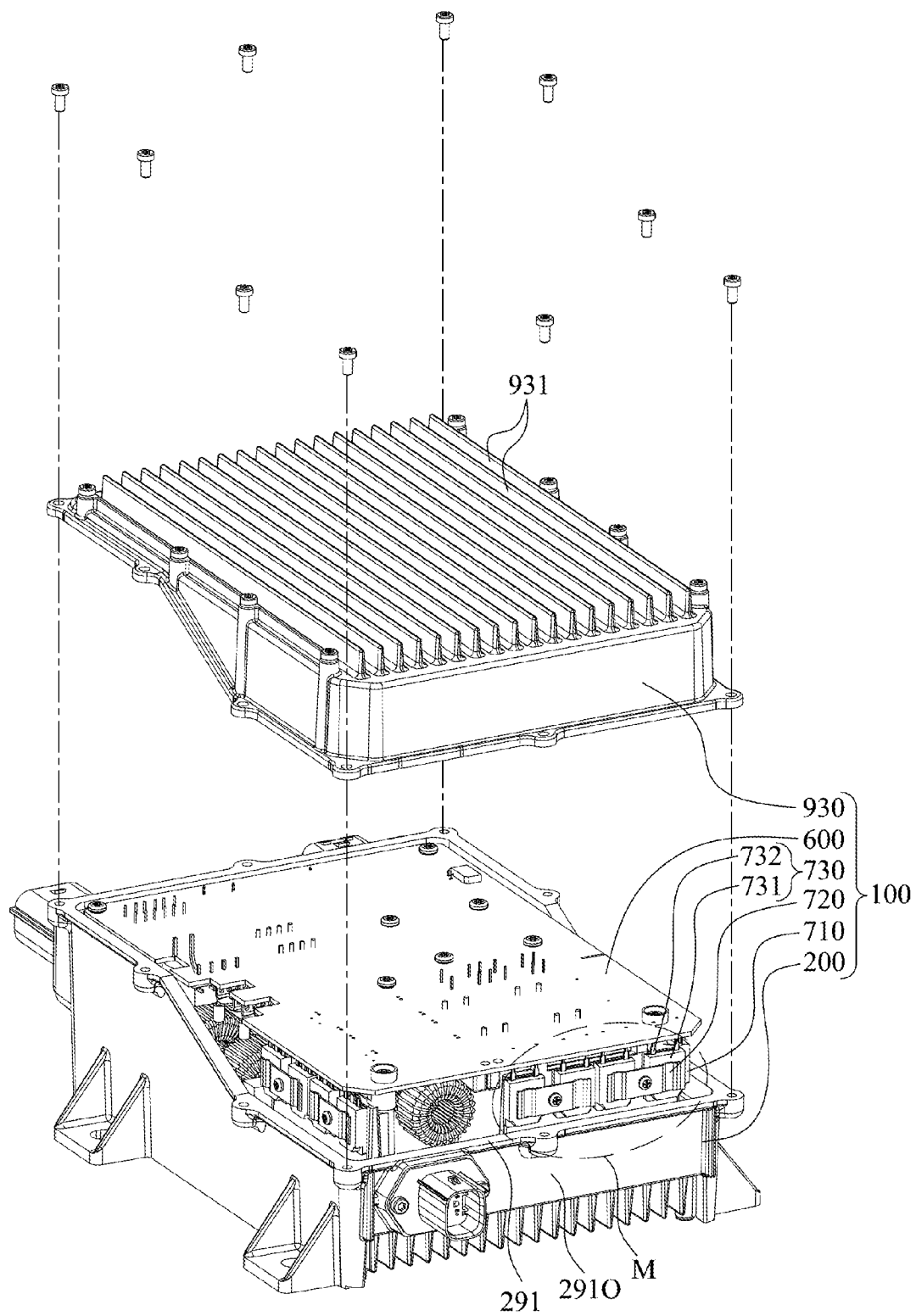
FIG. 10 is a partially enlarged view of the electronic device according to another embodiment of this disclosure.
Figure 11:
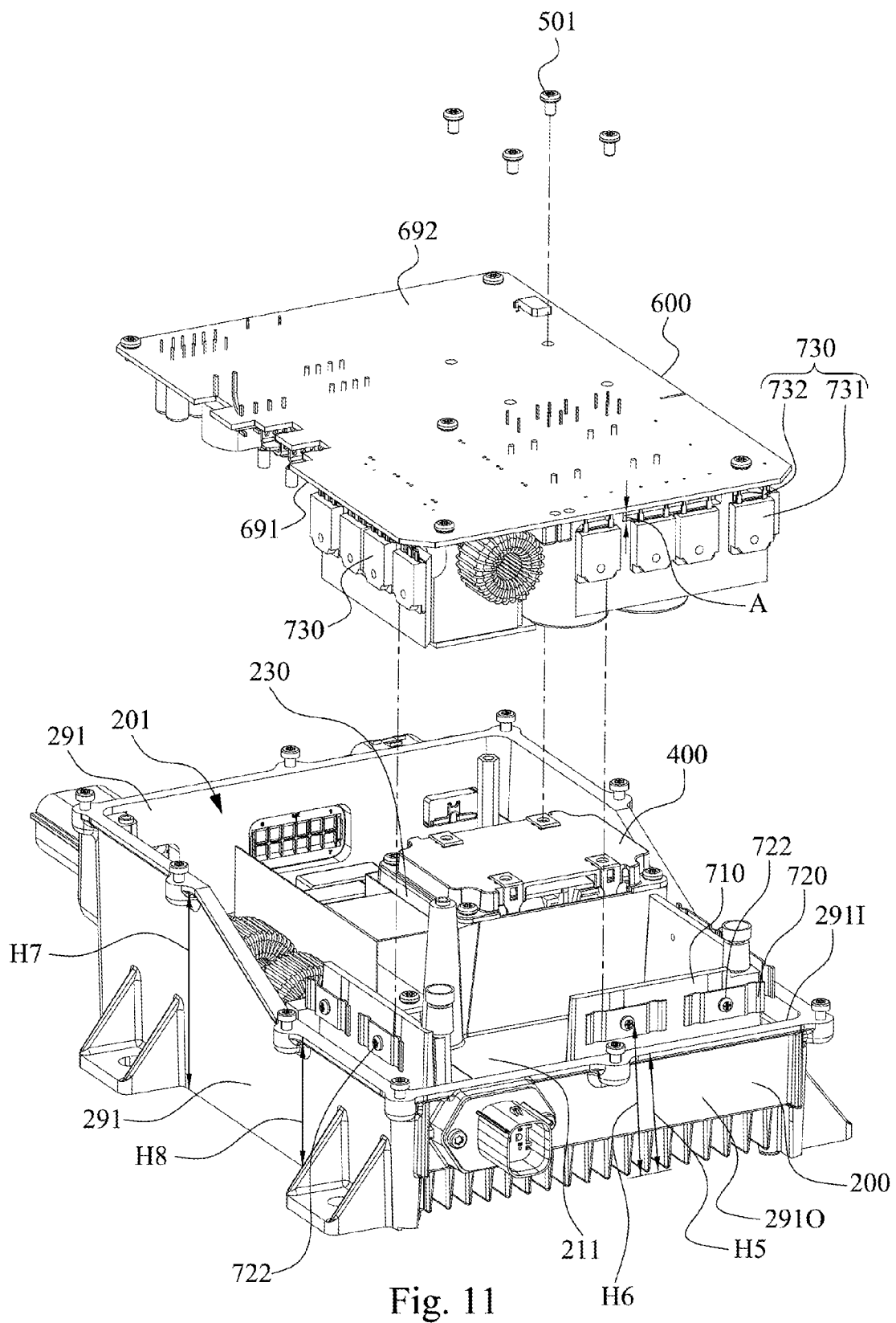
FIG. 11 is an exploded view of the first printed wiring board assembly and the heat-dissipating base of FIG. 10.

FIG. 10 is a partially enlarged view of the electronic device 100 according to another embodiment of this disclosure. FIG. 11 is an exploded view of the first printed wiring board assembly 600 and the heat-dissipating base 200 of FIG. 10. As shown in FIG. 8, FIG. 10, and FIG. 11, the electronic device 100 further includes a heat-dissipating component 710 and an elastic clip 720. The heat-dissipating component 710 dissipates heat in the switching element 730. When the heat-dissipating component 710 is a portion of the heat-dissipating base 200, the heat-dissipating component 710 can be considered as the second protrusion as well, and the switching element 730 of FIG. 10 and FIG. 11 can be considered as the second component as well. The switching element 730 is clamped by the elastic clip 720, so as to be fixed to the second protrusion side surface of the second protrusion (or the heat-dissipating component 710) thereby dissipating heat in the switching element 730 by the second protrusion side surface.

By properly designing the structure of the heat-dissipating base to make the heat-dissipating base 200 with the first protrusion 221 and the second protrusion, in which the first protrusion top surface 221T of the first protrusion 221 and the second protrusion side surface of the second protrusion thermally contact at least one first component and at least one second component of the electronic device 100, the overall heat-dissipating efficiency of the electronic device 100 is enhanced.

As shown in FIG. 5 and FIG. 8, the first protrusion 221 and the second protrusion defines at least one concave portion 223 relative to themselves, and the first protrusion 221 and the second protrusion surrounds at least partial edges of the concave portion 223. The concave portion 223 at least partially accommodates at least one third component above the main body 210. Specifically, as shown in FIG. 2, FIG. 3, and FIG. 5, the concave portion 223 includes a first concave portion 223a and a second concave portion 223b, the electronic device 100 includes the third component, and the third component includes the first electronic component 620, the second printed wiring board assembly 910, and the third printed wiring board assembly 920. The first concave portion 223a accommodates the first electronic component 620, and the second concave portion 223b accommodates the second printed wiring board assembly 910 and the third printed wiring board assembly 920.

People having ordinary skill in the art can make proper modification on the first component, the second component, and the third component according to their actual application.

Specifically, the material of the heat-dissipating base 200 can be metal. More specifically, the material of the main body 210 can be metal, or the material of the first protrusion 221 and the second protrusion can be metal. Metal has a better heat-dissipating efficiency. People having ordinary skill in the art can make proper modification on the materials of the heat-dissipating base 200 or the main body 210 according to their actual application.

Specifically, the first protrusion 221 and the second protrusion can be a portion of the main body 210. People having ordinary skill in the art can make proper modification on the first protrusion 221 and the second protrusion according to their actual application.

Figure 12:
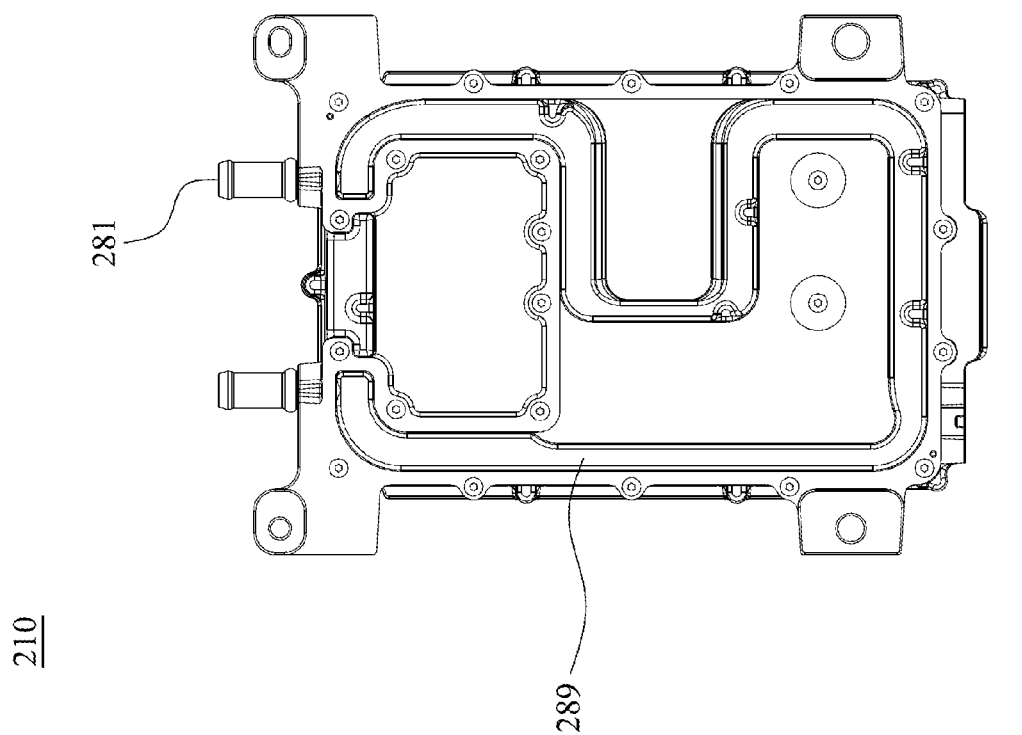
FIG. 12 is a bottom view of a main body according to one embodiment of this disclosure.

The heat-dissipating base 200 can be a liquid-cooled heat-dissipating base, an air-cooled heat-dissipating base, or a combination of the liquid-cooled heat-dissipating base and the air-cooled heat-dissipating base. FIG. 12 is a bottom view of the main body 210 according to one embodiment of this disclosure. As shown in FIG. 2 and FIG. 12, the heat-dissipating base further includes at least one cooling fitting 281 and at least one fluid passage 289 therein. The fluid passage 289 is disposed beneath the main body 210 and is covered by the bottom board 292. The fluid passage 289 is connected to the cooling fitting 281. Liquid passes through the fluid passage 289 to dissipate heat in the heat-dissipating base 200.

Specifically, as shown in FIG. 5 and FIG. 12, the fluid passage 289 is disposed in the main body 210 and beneath the first protrusion 221. Because the first protrusion 221 protrudes upwardly, a space in the bottom of the main body 210 is saved, and the fluid passage 289 is disposed in the space. Therefore, not only is the internal space of the heat-dissipating base 200 saved, but also the fluid passage 289 can directly dissipate heat in the first component because the fluid passage 289 is near the first component thermally contacting the first protrusion 221.

Figure 13:
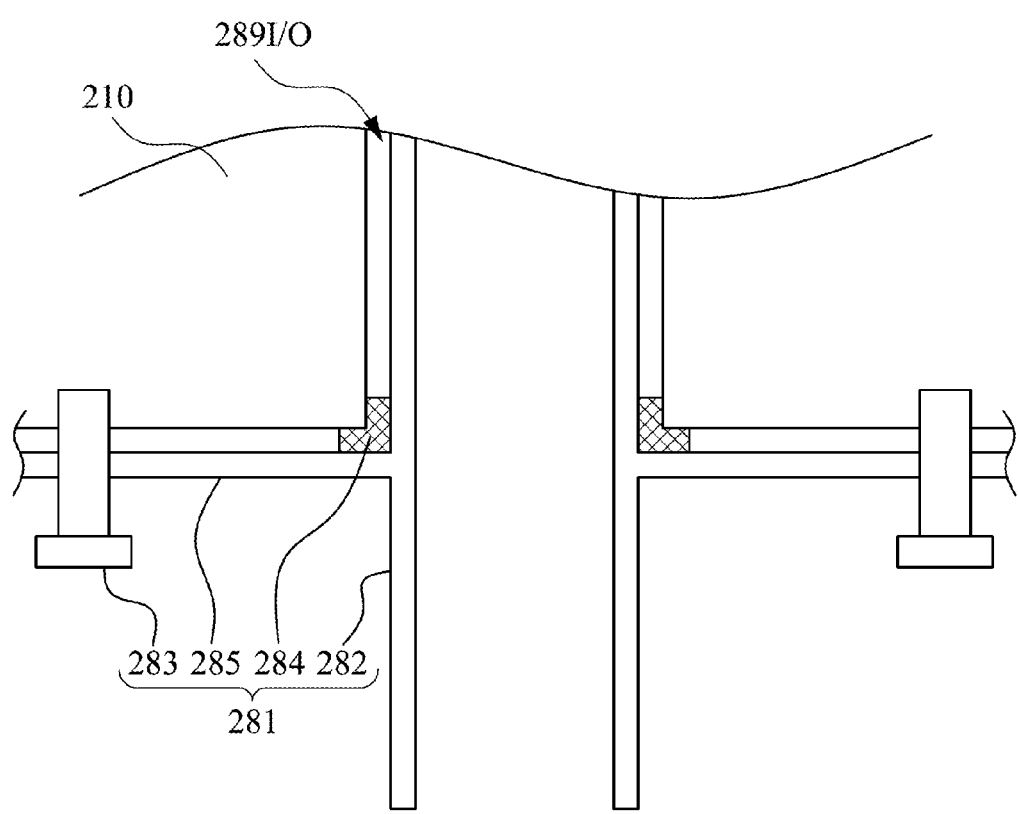
FIG. 13 is a cross-sectional view of a cooling fitting according to one embodiment of this disclosure.

FIG. 13 is a cross-sectional view of a cooling fitting 281 according to one embodiment of this disclosure. As shown in FIG. 12 and FIG. 13, the cooling fitting 281 is detachably mounted in an inlet 289I and an outlet 289O of the fluid passage 289.

Figure 14:
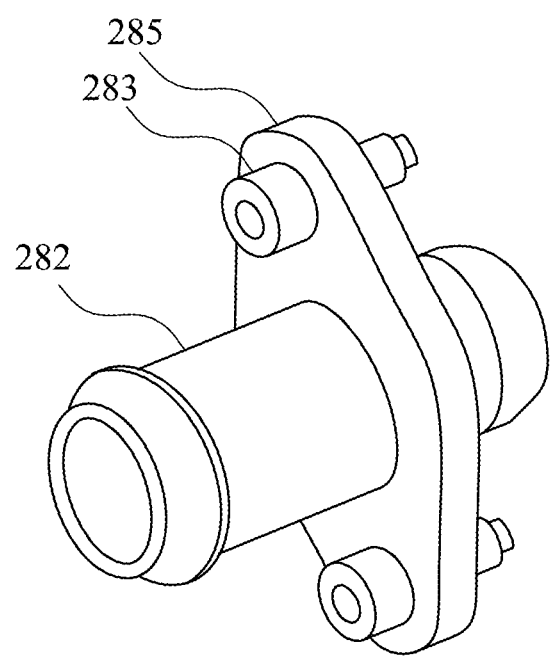
FIG. 14 is a 3-D view of the cooling fitting according to one embodiment of this disclosure.

FIG. 14 is a 3-D view of the cooling fitting 281 according to one embodiment of this disclosure. As shown in FIG. 13 and FIG. 14, the cooling fitting 281 includes a connecting pipe 282, a fastener 283, and a sealing member 284. The connecting pipe 282 is at least partially inserted into the inlet 289I or the outlet 289O of the fluid passage 289. The connecting pipe 282 has a flange 285. The fastener 283 detachably connects the flange 285 and the main body 210. The sealing member 284 is disposed between the flange 285 and the main body 210.

Specifically, the fastener 283 can be a threaded fastener, and the sealing member 284 can be a sealing ring. People having ordinary skill in the art can make proper modification on the fastener 283 and the sealing member 284 according to their actual application.

In this embodiment, the cooling fitting 281 is detachably mounted in the inlet 289I and the outlet 289O of the fluid passage 289. Embodiments of this disclosure are not limited thereto, and people having ordinary skill in the art can make proper modification according to actual application. In other embodiments, the cooling fitting 281 can be detachably mounted only in the inlet 289I or the outlet 289O of the fluid passage 289.

By properly designing the structure of the heat-dissipating base 200 to make the heat-dissipating base 200 with the first protrusion 221 of which the first protrusion top surface 221T thermally contacts the first component of the electronic device 100, the overall heat-dissipating efficiency of the electronic device 100 is enhanced.

Figure 15:
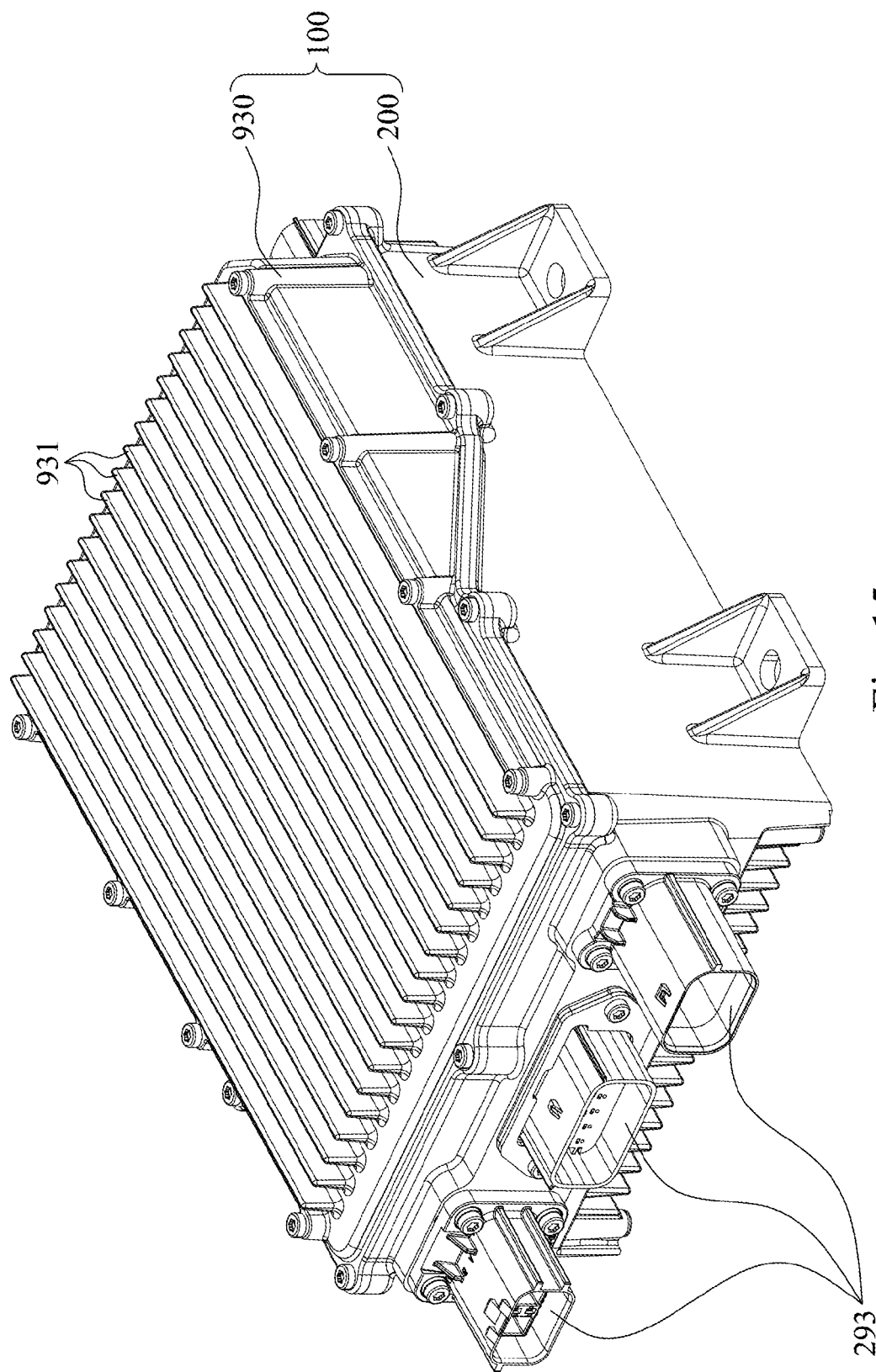
FIG. 15 is an assembled view of the electronic device according to one embodiment of this disclosure.
Figure 16A:
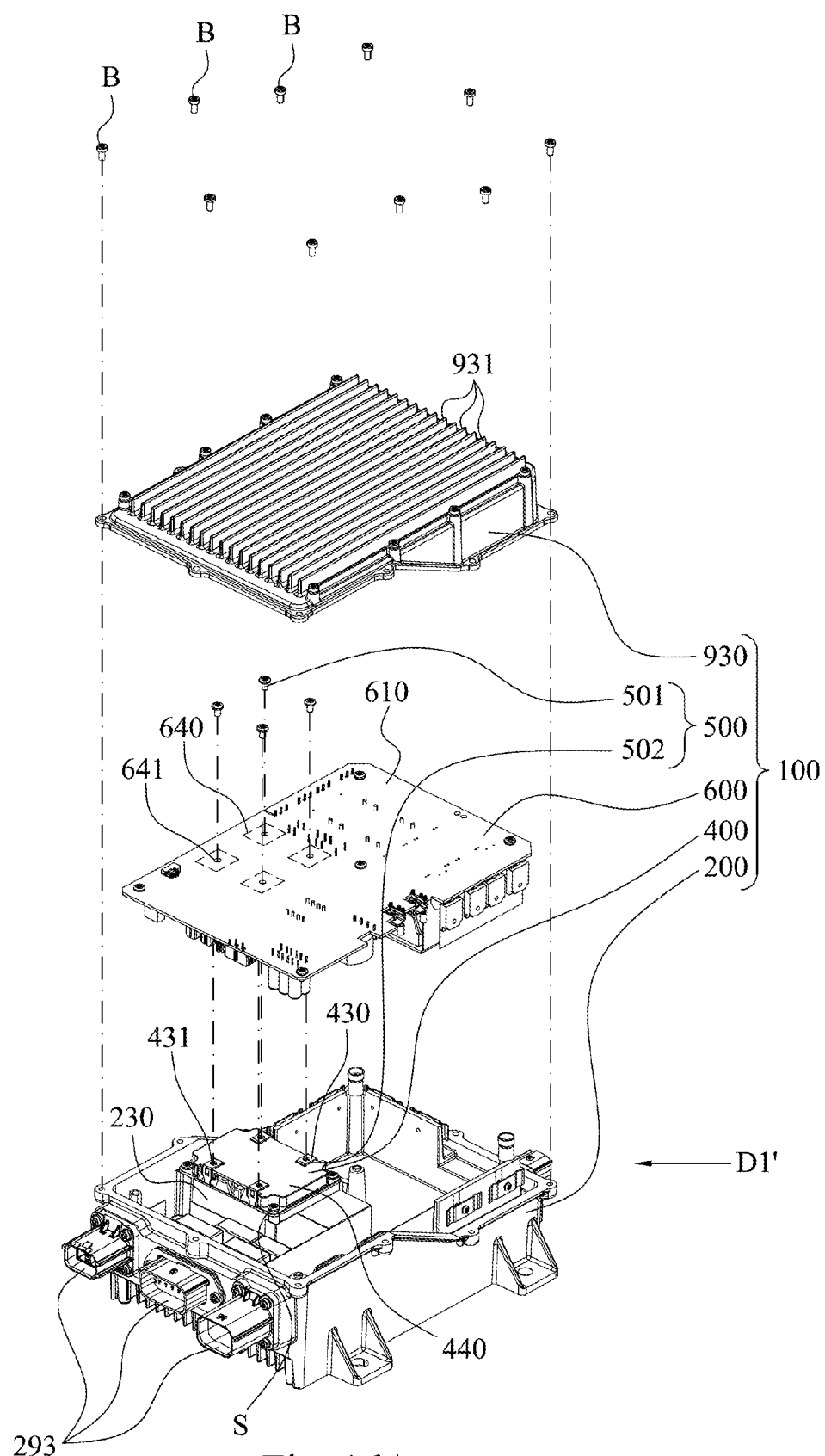
FIG. 16A is an exploded view of FIG. 15.
Figure 16B:
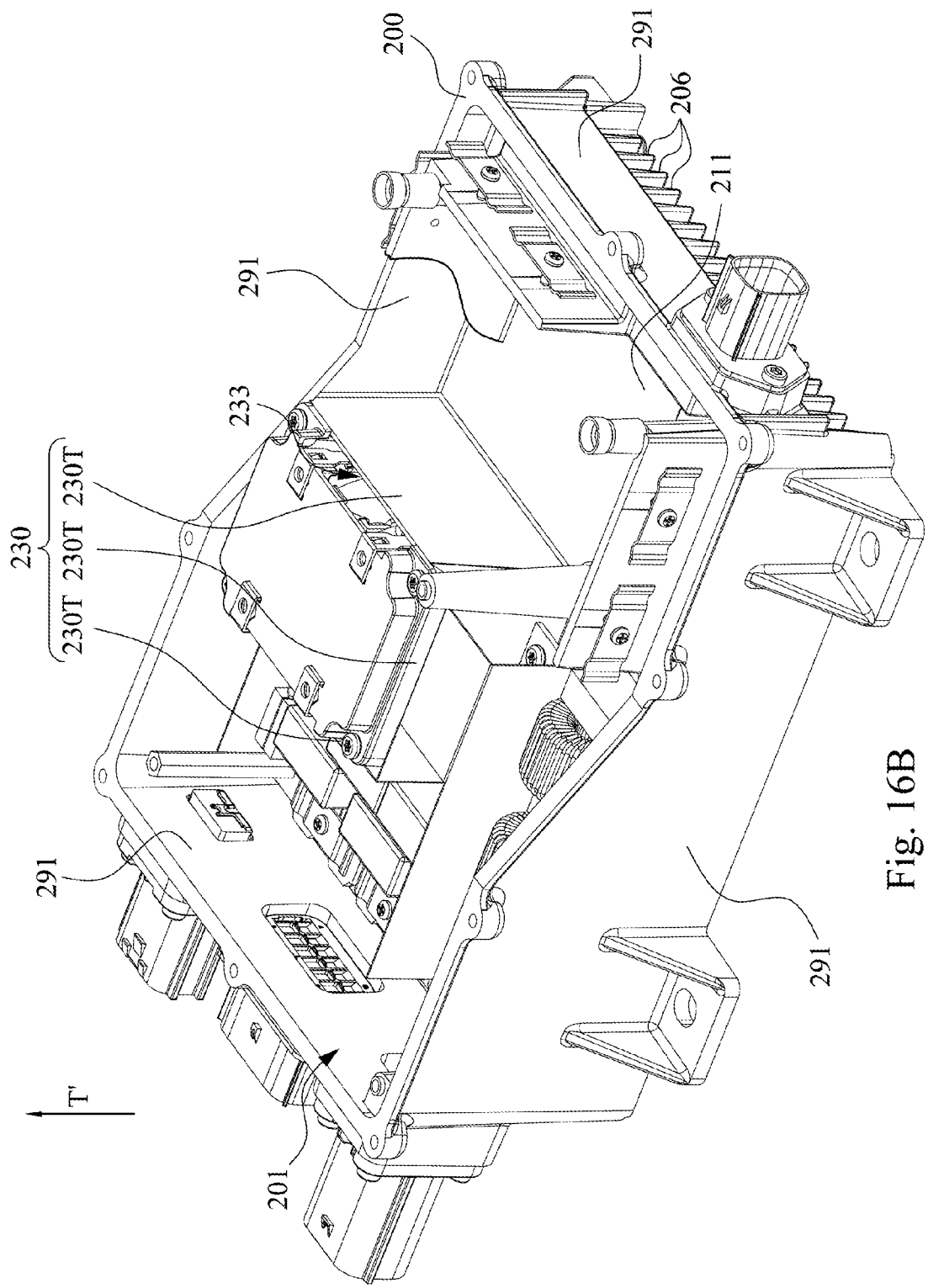
FIG. 16B is a 3-D view of the heat-dissipating base viewed along a direction D1' of FIG. 16A.

FIG. 15 is an assembled view of the electronic device 100 according to one embodiment of this disclosure. FIG. 16A is an exploded view of FIG. 15. FIG. 16B is a 3-D view of the heat-dissipating base 200 viewed along a direction D1' of FIG. 16A. FIG. 16C is an assembled view of the heat-dissipating base 200 and the first printed wiring board assembly 600 of FIG. 16A. As shown in FIG. 15 and FIG. 16A, the first printed wiring board assembly 600 further includes a fixing assembly 500. Specifically, the first electromagnetic induction module 400 is mounted on the heat-dissipating base 200. The fixing assembly 500 secures the first electromagnetic induction module 400 and the first printed wiring board 610, such that the first electromagnetic induction module 400 is electrically connected to the first printed wiring board 600 and the first electromagnetic induction module 400 is on to the three-dimensional structure 230 and the first printed wiring board 610.

Therefore, the connection of the first electromagnetic induction module 400 and the first printed wiring board 610 and the connection of the first electromagnetic induction module 400 and the heat-dissipating base 200 are strengthened, thereby reducing the risk of the first electromagnetic induction module 400 falling apart from the first printed wiring board 610 and the damages to their electrical connection due to the gravitational force or external forces, thus maintaining the quality of the electrical connection of the first electromagnetic induction module 400 and the first printed wiring board 610.

Figure 17:
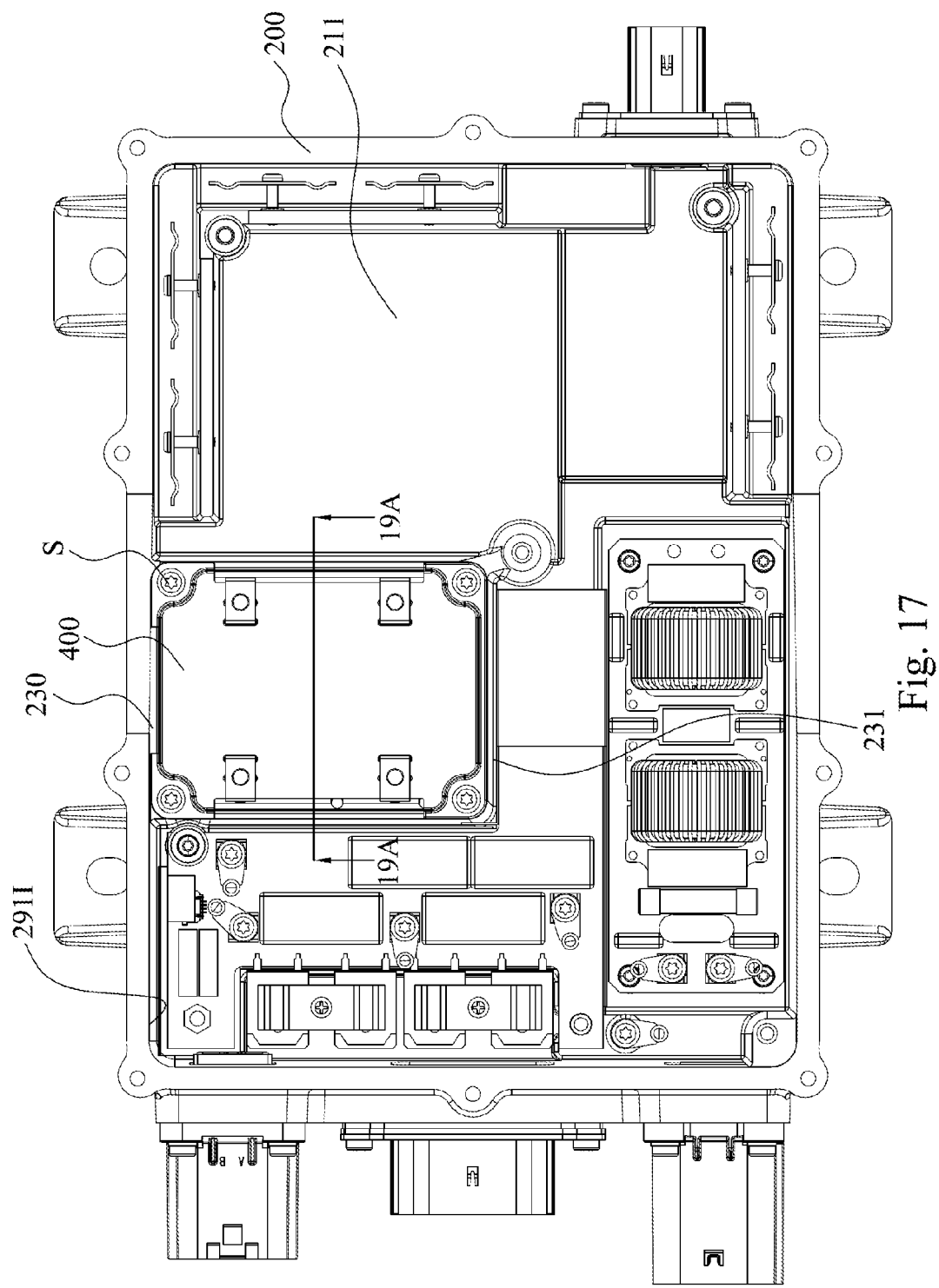
FIG. 17 is a top view of FIG. 9 after the heat-dissipating base and the first electromagnetic induction module are assembled.

FIG. 17 is a top view of FIG. 9 after the heat-dissipating base 200 and the first electromagnetic induction module 400 are assembled. Specifically, in the embodiment, as shown in FIG. 9, FIG. 16B, and FIG. 17, the heat-dissipating base 200 further includes a bottom surface 211. The side walls 291 extend from respective edges of the bottom surface 211 approximately in the same extending direction T' and an accommodation space 201 is surrounded by the side walls 291 and the bottom surface 211. The three-dimensional structure 230 is disposed in the accommodation space 201. The three-dimensional structure 230 is directly connected to or connected through a thermal interface material to the bottom surface 211 of the heat-dissipating base 200 and one of the side walls 291. The thermal interface material can be potting glue. In addition, one side of the three-dimensional structure 230 is connected to the bottom surface of the heat-dissipating base 200, i.e., one side of the three-dimensional structure 230 faces the bottom surface 211. Therefore, a side surface of the three-dimensional structure 230 opposite to the bottom surface 211 (or a top surface 231) is used to support and combines the first electromagnetic induction module 400.

Specifically, the three-dimensional structure 230 is formed from a plurality of spacers 230T. The spacers 230T extend from the bottom surface 211 of the heat-dissipating base 200 in the extending direction T to the first printed wiring board 610 (see FIG. 16A). Therefore, a top surface 231 of the three-dimensional structure 230 is a side surface formed from side surfaces of the spacers 230T opposite to the bottom surface 211 (see FIG. 9). In the embodiments, at least two spacers 210 are connected to the side wall 291 connected to the three-dimensional structure 230, such that the spacers 230T and the side walls 201 connected to the three-dimensional structure 210 form and surround an accommodation trough 233 to accommodate the first electromagnetic induction module 400. However, embodiments of this disclosure are not limited thereto. In other embodiments, the spacers may form the accommodation trough independently, i.e., the spacers are not connected to one of the side walls, but only define the accommodation trough, or the accommodation trough is disposed in the heat-dissipating base.

In addition, the spacers 230T may be monolithically formed and connected to each other, and a corner portion 230C is formed between at least two neighboring spacers 230T. A thickness of each of the corner portions 230C is greater than a thickness of each of the spacers 230T so as to strengthen the structure of the three-dimensional structure 230. However, embodiments of this disclosure are not limited thereto. In other embodiments, the spacers are not monolithically formed but individually assembled to be mutually connected.

In general, the shape of the three-dimensional structure is adjusted according to the shape of the magnetic component for receiving the magnetic component therein. For example, in the embodiment, as shown in FIG. 9, when the shape of the first electromagnetic induction module 400 is a cuboid or similar to a cuboid, the shape of the three-dimensional structure 230 can be a cuboid or a shape similar to a cuboid. However, embodiments of this disclosure are not limited thereto. People having ordinary skill in the art can make proper modification on the shape of the three-dimensional structure according to actual application. For example, the shape of the three-dimensional structure can be cylindrical or semi-cylindrical.

Figure 18A:
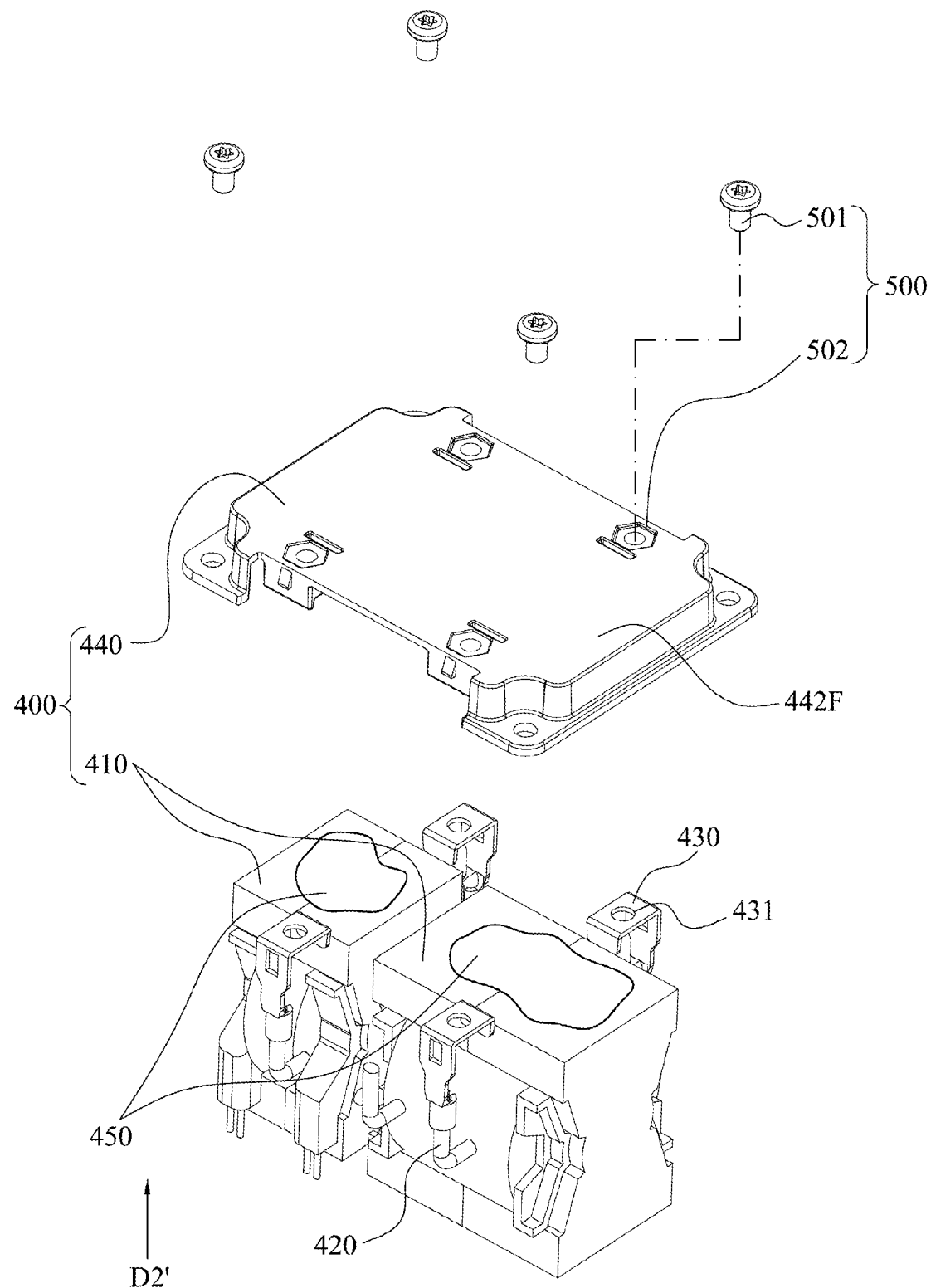
FIG. 18A is an exploded view of a magnetic component and a cover of FIG. 9.
Figure 18B:
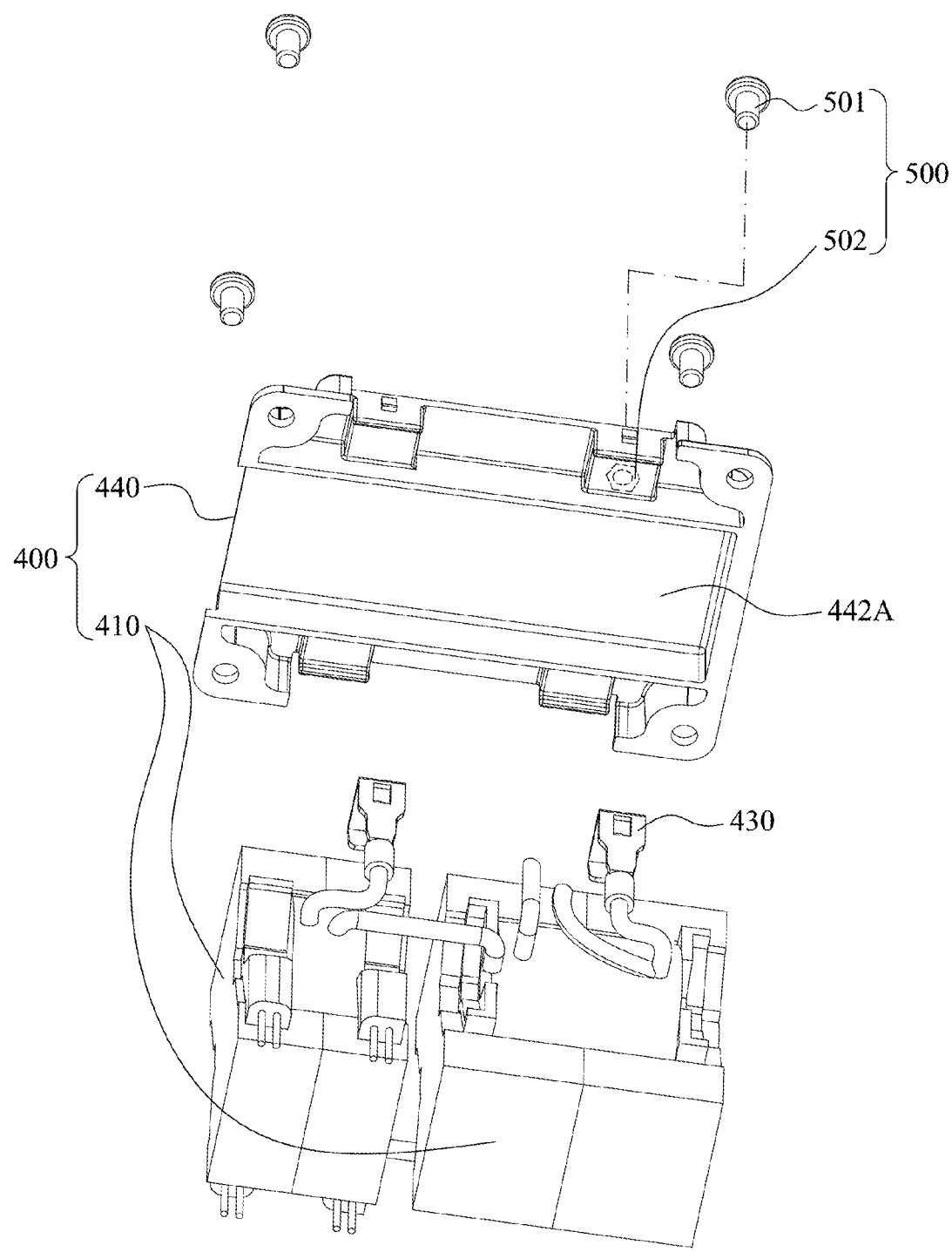
FIG. 18B is an exploded view of the magnetic component and the cover viewed along a direction D2' of FIG. 18A.

FIG. 18A is an exploded view of a magnetic component 410 and a cover 440 of FIG. 9. FIG. 18B is an exploded view of the magnetic component 410 and the cover 440 viewed along a direction D2' of FIG. 18A. As shown in FIG. 9 and FIG. 18A, the magnetic component 410 is at least partially disposed in the accommodation trough 233. The magnetic component 410 is electrically connected to the first printed wiring board 610 (see FIG. 16A) through the fixing assembly 500. Specifically, the first electromagnetic induction module 400 includes two magnetic components 410. The two magnetic components 410 are disposed side by side in the accommodation trough 233 and are separated by a separating rib 234 extending from the bottom part 233B of the accommodation trough 233, so as to improve the heat-dissipating efficiency and avoid a short circuit.

The first electronic magnetic module 400 further includes a fixing member (or a cover 440). The cover 440 covers the accommodation trough 233 (see FIG. 16A). As shown in FIG. 18A and FIG. 18B, the cover 440 is assembled with the magnetic component 410. For example, the assembling surface 442A (see FIG. 18B) of the cover 440 is combined with the magnetic component 410 by an adhesive glue 450. In addition, the cover 440 is physically fixed on the first printed wiring board 610 by the fixing assembly 500, so that the cover 440 is disposed between and connected to the first printed wiring board 610 and the magnetic component 410 (see FIG. 16A). A material forming the cover 440 can be an insulating material or a metal with insulating surfaces. However, embodiments of this disclosure are not limited thereto. In other embodiments, the cover may be omitted, and the electromagnetic induction module can be fixed in the accommodation trough only through the potting glue.

As shown in FIG. 16A, after an input power is converted by the electronic device 100, the power is transmitted to the system components through an input port, an output port, and a communication port mounted on the heat-dissipating base 200, so as to achieve power conversion and power management. The first printed wiring board 610 further includes a plurality of first connecting portions 640. The first connecting portions 640 are electrically connected to one of the electronic components respectively. Each of the first connecting portions 640 has a first through hole 641. As shown in FIG. 16A, the first electromagnetic induction module 400 further includes at least one terminal 430, and each of the magnetic components 410 has a plurality of wires 420 (see FIG. 18A). Each of the wires 420 is electrically connected to the terminal 430, and each of the terminals 430 has a second through hole 431. The fixing assembly 500 includes, for example, a first fixing member 501 (a nut or a screw, for example) and a second fixing member 502 (a nut or a screw, for example) corresponding to each other. The second fixing member 502 is embedded in a surface (or a first surface 442F) of the cover 440 opposite to the assembling surface 442 (see FIG. 18B).

Embodiments of this disclosure are not limited thereto. People having ordinary skill in the art can make proper modification on the fixing assembly according to their actual application.

Figure 16D:
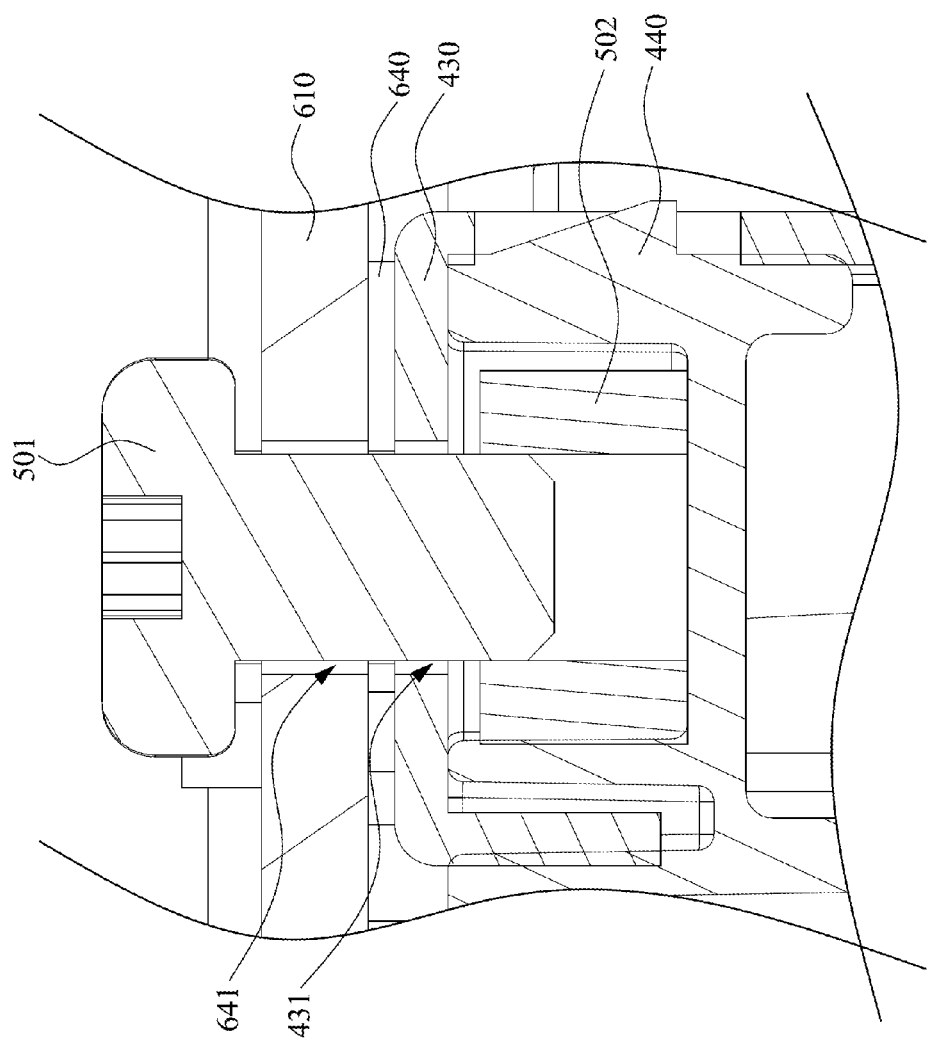
FIG. 16D is a cross-sectional view viewed along line 16-16 of FIG. 16C.

FIG. 16D is a cross-sectional view viewed along line 16-16 of FIG. 16C. As shown in FIG. 16D, when the first electromagnetic induction module 400 is fixed to the printed wiring board 610, the terminal 430 is clamped between the second fixing member 502 (a nut, for example) and the first connecting portion 640, and the first fixing member 501 (a screw, for example) passes through the first through hole 641 and the second through hole 431 and is coupled with the second fixing member 502 (a nut, for example). During the coupling process, the second fixing member 502 presses the terminal 430 toward the first connecting portion 640, such that the terminal 430 is electrically connected to the first connecting portion 640.

In addition, in order to stably fix the cover 440 to the three-dimensional structure 230, as shown in FIG. 9, in the embodiment, the cover 440 covers the accommodation trough 233 and is fixed on the three-dimensional structure 230 by a fixing structure. For example, the top surface 231 formed by the surfaces of the spacers 230T of the three-dimensional structure 230 opposite to the bottom surface 211 has a plurality of first threaded holes 232. Each of the first threaded holes 232 is disposed in the corner portion 230C. The cover 440 has a plurality of second threaded holes 441. When the cover 440 covers the top surface 231 of the three-dimensional structure 230, the first threaded holes 232 is aligned to the second threaded holes 441. At this time, after the screws S pass through the second threaded holes 441 and are fixed in the first threaded holes 232, the cover 440 is fixed to the top surface 231 of the three-dimensional structure 230, i.e., the cover 440 is fixed to the accommodation trough 233.

Embodiments of this disclosure are not limited thereto. People having ordinary skill in the art can use an engaging member and a engaging groove corresponding to each other, an embedding member and an embedding groove corresponding to each other, a latch and a slot corresponding to each other, or another known fixing method as the fixing structure according to actual application.

FIG. 19A is a schematic cross-sectional view after the heat-dissipating base 200 and the first electromagnetic induction module 400 are assembled according to one embodiment of this disclosure. As shown in FIG. 19A, the embodiment is similar to the aforementioned embodiment. In order to improve the heat-dissipating efficiency, the embodiment further has the following technical features. A potting glue body 235 fills the accommodation trough 233, and the potting glue body 235 fills in a gap G' between the magnetic component 410 disposed in the accommodation trough 233 and the three-dimensional structure 230. Specifically, the magnetic component 410 is disposed in the accommodation trough 233, and the gap G' is located not only between the spacers 230T and the magnetic component 410 but also between the bottom surface 211 of the heat-dissipating base 200 and the magnetic component 410. Therefore, the potting glue body 235 not only dissipates the heat generated by the magnetic component 410 to the heat-dissipating base 200, but also coats the magnetic component 410 to stably fix the magnetic induction module 400 in the accommodation trough 233.

In considering the filling of the potting glue body 235, when the overall energy loss or the energy loss of the coil is greater than the magnetic depletion, people having ordinary skill in the art may fill the gap G' entirely between the magnetic component 410 and the three-dimensional structure 230 with the potting glue body 235 according to actual application.

Embodiments of this disclosure are not limited thereto. In other embodiments, the potting glue body 235 may not entirely fill the gap G' between the magnetic component 410 and the three-dimensional structure 230. FIG. 19B is a schematic cross-sectional view after the heat-dissipating base 200 and the first electromagnetic induction module 400 are assembled according to one embodiment of this disclosure. As shown in FIG. 19B, when the overall energy loss or the energy loss of the coil is smaller than the magnetic depletion, people having ordinary skill in the art may partially fill the gap G' between the magnetic component 410 and the three-dimensional structure 230 with the potting glue body 235 according to actual application, such that the potting glue body 235 disposed in the accommodation trough 233 has a height H3 smaller than a height H4 of the electromagnetic induction module 400. For example, the height H3 of the potting glue body 235 disposed in the accommodation trough 233 is one half of the height H4 of the first electromagnetic induction module 400. Specifically, the first electromagnetic induction module 400 is disposed in the accommodation trough 233, and the gap G' is located not only between the spacers 230T and the first electromagnetic induction module 400 but also between the bottom surface 211 of the heat-dissipating base 200 and the first electromagnetic induction module 400.

Because the potting glue body 235 does not fill the entire three-dimensional structure 230, the embodiment of FIG. 19B may not need the cover, such that a portions of the first electromagnetic induction module 400 is fixed to the accommodation trough 233 through the potting glue body 235, and another portion of the first electromagnetic induction module 400 is disposed outside the three-dimensional structure 230.

As shown in FIG. 19A, in order to improve the heat-dissipating efficiency, in the embodiment, there are many thermally conductive particles 236 in the potting glue body 235. Materials of the thermally conductive particles 236 can be carbon, metal, or a diamond-like material. Embodiments of this disclosure are not limited thereto. There may be no thermally conductive particles in the potting glue body.

In order to improve the heat-dissipating efficiency, as shown in FIG. 16B, a fin 206 may be disposed on a surface of the heat-dissipating base 200 opposite to the bottom surface 211. In addition, as shown in FIG. 16A, in the embodiment, the electronic device 100 further includes a top cover 930. The top cover 930 covers the heat-dissipating base 200. Specifically, the top cover 930 is fixed on the heat-dissipating base 200 through screws B, such that the first printed wiring board assembly 600 and the first electromagnetic induction module 400 are accommodated between the top cover 930 and the heat-dissipating base 200. The heat-dissipating cover 600 further includes a fin 931.

As shown in FIG. 16B, when the energy loss is larger, the three-dimensional structure 230 of the embodiment can be an integrated three-dimensional structure 230 monolithically formed on the heat-dissipating base 200, so as to improve the heat-dissipating efficiency. Specifically, the spacers 230T are monolithically connected to the bottom surface 211 of the heat-dissipating 200 and directly extend from the bottom surface 211 of the heat-dissipating base 200. More specifically, at least two spacers 210T are monolithically connected to the side wall 291 connected to the three-dimensional structure 230, such that the spacers 230T and the side wall 291 connected to the three-dimensional structure 230 surround the accommodation trough 233 together.

Figure 20B:
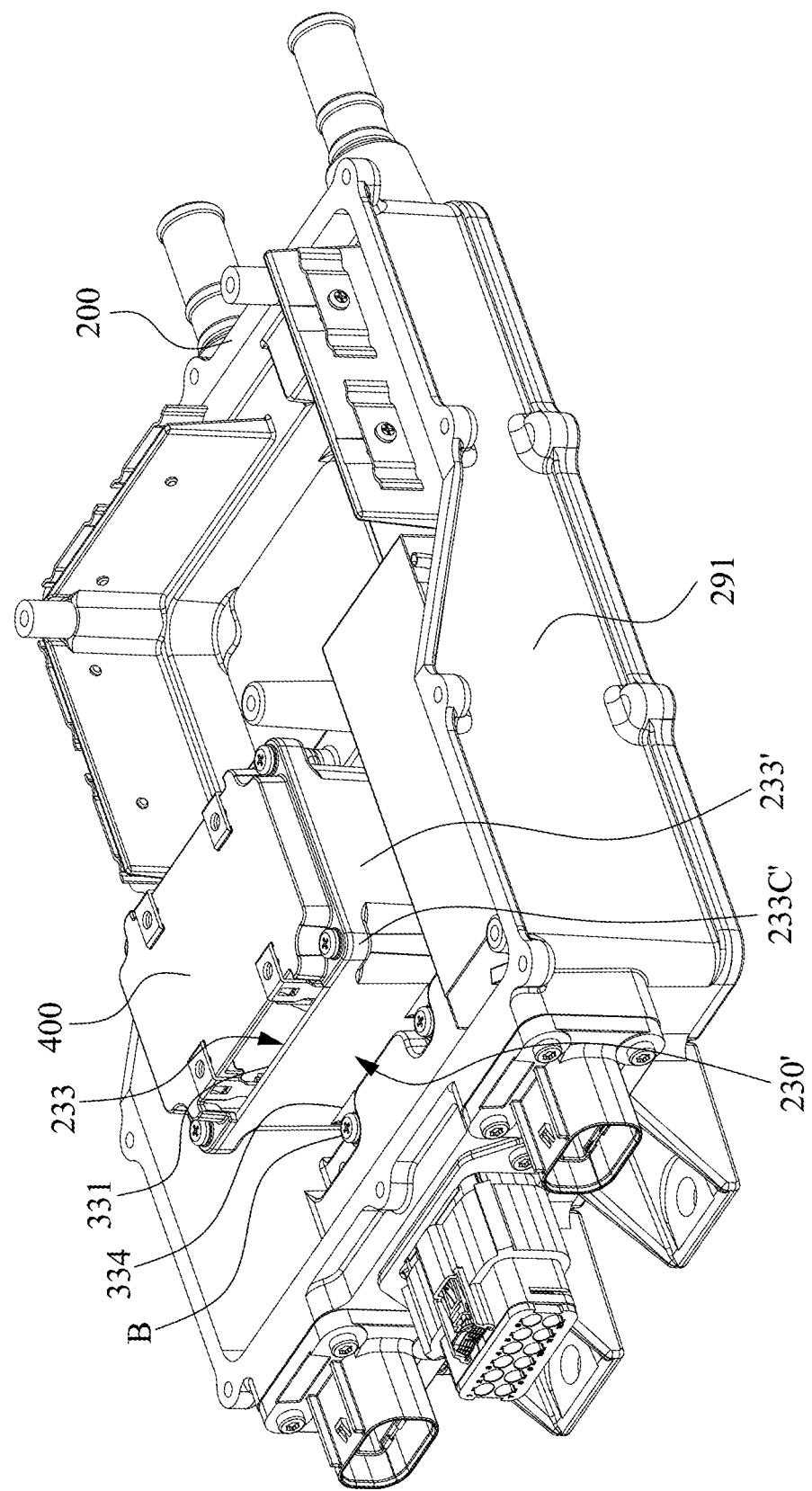
FIG. 20B is an assembled view of 20A.

The three-dimensional structure 230 is not limited to the integrated three-dimensional structure 230. In other embodiments, the three-dimensional structure 230 may be an independent three-dimensional structure 330. FIG. 20A is an exploded view of the heat-dissipating base 200, the independent three-dimensional structure 330, and the first electromagnetic induction module 400 according to one embodiment of this disclosure. FIG. 20B is an assembled view of 20A. As shown in FIG. 20A and FIG. 20B, the embodiment is similar to the aforementioned embodiment, but the three-dimensional structure is an independent three-dimensional structure 330 in the embodiment. The independent three-dimensional structure 330 is detachably disposed on the heat-dissipating base 200. As shown in FIG. 20A, after the independent three-dimensional structure 330 is independently manufactured, the independent three-dimensional structure 330 is disposed in the accommodation space 201 and is assembled to the bottom surface 211 of the heat-dissipating base 200. For example, one side surface of the independent three-dimensional structure 330 faces the bottom surface 211, so a side surface of the independent three-dimensional structure 330 opposite to the bottom surface 211 (the top surface 331) supports and combines with the first electromagnetic induction module 400. Then, the three-dimensional structure 330 is assembled to the bottom surface 211 of the heat-dissipating base 200 through screws B and fixing lugs 334. Correspondingly, one side of the independent three-dimensional structure 330 is assembled to the bottom surface 211 of the heat-dissipating base 200.

Specifically, the independent three-dimensional structure 330 is box-shaped and includes a bottom board 332 and a plurality of side boards 333. The side boards 333 extend from the bottom board 332 in the extending direction T', so the top surface 331 of the independent three-dimensional structure 330 is a side surface formed by the side board 333 opposite to the bottom board 332 together. In the embodiment, the bottom board 332 and the side board 333 surround and form the accommodation trough 233. The fixing lugs 334 are disposed on outer surfaces of the two opposite side boards 333 and extend outwardly along a direction away from the accommodation trough 233, In addition, the bottom board 332 and the side boards 333 are monolithically connected to each other, and every two of the side boards 333 form a corner portion 333C. A thickness of each of the corner portions 333C is larger than a thickness of each of the side boards 333 to strengthen the structure of the independent three-dimensional structure 330. Embodiments of this disclosure are not limited thereto. In other embodiments, the side boards can be detachably connected to each other by assembling. Therefore, the bottom board 332 of the independent three-dimensional structure 330 and the side boards 333 can be heat-dissipating surfaces. When the independent three-dimensional structure 330 is assembled with the heat-dissipating base 200, the heat generated can be dissipated through the independent three-dimensional structure 330 to other parts of the heat-dissipating base 200, thereby improving the heat-dissipating efficiency.

Usually, a shape of the independent three-dimensional structure is adjusted according to the shape of the magnetic component, so as to receive the magnetic component therein. For example, in the embodiment, as shown in FIG. 20A, the shape of the magnetic component 410 is a cuboid or a shape similar to a cuboid. Embodiments of this disclosure are not limited thereto. People having ordinary skill in the art can make proper modification on the shape of the independent three-dimensional structure according to their actual application. For example, the shape of the independent three-dimensional structure can be cylindrical or semi-cylindrical. The potting glue can be filled before the independent three-dimensional structure 330 is assembled with the heat-dissipating base 200.

Figure 21:
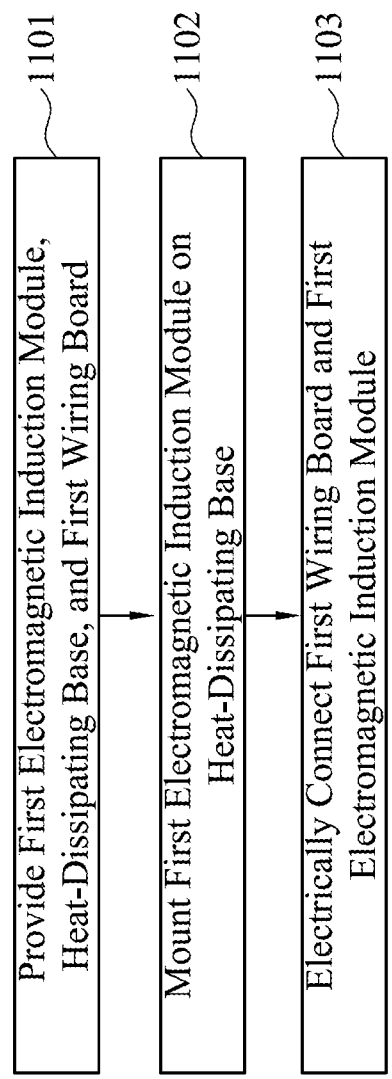
FIG. 21 is a flow chart of a method for assembling the electronic device according to one embodiment of this disclosure.

FIG. 21 is a flow chart of a method for assembling the electronic device 100 according to one embodiment of this disclosure. As shown in FIG. 16A and FIG. 21, a method for assembling the electronic device 100 is provided. The method includes the following steps. Step 1101 is performed to provide the first electromagnetic induction module 400, the heat-dissipating base 200, and the first printed wiring board 610. Step 1102 is performed to mount the first electromagnetic module 400 on the heat-dissipating base 200. Step 1103 is performed to electrically connect the first printed wiring board 610 and the first electromagnetic induction module 400.

Therefore, because in the method of the embodiment, the first printed wiring board 610 is electrically connected to the electromagnetic induction module 400 after the first electromagnetic induction module 400 is mounted on the heat-dissipating base 200, compared to the prior art, in which the electromagnetic induction module is mounted on the heat-dissipating base after the electromagnetic induction module is electrically connected to the printed wiring board, the situation that the electromagnetic induction module falls apart from the printed wiring board and thus damages the electronic connection due to the gravitational force or external forces is avoided, such that the quality of the electrical connection of the electromagnetic induction module and the printed wiring board is improved and that the reliability of the connection is improved.

Step 1101 further includes the following detailed operations. As shown in FIG. 9 and FIG. 22A, the cover 440 covers the magnetic components 410 of the first electromagnetic induction module 400 before the first electromagnetic induction module 400 is disposed in the accommodation trough 233. Then, as shown in FIG. 16D, the terminal 430 of the magnetic components 410 are aligned to the second fixing members 502 of the cover 440.

Step 1102 further includes the following detailed operations. FIG. 22A is a 3-D view illustrating a potting glue L injected between the three-dimensional structure 230 and the magnetic component 410. As shown in FIG. 9, the first electromagnetic induction module 400 which is not assembled with the first printed wiring board 610 is disposed in the accommodation trough 233 of the heat-dissipating base 200. Then, as shown in FIG. 22A, the potting glue L fills into a gap between the three-dimensional structure 230 and the magnetic components 410.

Specifically, as shown in FIG. 22A, when the first electromagnetic induction module 400 is disposed in the three-dimensional structure 230, the cover 440 is fixed on and covers the three-dimensional structure 230 after the magnetic components 410 is disposed in the accommodation trough 233, such that a narrow seam 237 is formed between the cover 440 and the three-dimensional structure 230 and that a gap is formed between the magnetic components 410 disposed in the accommodation trough 233 of the three-dimensional structure 230 and inner surfaces of the three-dimensional structure 230. When the potting glue L is filled into the accommodation trough 233, the potting glue L can fill into the accommodation trough 233 through the narrow seam 237, such that the potting glue L fills in the gap between the magnetic components 410 and the accommodation trough 233. The detailed operations of step 1102 may be applied in the situation that a size of an opening of the accommodation trough 233 is larger in an assembling environment with poor visibility. Embodiments of this disclosure are not limited thereto.

After the step of filling the potting glue L into the gap between the three-dimensional structure 230 and the magnetic components 410, the embodiment further includes placing the accommodation trough 233 into a glue curing device (not shown), such as an oven, to cure the potting glue L in the accommodation trough 233 into the potting glue body 235 (see FIG. 19A).

Figure 22B:
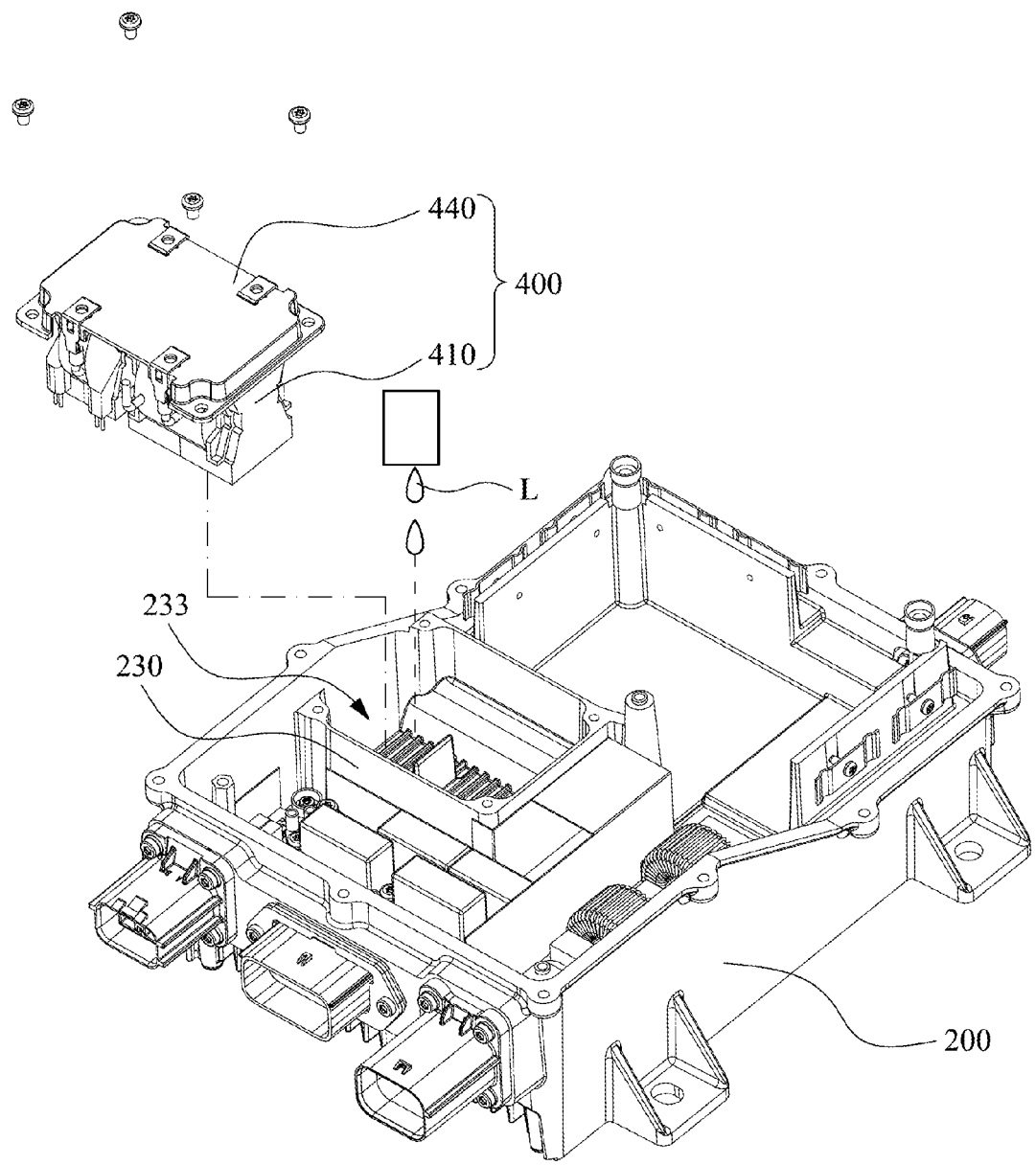
FIG. 22B is a 3-D view illustrating the potting glue injected into an accommodation trough in which no objects are placed yet.

In other embodiments, step 1102 further includes the following detailed operations. FIG. 22B is a 3-D view illustrating that the potting glue L is filled into an accommodation trough 233 in which no objects are placed yet. As shown in FIG. 22B, the potting glue L fills into the accommodation trough 233, and the potting glue can partially fill into the accommodation trough 233. Then, as shown in FIG. 19A, the magnetic components 410 of the electromagnetic induction module 400 is disposed in the accommodation trough 233, such that the magnetic components 410 is infiltrated into the potting glue L (the situation is similar to the situation that the magnetic components 410 is disposed in the potting glue body 235 in FIG. 19B).

As shown in FIG. 19A, specifically, when the first electromagnetic induction module 400 is disposed in the accommodation trough 233, i.e., the magnetic components 410 is infiltrated into the potting glue (refer to the potting glue body 235) in the accommodation trough 233, the cover 440 is fixed on and covers the three-dimensional structure 230 after the magnetic component 410 is disposed in the accommodation trough 233. At this time, the potting glue (refer to the potting glue body 235) is located between the gap G' between the magnetic components 410 and the three-dimensional structure 230. The detailed operations of step 1102 may be applied to the situation that the size of the opening of the accommodation trough 233 is smaller in an assembling environment with a better visibility. Embodiments of this disclosure are not limited thereto.

After the first electromagnetic induction module 400 is infiltrated into the potting glue L (refer to the potting glue body 235), the operations further includes placing the accommodation trough 233 into a glue curing device (not shown in Figs.), such as an oven, to cure the potting glue L in the accommodation trough 233.

In step 1102, the three-dimensional structure may be the independent three-dimensional structure 330 detachably disposed on the heat-dissipating base or the integrated three-dimensional structure 230 is a portion of the heat-dissipating base 200.

For example, when the three-dimensional structure is the independent three-dimensional structure 330 and the potting glue already fills in the independent three-dimensional structure 330, the potting glue in the independent three-dimensional structure 330 can be cured independently, and then the independent three-dimensional structure 330 is assembled on the heat-dissipating base 200. On the contrary, when the three-dimensional structure is the integrated three-dimensional structure 230, the entire heat-dissipating base 200 including the integrated three-dimensional structure 230 is required to be placed into the glue curing device to cure the potting glue.

Before assembled on the heat-dissipating base 200, the independent three-dimensional structure can be placed into the glue curing device in advance. Therefore, because a weight of the heat-dissipating base is greater than a weight of the independent three-dimensional structure, it takes less effort and time for workers to move the independent three-dimensional structure 330. In addition, a volume of the heat-dissipating base 200 is greater than a volume of the independent three-dimensional structure 330, the glue curing device can accommodate more the independent three-dimensional structure 330 than the heat-dissipating base 200 while the curing process is performed. Therefore, if the independent three-dimensional structure 330 is adopted and the curing process is performed before the independent three-dimensional structure 330 is assembled with the heat-dissipating base 200, the assembly time and the curing cost can be reduced.

In addition, as shown in FIG. 19A, when the potting glue is filled in the accommodation trough 233, the workers can entirely fill the gap G' between the three-dimensional structure 230 and the magnetic components 410 with the potting glue (refer to the potting glue body 235). Or, as shown in FIG. 19B, the workers can partially fill the gap G' between the three-dimensional structure 230 and the magnetic components 410 with the potting glue (refer to the potting glue body 235), and the height H3 of the potting glue (refer to the potting glue body 235) disposed in the accommodation trough 233 is smaller than the height H4 of the first electromagnetic induction module 400. For example, the height H3 of the potting glue (refer to the potting glue body 235) is one half of the height H4 of the first electromagnetic induction module 400.

People having ordinary skill in the art can make proper modification on the potting glue according to their actual application. The key point is that the potting glue can be filled in the accommodation trough to coat and protect the magnetic components of the electromagnetic induction module. The potting glue can be, for example, a liquid potting glue or a semi-solid potting glue. Specifically, the liquid potting glue can be UB-5204, LORD SC-309, and the semi-solid potting glue can be Dow Corning DC527.

Figure 23:
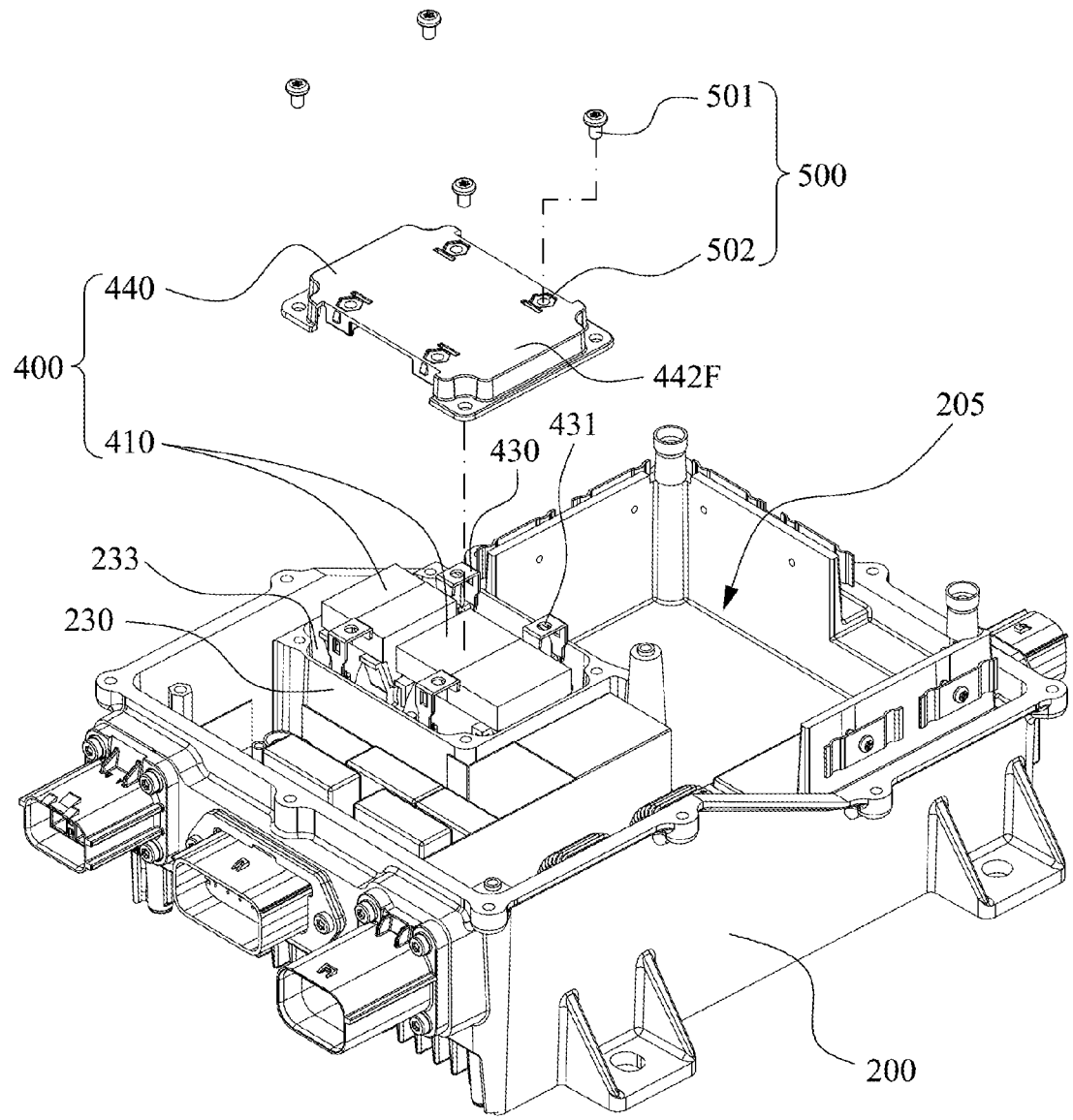
FIG. 23 is a 3-D view illustrating the accommodation trough in which the magnetic component is disposed in advance.

In another embodiment, step 1101 further includes the following detailed operations. FIG. 23 is a 3-D view illustrating the accommodation trough 233 in which the magnetic component 410 is disposed in advance. As shown in FIG. 23, before the cover 440 covers the magnetic component 410 of the first electromagnetic induction module 400, the magnetic component 410 is disposed in the accommodation trough 233 independently. Then, the cover 440 covers the magnetic component 410. Then, the terminal 430 is aligned to the second fixing member 502 of the cover 440 (as shown in FIG. 16A).

In another embodiment, step 1102 further includes the following detailed operations. After the cover 440 covers the magnetic component 410, the cover 440 is fixed to the three-dimensional structure 230 (as shown in FIG. 16B or FIG. 17). Embodiments of this disclosure are not limited thereto. In other embodiments, the step of aligning the terminal 430 of the magnetic component 410 to the second fixing member 502 of the cover 440 can be performed after the cover 440 is fixed on the three-dimensional structure 230. The filling sequence and details about the potting glue can be similar to the aforementioned embodiments.

Step 1103 further includes the following detailed operations. As shown in FIG. 16A and FIG. 16C, the terminal 430 of the first electromagnetic induction module 400 is fixed to the first connecting portion 640 of the first printed wiring board 610 through an electrically conductive fixing member 501. Therefore, the first printed wiring board 610 is physically connected to the first electromagnetic induction module 400, and the first printed wiring board 610 is electrically connected to the first electromagnetic induction module 400. Specifically, before the terminal 430 is fixed to the first connecting portion 640 by the electrically conductive first fixing member 501, such as a metal screw, the first printed wiring board 610 is disposed upside down to cover the first electromagnetic induction module 400, such that the terminal 430 of the first electromagnetic induction module 400 respectively face the first connecting portion 640 of the first printed wiring board 610.

Though the connecting portion (or the terminal 430) of the electromagnetic induction module of the aforementioned embodiments is fixed to the connecting portion of the printed wiring board by locking, in other embodiments, step 1103 further includes the following detailed operations. The connecting portion of the electromagnetic induction module is electrically connected to the connecting portion of the printed wiring board. For example, through solder welding process, the connecting portion of the electromagnetic induction module is coupled with the connecting portion of the printed wiring board through conductive pads. Therefore, the printed wiring board is physically connected to the electromagnetic induction module, and the printed wiring board is electrically connected to the electromagnetic induction module.

In addition, in step 1103, people having ordinary skill in the art can use a coupling method combined with locking and welding according to their actual application. Embodiments of this disclosure are not limited thereto.

Figure 25:
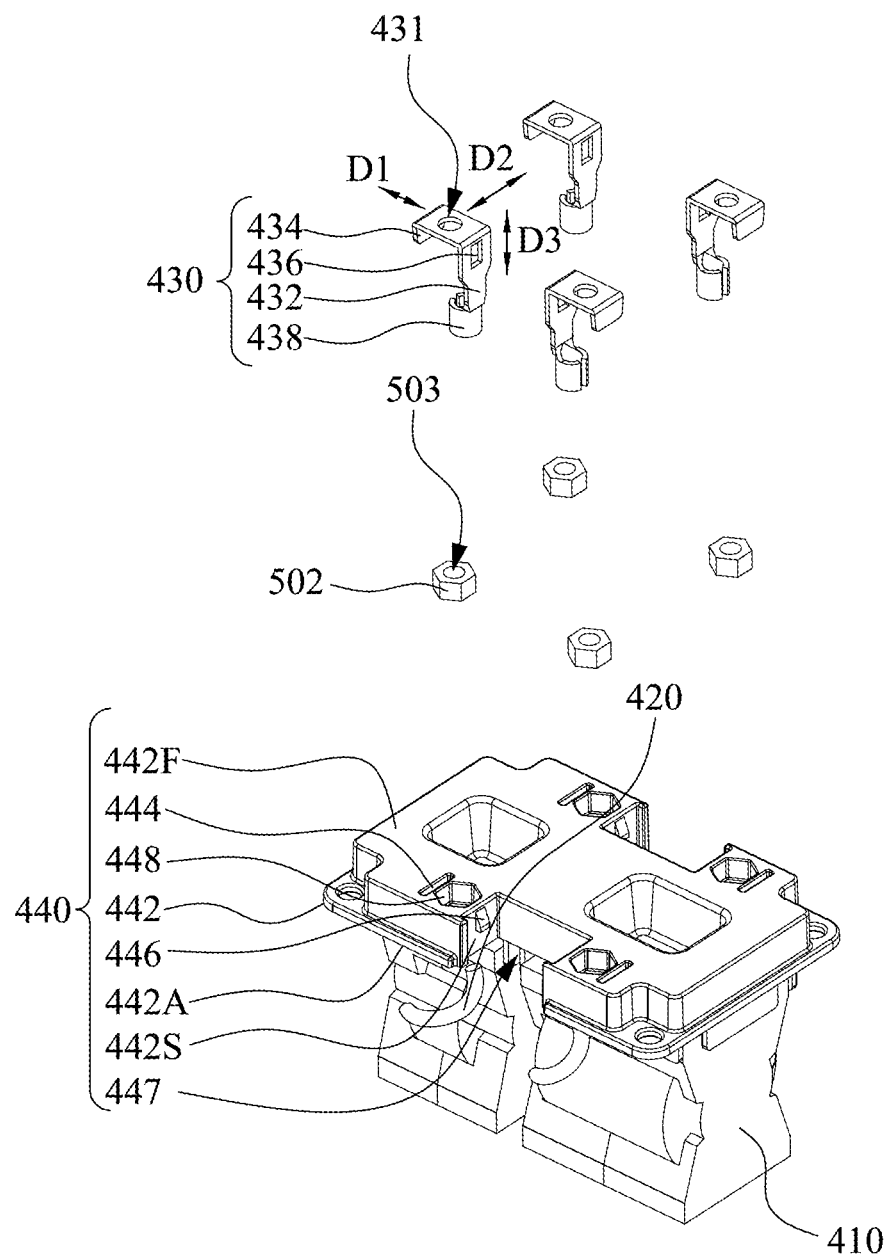
FIG. 25 is an exploded view of the cover and a terminal of FIG. 24.

As described above, the first electromagnetic induction module 400 can be fixed to the first connecting portion 640 of the first printed wiring board 610 through the terminal 430 of the first electromagnetic induction module 400, such that the first electromagnetic induction module 400 is electrically connected to the first printed wiring board 610. The detailed information about the embodiments is described in the following. FIG. 24 is an exploded view of the electronic device 100 according to another embodiment of this disclosure. FIG. 25 is an exploded view of the cover 440 and the terminal 430 of FIG. 24. Specifically, the terminal 430 is electrically connected to the magnetic component 410 and the first printed wiring board 610. The terminal 430 includes a main body 432, a third coupling portion 434, and a fourth coupling portion 436. The third coupling portions 434 and the fourth coupling portion 436 are disposed on the main body 432 of the terminal 430. The fixing member (or the cover 440) is connected to the magnetic component 410. The cover 440 includes a main body 442, a first coupling portion 444, and a second coupling portion 446. The main body 442 of the cover 440 has a first surface 442F and a second surface 442S connected to the first surface 442F, and a normal direction of the first surface 442F and a normal direction of the second surface 442S are interlaced with each other. The first coupling portion 444 is disposed on the first surface 142F, for being detachably coupled with the coupling portion 434, such that degrees of freedom in a first direction D1 and a second direction D2 of the terminal 430 are restricted. The second coupling portion 446 is disposed on the second surface 442S, for being detachably coupled with the fourth coupling portion 436, such that a degree of freedom in a third direction D3 of the terminal 430 is restricted. The first direction D1, the second direction D2, and the third direction D3 are linearly independent.

As shown in FIG. 24 and FIG. 25, the main body 442 of the cover 440 has a notch 448 therein. The second fixing member 502 is accommodated in the notch 448 and has a threaded hole 503 therein. The first printed wiring board 610 has a first through hole 641 therein. The main body 432 of the terminal 430 has a second through hole 431 therein. In the assembling process, the first fixing member 501 first passes through the through hole 641 of the first printed wiring board 610, then through the second through hole 431 of the main body 432 of the terminal 430, and then is coupled with the second coupling member 502. Specifically, in the embodiment, when the second fixing member 502 is accommodated in the notch 448, the third coupling portion 434 is coupled with the first coupling portion 444, and the fourth coupling portion 436 is coupled with the second coupling portion 446, the threaded hole 503 of the second fixing member 502 is connected to the second through hole 431 of the main body 432 of the terminal 430, such that the first fixing member 501 may pass the first through hole 641 of the first printed wiring board 610 and the second through hole 431 of the main body 432 of the terminal 430 and be coupled with the second fixing member 502.

More specifically, as shown in FIG. 25, the cover 440 at least partially covers the magnetic component 410. People having ordinary skill in the art can make proper modification on the cover 440 according to their actual application.

The third coupling portion 434 may be a protruded coupling portion, and the first coupling portion 444 may be a recessed coupling portion. With the shape matching, the third coupling portion 434 may be detachably coupled with the first coupling portion 444. By restricting the degrees of freedom in the first direction D1 and the second direction D2 of the third coupling portion 434, the degrees of freedoms in the first direction D1 and the second direction D2 of the terminal 430 is restricted as well. People having ordinary skill in the art can make proper modification on the shape matching according to their actual application. In other embodiments, the third coupling portion 434 may be a recessed coupling portion, and the first coupling portion 444 may be a protruded coupling portion. The key point is that the degrees of freedoms in the first direction D1 and the second direction D2 of the terminal 430 can be restricted.

The fourth coupling portion 436 may be a recessed coupling portion, and the second coupling portion 446 may be a protruded coupling portion. Similarly, with the shape matching, the fourth coupling portion 436 may be detachably coupled with the second coupling portion 446. By restricting the degree of freedom in the third direction D3 of the fourth coupling portion 436, the degree of freedom in the third direction D3 of the terminal 430 is restricted as well. People having ordinary skill in the art can make proper modification on the shape matching according to their actual application. In other embodiments, the fourth coupling portion 436 may be a protruded recessed coupling portion, and the second coupling portion 446 may be a recessed protruded coupling portion. The key point is that the degree of freedom in the third direction D3 of the terminal 430 can be restricted.

Because the first direction D1, the second direction D2, and the third direction D3 are linearly independent, when the degrees of freedom in the first direction D1, the second direction D2, and the third direction D3 are all restricted, the terminal 430 is stably fixed. The terminal 430 includes the connecting end 438, the wire 420 extends from the magnetic component 410, and the connecting end 438 is electrically connected to the wire 420, such that the magnetic component 410 is electrically connected to the terminal 430. The connecting end 438 may be connected to the wire 420 by riveting or welding, and the wire 420 may be a single-strand or multi-strand wire. Specifically, the wire 420 may be a wire extending from the coil. As shown in FIG. 24 and FIG. 25, in the embodiment, four terminals 430 are coupled with the main body 442 of the cover 440.

As shown in FIG. 24, the positions of the first through holes 641 correspond to the second through holes 431 of the main body 432 of the terminal 430. When the third coupling portion 434 is coupled with the first coupling portion 444 and the fourth coupling portion 436 is coupled with the second coupling portion 446, as shown in FIG. 25, the threaded hole 503 of the second fixing member 502 is connected to the second through hole 431 of the main body 432 of the terminal 430. At that time, the assembly worker may use the first fixing member 501 to fix the first printed wiring board 610 to the main body 432 of the terminal 430. The assembly worker first inserts the first fixing member 501 through the first through hole 641 of the first printed wiring board 610, and then through the second through hole 431 of the main body 432 of the terminal 430. Then, the assembly work couples the first fixing member 501 with the second fixing member 502. As shown in FIG. 25, because the shape of the notch 448 matches the second fixing member 502, the second fixing member 502 cannot rotate in the notch 448. Therefore, when the first fixing member 501 is being coupled with the second fixing member 502, the first fixing member 501 may rotate with respect to the second fixing member 502, such that the coupling of the first fixing member 501 and the second fixing member 502 may be performed successfully. The notch 448 may be a hexagonal column or a polygonal column.

Because the second fixing member 502 is restricted in the notch 448 by the terminal 430, the first fixing member 501 as well as the first printed wiring board 610 is restricted by the terminal 430 after the first fixing member 501 is coupled with the second fixing member. However, because the degrees of freedom in the first direction D1, the second direction D2, and the third direction D3 of the terminal 430 is restricted, and because the terminal 430 is stably fixed to the cover 440. Therefore, in the embodiment, the first printed wiring board 610 is stably fixed to the cover 440.

In order to easily couple or detach the third coupling portion 434 with the first coupling portion 444 and to easily couple or detach the fourth coupling portion 436 with the second coupling portion 446, in the embodiment, the main body 442 of the cover 440 has a recessed portion 447, for providing an assembling space. The second surface 442S of the main body 442 of the cover 440 is at least one inner surface of the recessed portion 447.

Figure 26:
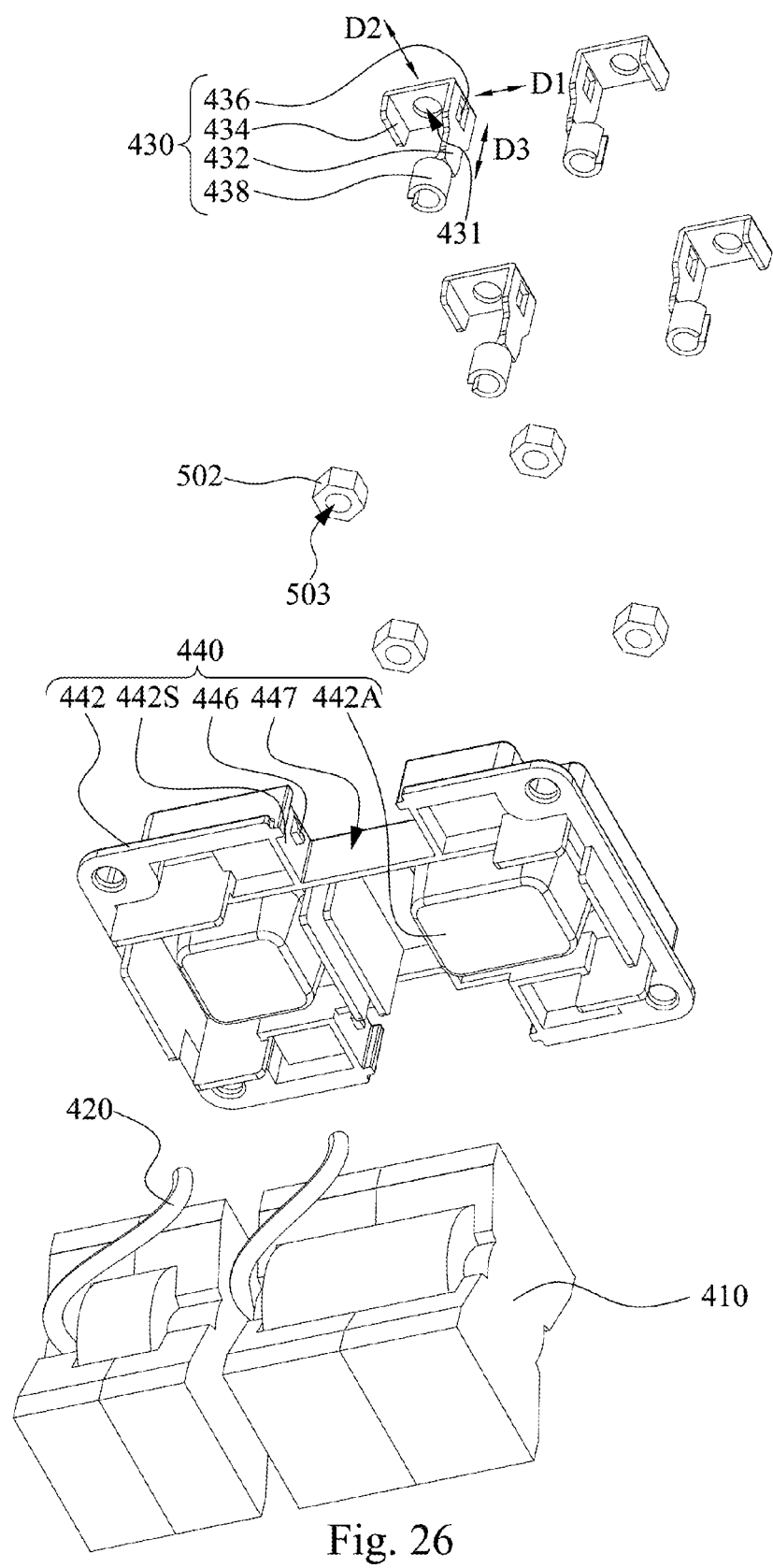
FIG. 26 is an exploded view of an assembling surface of the cover of FIG. 24.

FIG. 26 is an exploded view of the assembling surface 442A of the cover 440 of FIG. 24. As shown in FIG. 25 and FIG. 26, in the embodiment, the main body 442 of the cover 440 has the assembling surface 442A facing the magnetic component 410, and the first surface 442F is opposite to the assembling surface 442A. Specifically, the first surface 442F is a top surface opposite to the assembling surface 442A. The cover 440 may be assembled with the magnetic component 410 by gluing, coupling, or other appropriate methods.

Figure 27:
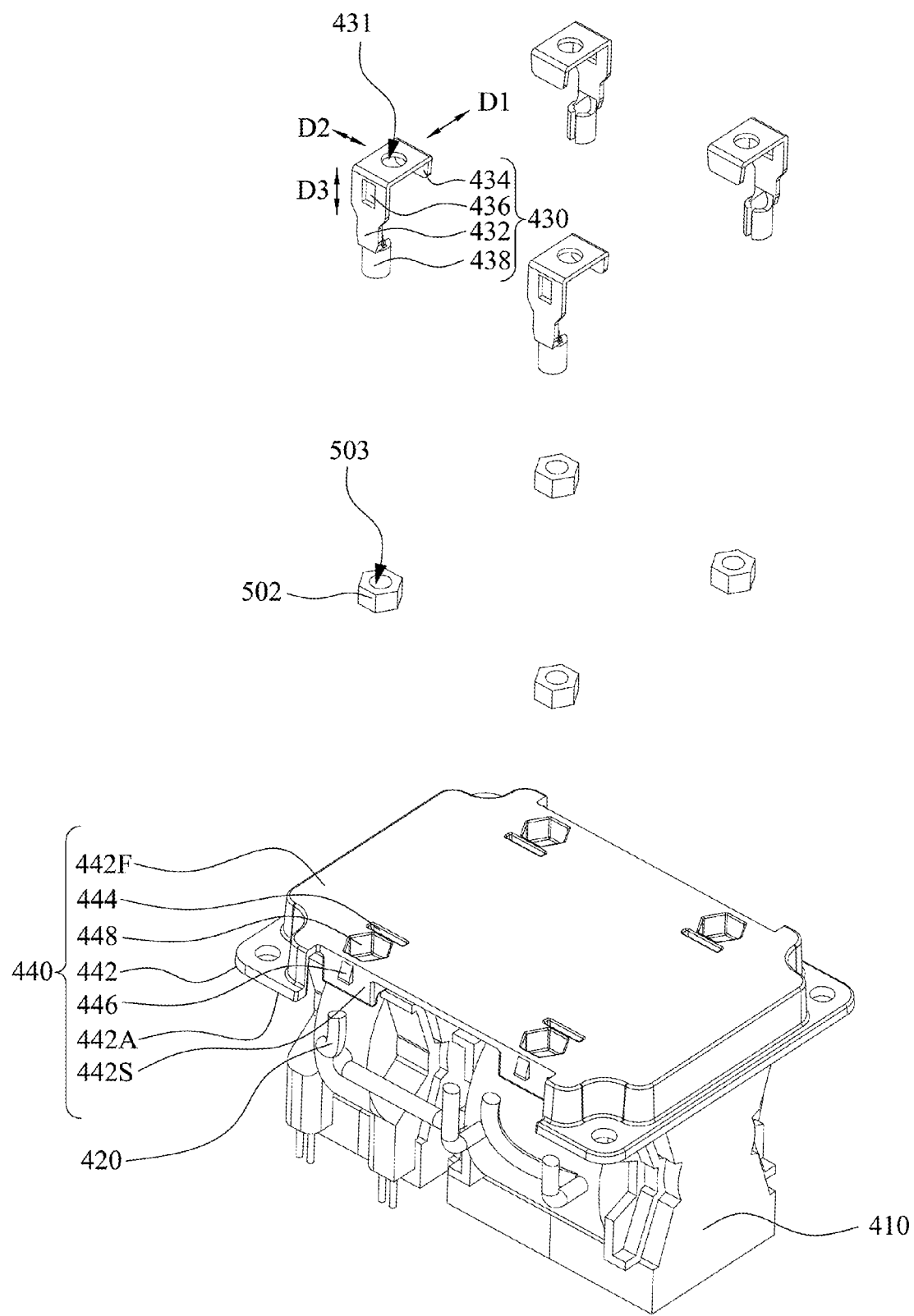
FIG. 27 is an exploded view of the cover and the terminal according to another embodiment of this disclosure.

Though in FIG. 25, the second surface 442S is at least one inner surface of the recessed portion 447, people having ordinary skill in the art can make proper modification according to their actual application. FIG. 27 is an exploded view of the cover 440 and the terminal 430 according to another embodiment of this disclosure. In another embodiment shown in FIG. 27, the second surface 442S is a side surface connected to the first surface 442F. The key point is that the terminal 430 can be coupled with the cover 440.

Figure 28:
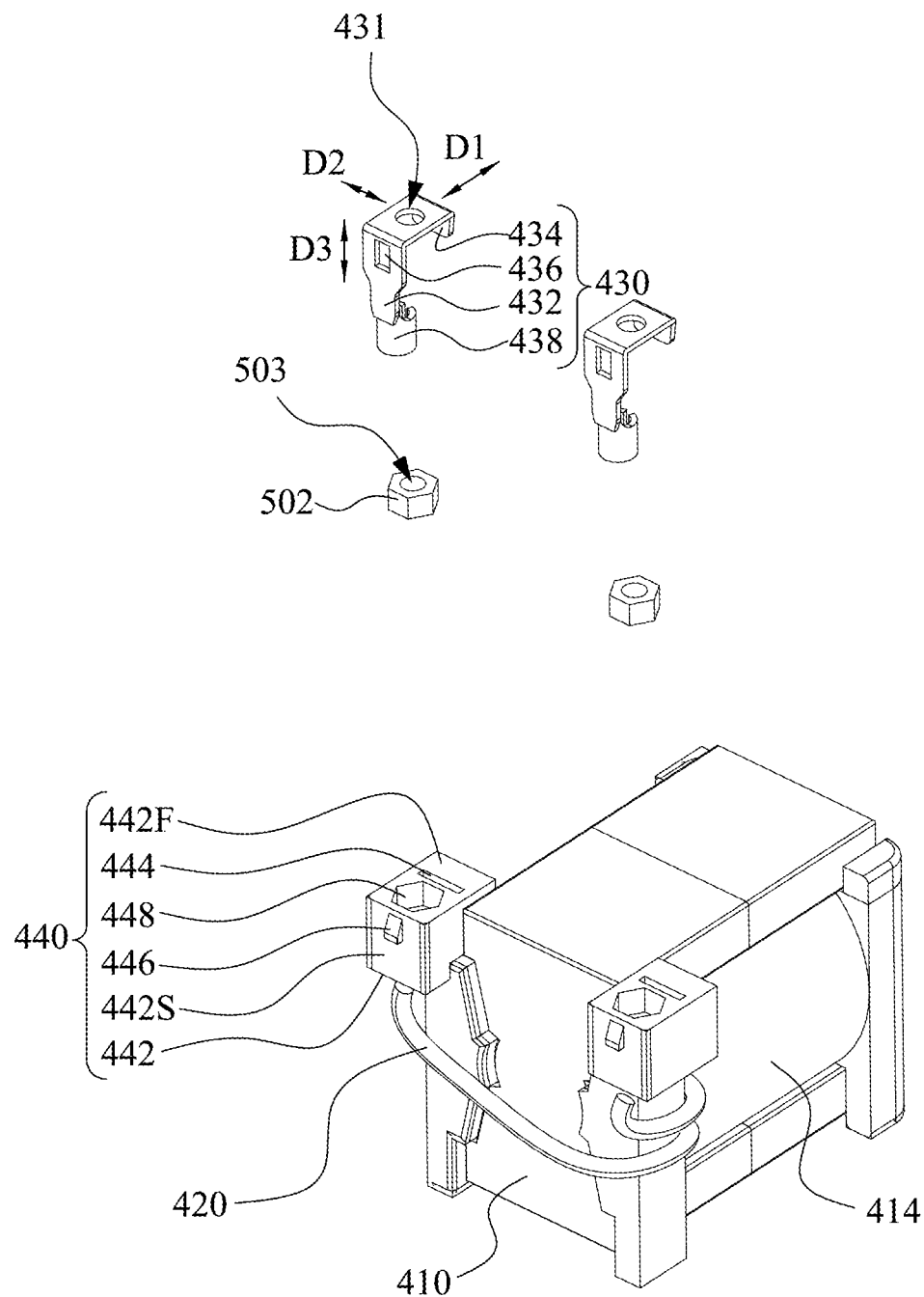
FIG. 28 is an exploded view of a bobbin and the terminal according to another embodiment of this disclosure.

In one embodiment, the fixing member can be a bobbin 440, for holding at least one coil 414. FIG. 28 is an exploded view of the bobbin 440 and the terminal 430 according to another embodiment of this disclosure. As shown in FIG. 28, in the embodiment, the bobbin 440 includes a main body 442, the first coupling portion 444, and the coupling portion 446. The main body 442 of the bobbin 440 has a first surface 442F and a second surface 442S connected to the first surface 442F, and a normal direction of the first surface 442F and a normal direction of the second surface 442S are interlaced with each other. The first coupling portion 444 is disposed on the first surface 442F, for being detachably coupling with the third coupling portion 434 of the terminal 430, such that the degrees of freedom in the first direction D1 and the second direction D2 of the terminal 430 are restricted. The second coupling portion 446 is disposed on the second surface 442S, for being detachably coupling with the fourth coupling portion 436 of the terminal 430, such that the degree of freedom in the third direction D3 of the terminal 430 is restricted. The first direction D1, the second direction D2, and the third direction D3 are linearly independent. The terminal 430 includes a connecting end 438, the wire 420 extends from the coil 414, and the connecting end 438 is electrically connected to the wire 420, such that the coil 414 is electrically connected to the terminal 430. As shown in FIG. 28, in the embodiment, two terminals 430 are coupled with the main body 442 of the bobbin 440.

Similarly, in the embodiment, the main body 442 of the bobbin 440 has a notch 448 therein, for accommodating the second fixing member 502. When the second fixing member 502 is accommodated in the notch 448, the third coupling portion 434 is coupled with the first coupling portion 444, and the fourth coupling portion 436 is coupled with the second coupling portion 446, the threaded hole 503 of the second fixing member 502 is connected to the second through hole 431 of the main body 432 of the terminal 430.

Figure 29:
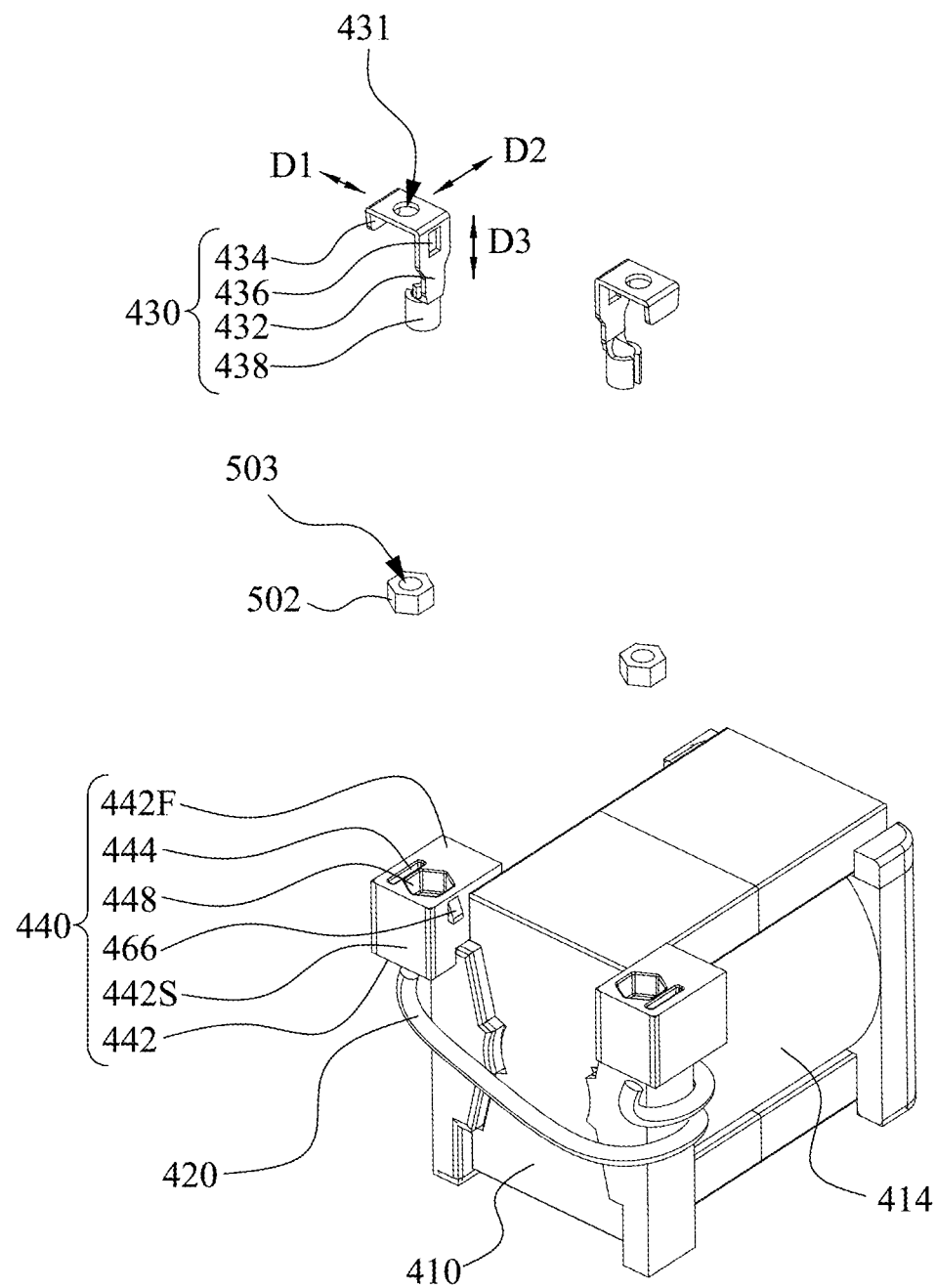
FIG. 29 to FIG. 30 are exploded views of the bobbin and the terminal according to another embodiment of this disclosure.
Figure 30:
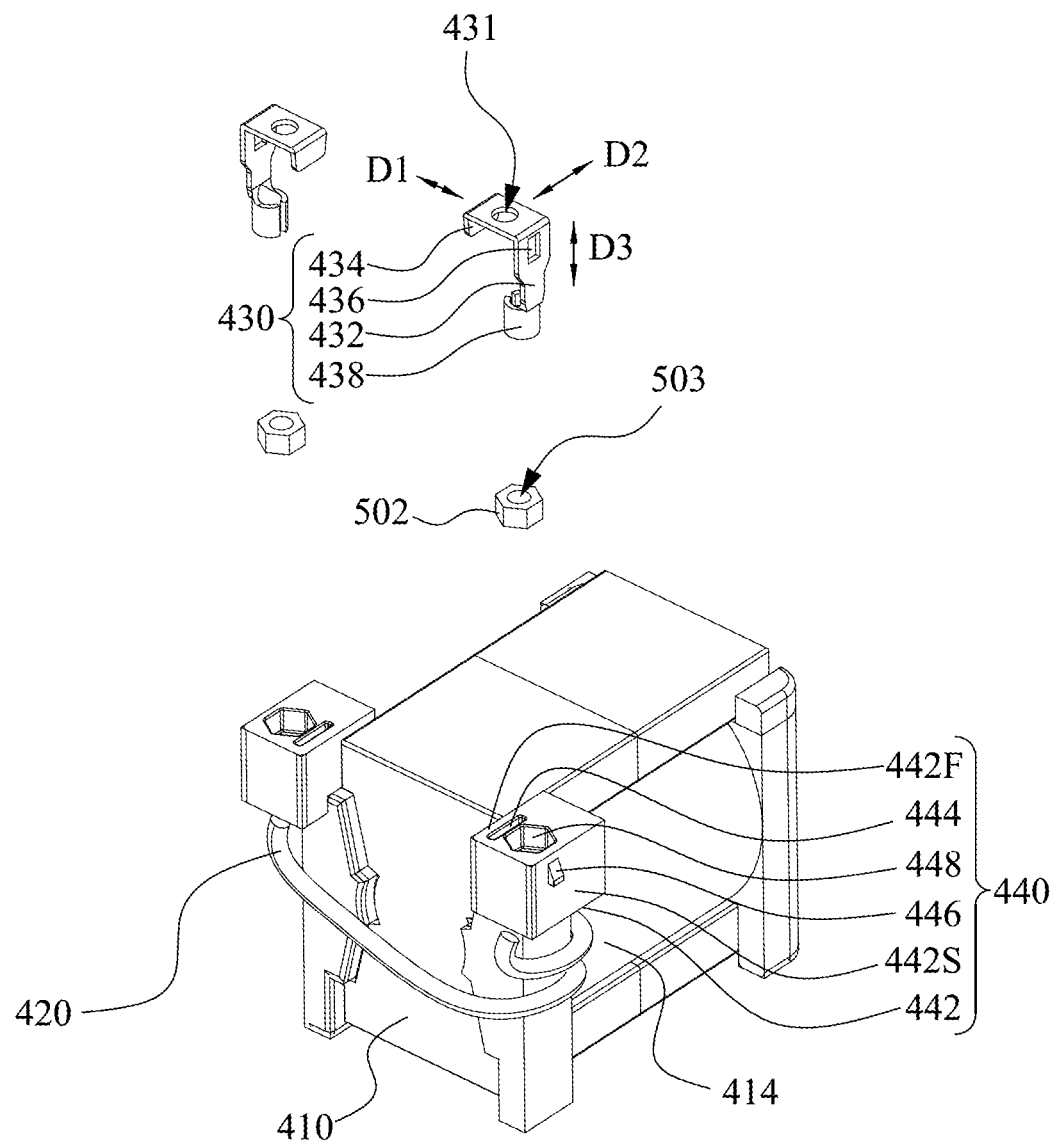

Though the second surface 442S is a specific side surface connected to the first surface 442F in FIG. 28, people having ordinary skill in the art can make proper modification according to their actual application. FIG. 29 to FIG. 30 are exploded views of the bobbin 440 and the terminal 430 according to another embodiment of this disclosure. As shown in FIG. 29 and FIG. 30, the second surface 442S is another side surface connected to the first surface 442F. The key point is that the terminal 430 can be coupled with the bobbin 440.

As shown in FIG. 10 and FIG. 15, the heat-dissipating component 710 is disposed on the heat-dissipating base 200. The elastic clip 720 is partially mounted on the heat-dissipating component 710. Each of the switching elements 730 includes a heating body 731 and pin feet 732. The pin feet 732 are electrically connected to the first printed wiring board assembly 600, and the heating body 731 is clamped between the heat-dissipating component 710 and the elastic clip 720.

In the above deposition configuration, the heat-dissipating component 710 and the switching element 730 tightly contact each other through the elastic clip 720. Therefore, No matter how the switching element 730 is disposed, the failure risk of the switching element 730 due to overheating can be reduced, and the lifetime of the switching element 730 can be increased.

As shown in FIG. 10 and FIG. 11, the three-dimensional structure 230 is disposed on the heat-dissipating base 200 and may be separated from the heat-dissipating component 710. Because the first electromagnetic induction module 400 generates a lot of heat when operating, the heat generated by the first electromagnetic induction module 400 may be dissipated to the heat-dissipating case 200 by the three-dimensional structure 230. At this time, because the heat-dissipating component 710 is separated from the three-dimensional structure 230, the heat generated by the first electromagnetic module 400 can be prevented from directly transferring to the heat-dissipating component 710, thus avoiding affecting the heat-dissipating efficiency of the heat-dissipating component 710 for the switching element 730.

Specifically, the first surface 691 of the first printed wiring board assembly 600 faces the three-dimensional structure 230. The switching elements 730 are uprightly disposed on the first surface 691 of the first printed wiring board assembly 600. Because the switching elements 730 are respectively uprightly disposed on the first printed wiring board assembly 600 and are respectively tightly clamped between the heat-dissipating component 710 and the elastic clip 720, such that areas on the first printed wiring board assembly 600 occupied by the switching elements 730 become smaller to reduce the volume of the electronic device 100, and heat may be effectively dissipated due to a high thermal conductivity of the heat-dissipating component 710.

Additionally, each of the heating bodies 731 is clamped between the heat-dissipating component 710 and the elastic clip 720. Each of the pin feet 732 is disposed between the heating body 731 and the first printed wiring board assembly 600, and is electrically connected to the first printed wiring board assembly 600 and the heating body 731. An appropriate distance A is maintained between the heating body 731 and the first printed wiring board assembly 600, and the heating body 731 is spaced apart from the first printed wiring board assembly 600 at the distance A.

Figure 31:
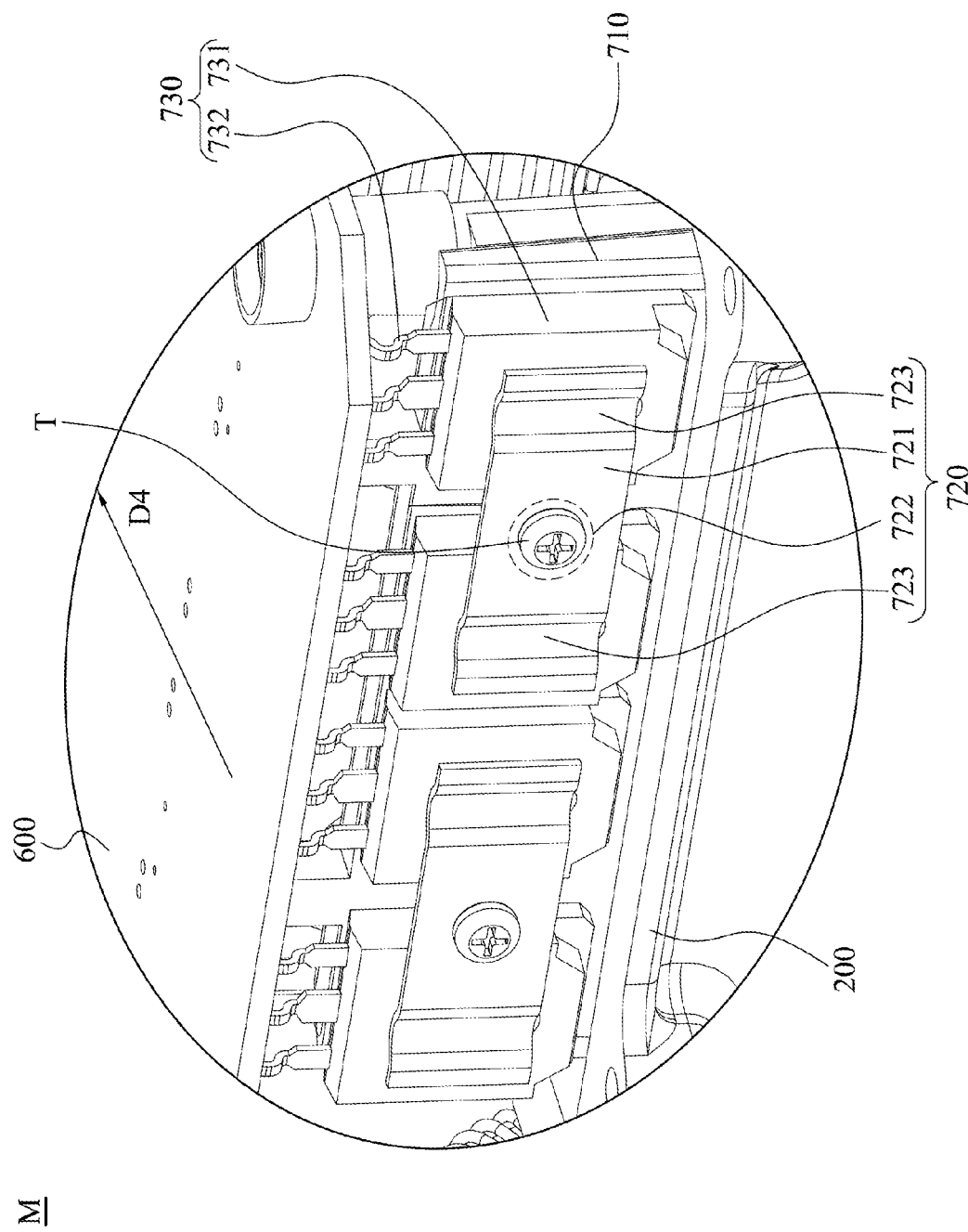
FIG. 31 is a partially enlarged view of an area M of FIG. 10.

FIG. 31 is a partially enlarged view of an area M of FIG. 10. As shown in FIG. 31, in the embodiment, the elastic clip 720 includes a main body 721, a fixing portion 722 and a pressing portion 723. The fixing portion 722 is located on a portion of the main body 721, and is mounted on the heat-dissipating component 710 by fixing components such as screws T. The pressing portion 723 is located on another portion of the main body 721 and presses the switching elements 730 to contact the heat-dissipating component 710. The main body 721 may be a stripe, and the elastic clip 720 may include two pressing portions 723. The two pressing portions 723 are disposed on two opposite ends of the main body 721. Each of the two pressing portions 723 is convex. The fixing portion 722 is located between the two pressing portions 723 and is fixed to the heat-dissipating component 710 by the screws T disposed in a gap between any two adjacent heating bodies 731.

Therefore, the fixing portion 722 is fixed to the heat-dissipating component 710 in a direction from the elastic clip 720 to the heat-dissipating component 710 by the screws T, and the main body 721 of the elastic clip 720 is forced to respectively push the two pressing portions 723 in a direction D4 toward the heat-dissipating component 710, such that a surface of the heating body 731 tightly contacts a surface of the heat-dissipating component 710, thereby generating sufficient contact pressure on a contact surface between the main body 721 and the heat-dissipating component 710, and meanwhile eliminating the gap between the heating body 731 and the heat-dissipating 710, thus lowering an interfacial thermal resistance between the main body 721 and the heat-dissipating component 710.

The disclosure does not intend to limit the materials of the heat-dissipating component and the elastic clip. However, when the materials of the heat-dissipating component and the elastic clip are conductive materials such as metals, the surfaces of the heat-dissipating component and the elastic clip are covered with thermal conductive isolation layers (not shown in Figures) so as to be electrically isolated from the switching elements.

As shown in FIG. 11, the accommodation space 201 accommodates the heat-dissipating component 710, the elastic clip 720, the three-dimensional structure 230, the first electromagnetic induction module 400, the first printed wiring board assembly 600, and the switching elements 730. The three-dimensional structure 230 is disposed on the bottom surface 211 and between the first printed wiring board assembly 600 and the bottom surface 211. The first printed wiring board assembly 600 is fixed to the first electromagnetic induction module 400 by fixing members such as the screws 501. The heat-dissipating component 710 faces an inner surface 291I of one of the side walls 291. In the embodiment, the heat-dissipating component 710 is a portion of the bottom surface 211 of the heat-dissipating case 200. An adequate distance is maintained between the heat-dissipating component 710 and an inner surface 291I of the one of the side walls 291 disposed on the bottom surface 211.

People having ordinary skill in the art can make proper modification on the heat-dissipating component and the heat-dissipating case according to their actual application. In other embodiments, the heat-dissipating component may be detachably mounted on the bottom surface of the heat-dissipating base.

In the embodiment, the elastic clip 720 is closer to the side wall 291 facing the heat-dissipating component 710 than the heat-dissipating component 710. An outer surface 291O of the side wall 291 is a portion of the outer surface of the electronic device 100. A height H5 of the side wall 291, i.e., a minimum distance between a top surface of the side wall 291 away from the bottom surface 211 and the bottom surface 211, is smaller than a height H6, i.e., a minimum distance between the fixing portion 722 and the bottom surface 211. In other words, as shown in FIG. 10 and FIG. 11, after the first printed wiring board assembly 600 is assembled on the heat-dissipating case 200, the side wall 291 of the heat-dissipating case 200 is not too high and thus does not block the fixing portion 722 of the elastic clip 720. For example, a height of the side wall 291 on the left side is smaller from the one end of the side wall 291 to the other end of the side wall 291, such that a height H7 of the side wall 291 is reduced to a height H8, and the fixing portion 722 of elastic clip 720 is exposed from a portion of the side wall 291 with a smaller height.

Therefore, in the embodiment, because the elastic clip 720 is closer to the inner surface 291I of the side wall 291 facing the heat-dissipating component 710 than the heat-dissipating component 710, and because the fixing portion 722 of elastic clip 720 is exposed from the portion of the side wall 291 with a smaller height, the elastic clip 720 can be easily fixed to the heat-dissipating component 710 by assembly workers from a position near the portion of the side wall 291 with a smaller height, and the elastic clip 720 may be fixed to the heat-dissipating component 710 after the first printed wiring board assembly 600 covers the first electromagnetic induction module 400. Therefore, the assembling time becomes shorter, and the assembling process becomes more flexible, and no other additional special fixing tools are needed, thus reducing the assembling time and cost.

Figure 32:
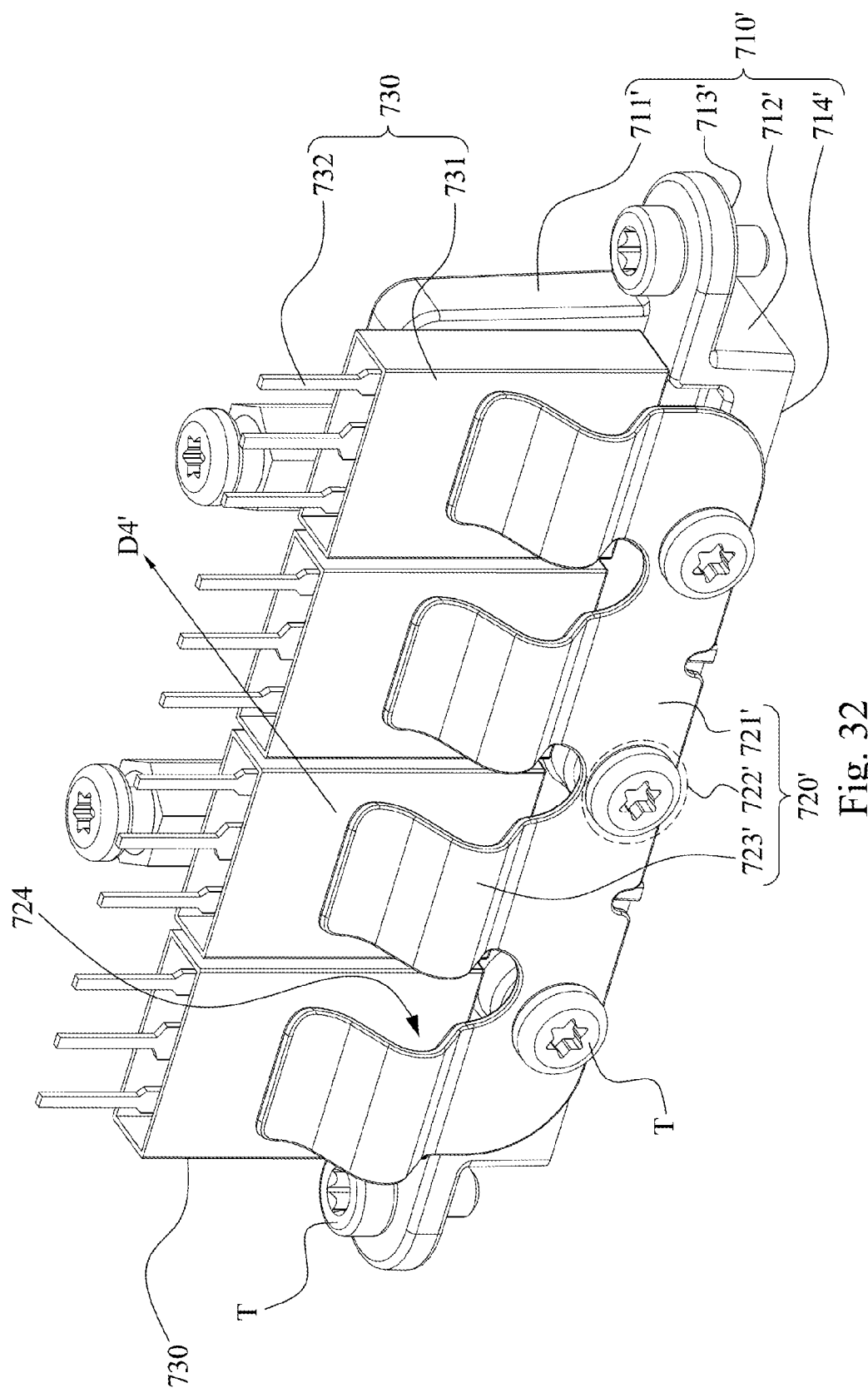
FIG. 32 is an assembled view of an elastic clip and a heat-dissipating component according to another embodiment of this disclosure.

FIG. 32 is an assembled view of an elastic clip 720' and a heat-dissipating component 710' according to another embodiment of this disclosure. As shown in FIG. 32, the elastic clip 720' and the heat-dissipating component 710' of the embodiment is similar to the elastic clip 720 and the heat-dissipating component 710 of the aforementioned embodiment, and the only difference is that the appearances of the elastic clip 720' and the heat-dissipating component 710' of the embodiment are different from the appearances of the elastic clip 720 and the heat-dissipating component 710 of the embodiment. Specifically, the heat-dissipating component 710' is an independent object, and the heat-dissipating component 710' is detachably mounted on the heat-dissipating base 200. The heat-dissipating component 710' includes a heat-dissipating block 711' and a base 712'.

The heat-dissipating block 711' partially contacts the switching element 730. The base 712' is connected to the heat-dissipating base 200. For example, the base 712' is a strip. One side of the base 712' is connected to the heat-dissipating block 711', and two opposite ends of the base 712' are fixed to the heat-dissipating base 200 (the bottom surface 211 of FIG. 11, for example) through screws T. Though there is no printed wiring board in FIG. 32, it only means that the switching element 730 is not mounted on the printed wiring board yet, and it does not mean that the switching element 730 does not need to be mounted on the printed wiring board. The heat-dissipating component 710' may be assembled with the heat-dissipating base 200 before or after contacting the switching element 730.

Therefore, the deposition position of heat-dissipating component 710' may be adjusted according to the deposition position of the switching element 730. Then, as long as the heat-dissipating component 710' is fixed to the heat-dissipating base 200, the heat-dissipating component 710' provides the switching element 730 with an appropriate heat-dissipating path.

Figure 33:
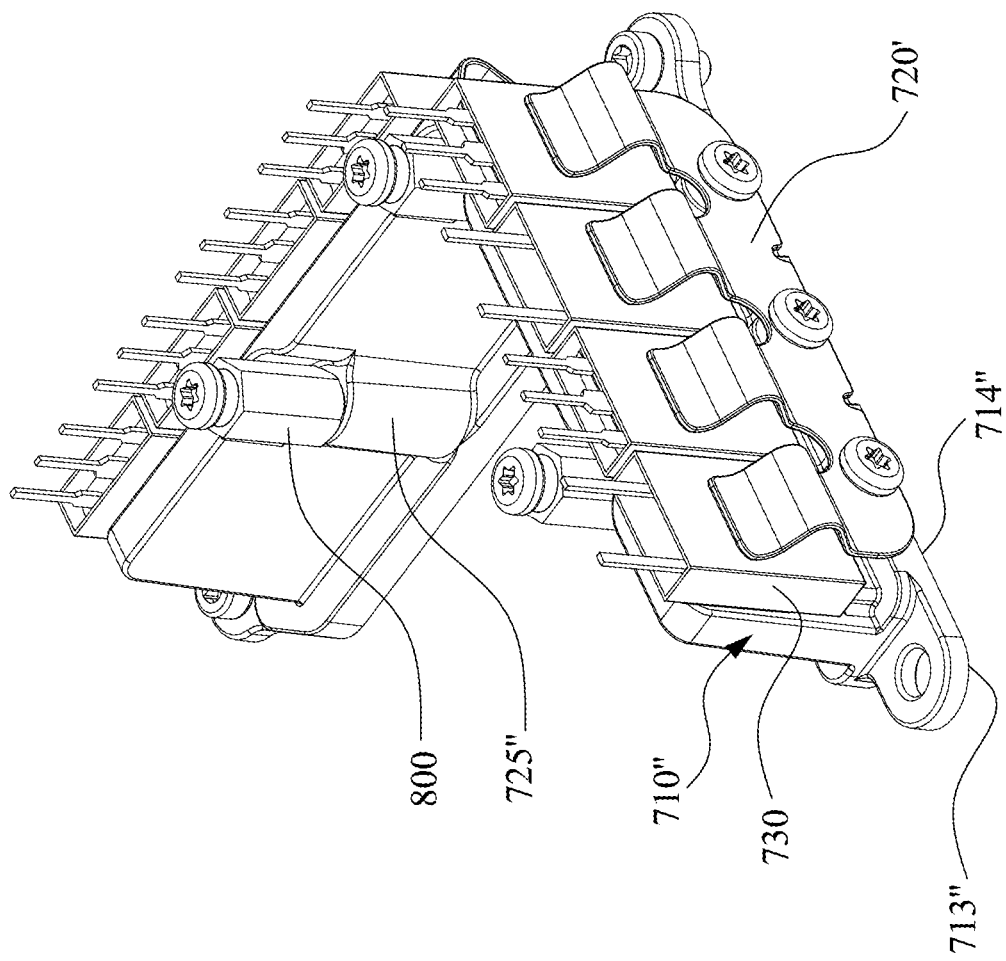
FIG. 33 is an assembled view of an insulated strut, the elastic clip, and the heat-dissipating component according to one embodiment of this disclosure.

As shown in FIG. 32, the heat-dissipating component 710' has a bottom surface 714', and the bottom surface 714' thermally contacts the heat-dissipating base 200 (or the first protrusion top surface 221T). In additional, the heat-dissipating component 710' may further have a mechanical fastening surface 713'. The heat-dissipating component 710' is mounted on the first protrusion 221 (see FIG. 5) of the heat-dissipating base 200 through the mechanical fastening surface 713', and the mechanical fastening surface 713' and the bottom surface 714' of the heat-dissipating component 710' are not coplanar. Therefore, the mechanical fastening surface 713' doesn't directly contact the heat-dissipating base 200. Embodiments of this disclosure are not limited thereto. FIG. 33 is an assembled view of an insulated strut 800, the elastic clip 720', and the heat-dissipating component 710" according to one embodiment of this disclosure. In other embodiments, for example, as shown in FIG. 33, the mechanical fastening surface 713" of the heat-dissipating component 710" and the bottom surface 714" of the heat-dissipating component 710" are coplanar, so the mechanical fastening surface 713" of the heat-dissipating component 710" directly contacts the heat-dissipating base 200.

As shown in FIG. 32, the heat-dissipating component 710' is I-shaped. Compared to the L-shaped heat-dissipating component 710" shown in FIG. 33, the heat-dissipating component 710' doesn't have alignment issue for the screws T due to an angle deviation of a bended portion of the heat-dissipating component, so the heat-dissipating component 710' can be easily assembled. Compared with the heat-dissipating component 710', the heat-dissipating component 710" needs less material to be manufactured, so the cost can be reduced. Therefore, the heat-dissipating component 710' or the heat-dissipating component 710" can be selected according to the actual application.

The method for assembling the heat-dissipating component and the heat-dissipating base can be the same as what is shown in FIG. 32 or FIG. 33. Embodiments of this disclosure are not limited thereto. People having ordinary skill in the art can choose any appropriate method to assemble the heat-dissipating component and the heat-dissipating base according to their actual application.

Additionally, as shown in FIG. 32, the elastic clip 720' includes a main body 721', three fixing portion 722' and a pressing portion 723'. For example, the main body 721' is a stripe. Three fixing portions 722' are disposed on the main body 721' at intervals, and the fixing portions 722' is fixed to the base 712' through the screws T, such that a clamping space 724 allowing the heating body 731 to be inserted therein is formed between the elastic clip 720' and the heat-dissipating block 711'. The three pressing portions 723' all extend outwardly from one side of the main body 721'. The number of the pressing portions 723' is the same as the number of the heating bodies 731, and the pressing portions 723' are respectively corresponding to the heating bodies 731. Each of the pressing portions 723' is hook-shaped, and one end of each of the pressing portions 723' presses the corresponding heating body 731.

By designing each of the pressing portions 723' to bend toward the heat-dissipating block 711', each of the pressing portion 723' are forced to press the heating body 731 toward the heat-dissipating component 710', such that one surface of the heating body 731 tightly contact one surface of the heat-dissipating block 711'. Therefore, adequate contact pressure on the contact surface of the heating body 731 and the heat-dissipating block 711' is generated, and a gap between the heating body 731 and the heat-dissipating block 711' is eliminated, such that an interfacial thermal resistance between the heating body 731 and the heat-dissipating block 711' is lowered.

The disclosure does not intend to limit the materials of the heat-dissipating component and the elastic clip. However, when the materials of the heat-dissipating component and the elastic clip are conductive materials such as metals, an isolation layer with a high thermal conductivity (not shown in Figures) covers surfaces of the heat-dissipating component and the elastic clip to electrically isolate switching elements.

FIG. 7B is a cross-sectional view of FIG. 7A. As shown in FIG. 7A and FIG. 7B, the second printed wiring board assembly 910 is disposed on the bottom surface 211 of the heat-dissipating base 200. The second printed wiring board assembly 910 and the three-dimensional structure 230 are disposed side by side, and the second printed wiring board assembly 910 is not disposed on the first electromagnetic induction module 400. The switching elements 911, such as the switching elements, are respectively flatly disposed on the heat-dissipating component 710". Embodiments of this disclosure are not limited thereto. In other embodiments, the switching element 911 is respectively flatly disposed on the second printed wiring board assembly 910.

In addition, each of the electronic components 911 includes a heating body 912 and pin feet 913. One end of each of the pin feet 913 is electrically connected to the second printed wiring board assembly 910, and the other end of each of the pin feet 913 supports the heating body 912 after bending. As shown in FIG. 7B, each of the heating bodies 912 is clamped between the heat-dissipating component 710" and the elastic clip 720.

The disclosure does not intend to limit the materials of the heat-dissipating component and the elastic clip. However, when the materials of the heat-dissipating component and the elastic clip are conductive materials such as metals, an isolation layer with a high thermal conductivity (not shown in Figures) covers surfaces of the heat-dissipating component and the elastic clip to electrically isolate switching elements 911.

Additionally, as shown in FIG. 7A and FIG. 7B, a side surface of the heat-dissipating component 710''' is connected to one of the side walls 291 of the heat-dissipating base 200, and the heat-dissipating component 710' is a portion of the bottom surface 211. The elastic clip 720 is mounted on the heat-dissipating component 710''' through the fixing component such as the screws T. Therefore, the heat-dissipating component 710''' dissipates heat to the heat-dissipating case 200 through two paths, and the heat-dissipating efficiency of the heat-dissipating component 710' is enhanced.

People having ordinary skill in the art can make proper modification on the heat-dissipating component and the heat-dissipating base according to their actual application. In other embodiments, the heat-dissipating component may be detachably mounted on the heat-dissipating base.

Figure 34:
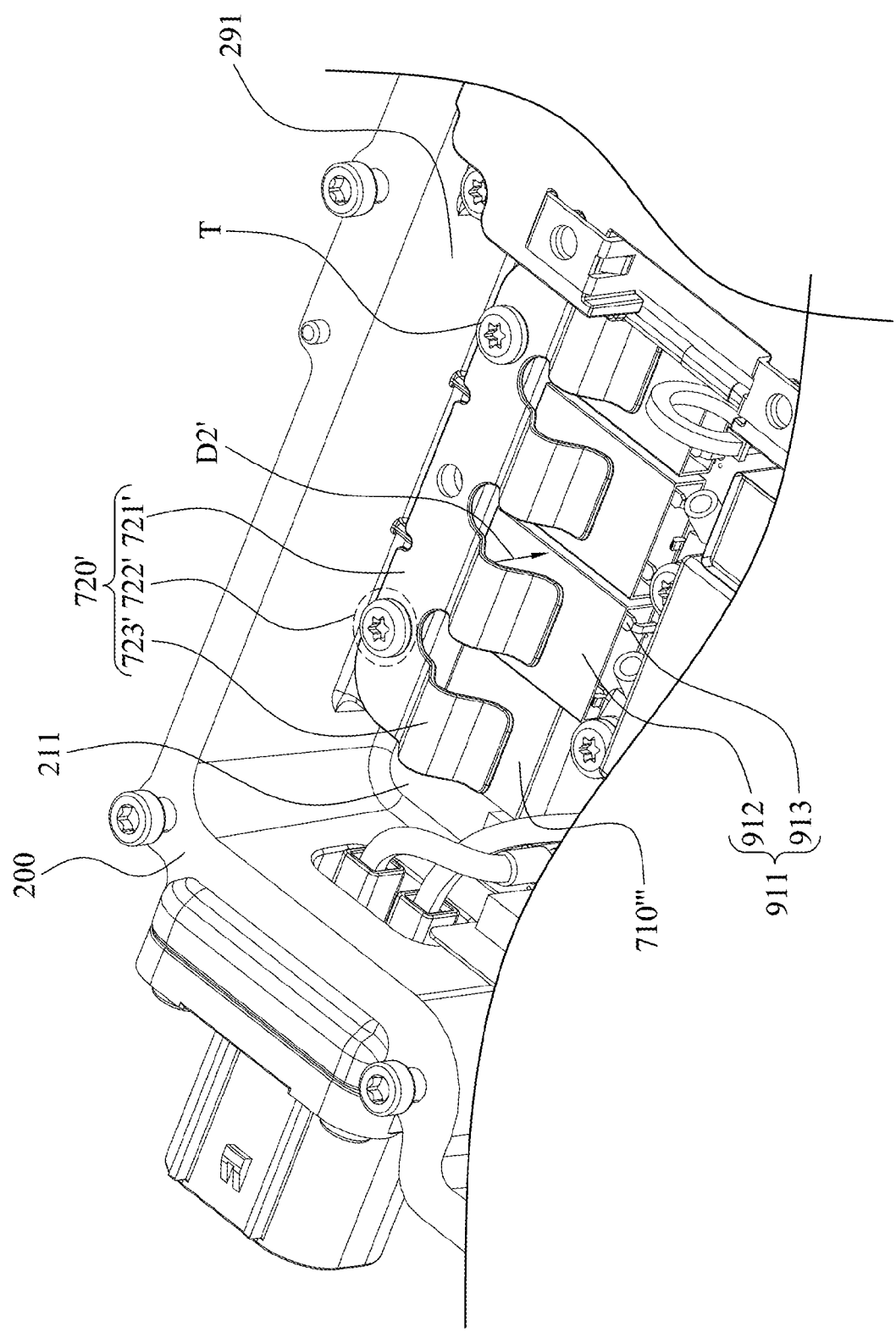
FIG. 34 is a top view of the heat-dissipating base according to another embodiment of this disclosure.

FIG. 34 is a top view of the heat-dissipating base 200 according to another embodiment of this disclosure. As shown in FIG. 34, the form of the elastic clip 720' is different from the elastic clip 720 of FIG. 7A.

As shown in FIG. 34, the heat-dissipating component 710''' is a heat-dissipating block which is a portion of the bottom surface 211 of the heat-dissipating base 200. For clearly illustrating the connection relation between the heat-dissipation component 710''' and the bottom surface 211 of the heat-dissipating base 200, one switching element 911 corresponding to the leftmost pressing portion 723' is omitted. The number of electronic components 912 shown in FIG. 8 is three, which does not mean the actual number of the electronic component 912. The elastic clip 720' includes a main body 721', two fixing portions 722', and pressing portions 723'. The main body 721' is a strip. The two fixing portions 722' are disposed on the main body 721' at intervals, and the fixing portions 722' are fixed to the heat-dissipating component 710' through the screws T. The pressing portions 723' all extend outwardly from one side of the main body 721'. A number of the pressing portions 723' is the same as a number of the heating bodies 912, and the pressing portions 723' respectively correspond to the heating bodies 912. Each of the pressing portions 723' is hook-shaped, and one end of each of the pressing portion 723' presses the corresponding heating body 912.

By designing each of the pressing portions 723' to bend toward the heat-dissipating component 710''', each of the pressing portion 723' presses the heating body 912 in a direction D2' toward the heat-dissipating component 710''', such that one surface of the heating body 912 tightly contact one surface of the heat-dissipating component 710'''. Therefore, a contact surface between the heating body 912 and the heat-dissipating component 710''' is increased, and a gap between the heating body 912 and the heat-dissipating component 710''' is eliminated. Because each of the surfaces with the maximum areas of the heating body 912 are aligned with each other, the surfaces at the same side of the heating body 912 contact the heat-dissipating component 710''', and a better heat-dissipating efficiency is provided.

Figure 35:
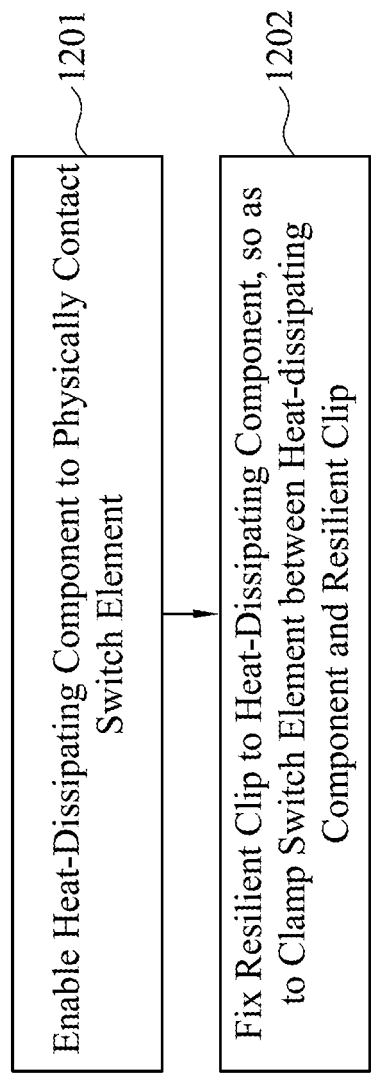
FIG. 35 is a flow chart of a method for assembling the electronic device according to one embodiment of this disclosure.

FIG. 35 is a flow chart of a method for assembling the electronic device according to one embodiment of this disclosure. As shown in FIG. 11 and FIG. 35, a method for assembling the electronic device 100 is provided. The method includes the following steps. Step 1201 is performed to enable the heat-dissipating component 710 to physically contact the switching element 730. Then, step 1202 is performed to fix the elastic clip 720 to the heat-dissipating component 710, so as to clamp the switching element 730 between the heat-dissipating component 710 and the elastic clip 720. Therefore, before or after welding the electronic component on the first printed wiring board assembly, the electronic component is fixed to the heat-dissipating component through the elastic clip, such that two opposite sides of the electronic component respectively tightly contact the elastic clip and the heat-dissipating component. Therefore, the assembling time becomes shorter, and the assembling process for the electronic component becomes more flexible.

Though the heat-dissipating component 710 is a portion of the heat-dissipating base 200 in the method, embodiments of this disclosure are not limited thereto. In other embodiments, such as the embodiment shown in FIG. 32, if the heat-dissipating component 710' is independent from the heat-dissipating base 200, a step of assembling the heat-dissipating component 710' to the heat-dissipating base 200 is performed before step 1201 or after step 1202.

Figure 36:
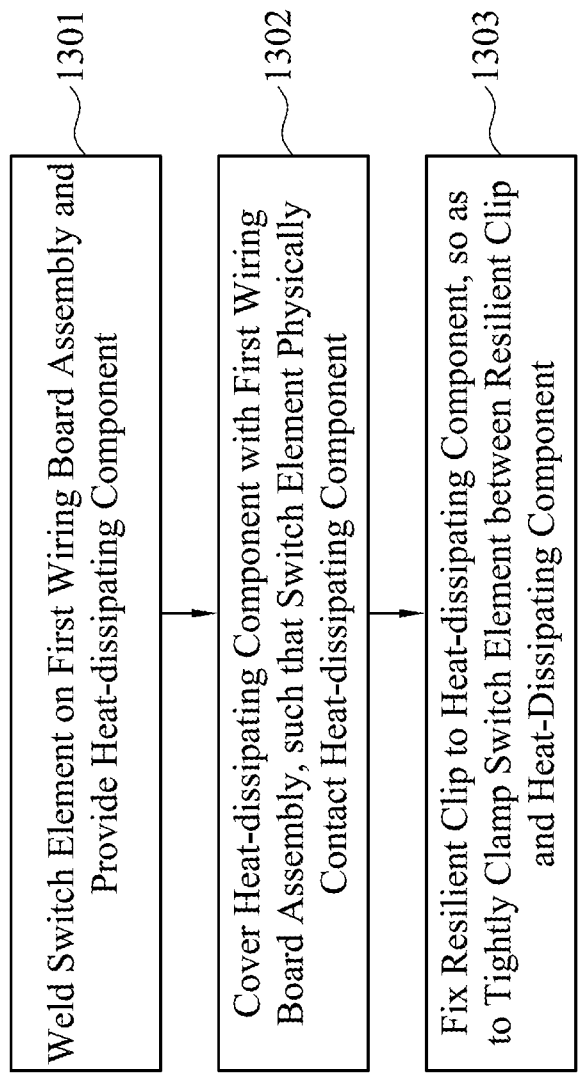
FIG. 36 is a flow chart of a method for assembling the electronic device in one sequence according to one embodiment of this disclosure.

FIG. 36 is a flow chart of a method for assembling the electronic device in one sequence according to one embodiment of this disclosure. FIG. 37A to FIG. 37D are diagrams of intermediate sequential stages showing the method of FIG. 36. As shown in FIG. 36 and FIGS. 37A to 37D, the sequence of steps of the embodiment is based on the configuration shown in FIG. 11, and the method for assembling the electronic device 100 including the following steps.

Step 1301 is performed to provide the heat-dissipating component 710 and the switching element 730. Step 1302 is performed to cover the heat-dissipating component 710 with the first printed wiring board assembly 600, such that the switching element 730 physically contacts the heat-dissipating component 710. Step 1303 is performed to fix the elastic clip 720 to the heat-dissipating component 710, so as to tightly clamp the switching element 730 between the elastic clip 720 and the heat-dissipating component 710.

Figure 37D:
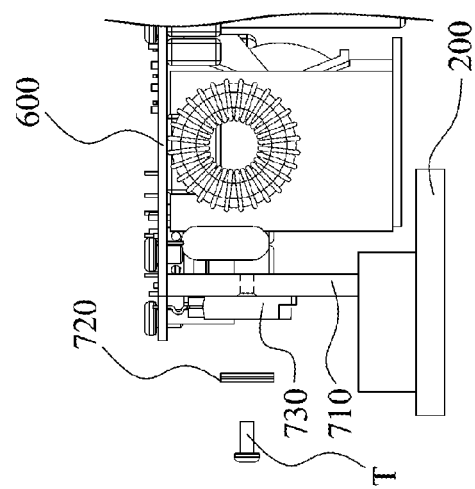
FIG. 37A to FIG. 37D are diagrams of intermediate sequential stages showing the method of FIG. 36.
Figure 37C:
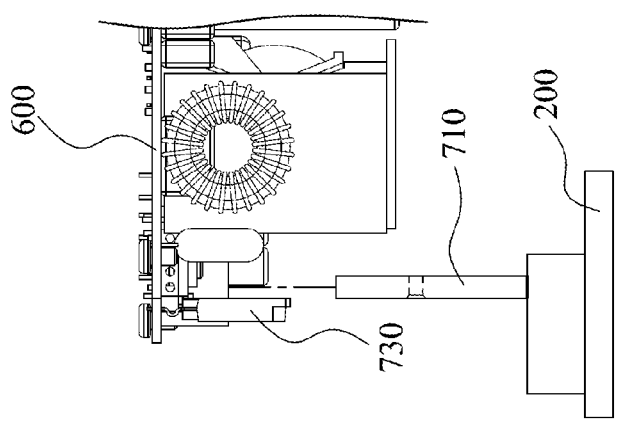
Figure 37B:
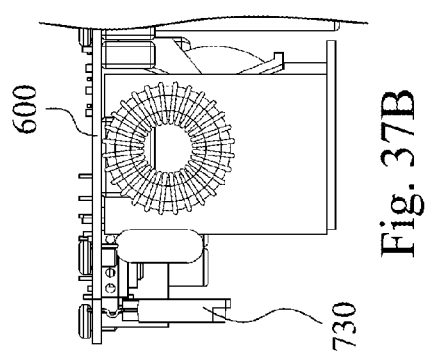
Figure 37A:
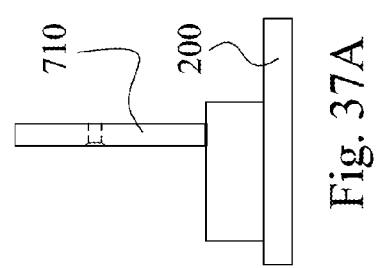

Specifically, in step 1301, the heat-dissipating component 710 is a portion of the heat-dissipating base 200 (see FIG. 37A), and the switching element 730 is welded on the first printed wiring board assembly 600 (see FIG. 37B). In the embodiment, the switching element 730 of FIG. 37B is uprightly welded on the first printed wiring board assembly 600. However, the switching element 730 may be flatly disposed on the first printed wiring board assembly 600. In step 1302, the first printed wiring board assembly 600 welded with the switching element 730 of FIG. 37C covers the heat-dissipating component 710, such that a surface of the heat-dissipating component 710 contacts a common mounting surface of the switching element 730. In step 1303, the elastic clip 720 physically contacts a surface away from the heat-dissipating component 710 of the switching element 730, and the elastic clip 720 presses the switching element 730 toward the heat-dissipating component 710 hard and fixes the switching element 730 to the heat-dissipating component 710.

Therefore, if the heat-dissipating component 710 and the switching element 730 are disposed on the side walls 291 of the heat-dissipating base 200 (see FIG. 11), the position in which the elastic clip 720 is fixed to the heat-dissipating component 710 (that is, fixing portion) is not blocked by the side wall 291 of the heat-dissipating base 200 (see FIG. 11) even after the first printed wiring board assembly 600 is assembled with the heat-dissipating base 200, and assembly workers may easily fix the elastic clip 720 to the heat-dissipating component 710 from outside. Therefore, no other additional special fixing tools are needed, and the assembling time and cost are reduced.

Though in this sequence, the heat-dissipating component 710 is a portion of the heat-dissipating base 200, embodiments of this disclosure are not limited thereto. In other embodiments, such as the embodiment shown in FIG. 32, if the heat-dissipating component 710' is independent from the heat-dissipating base 200, a step of assembling the heat-dissipating component 710' with the heat-dissipating base 200 is performed before the step 1302 or after the step 1303.

Figure 38:
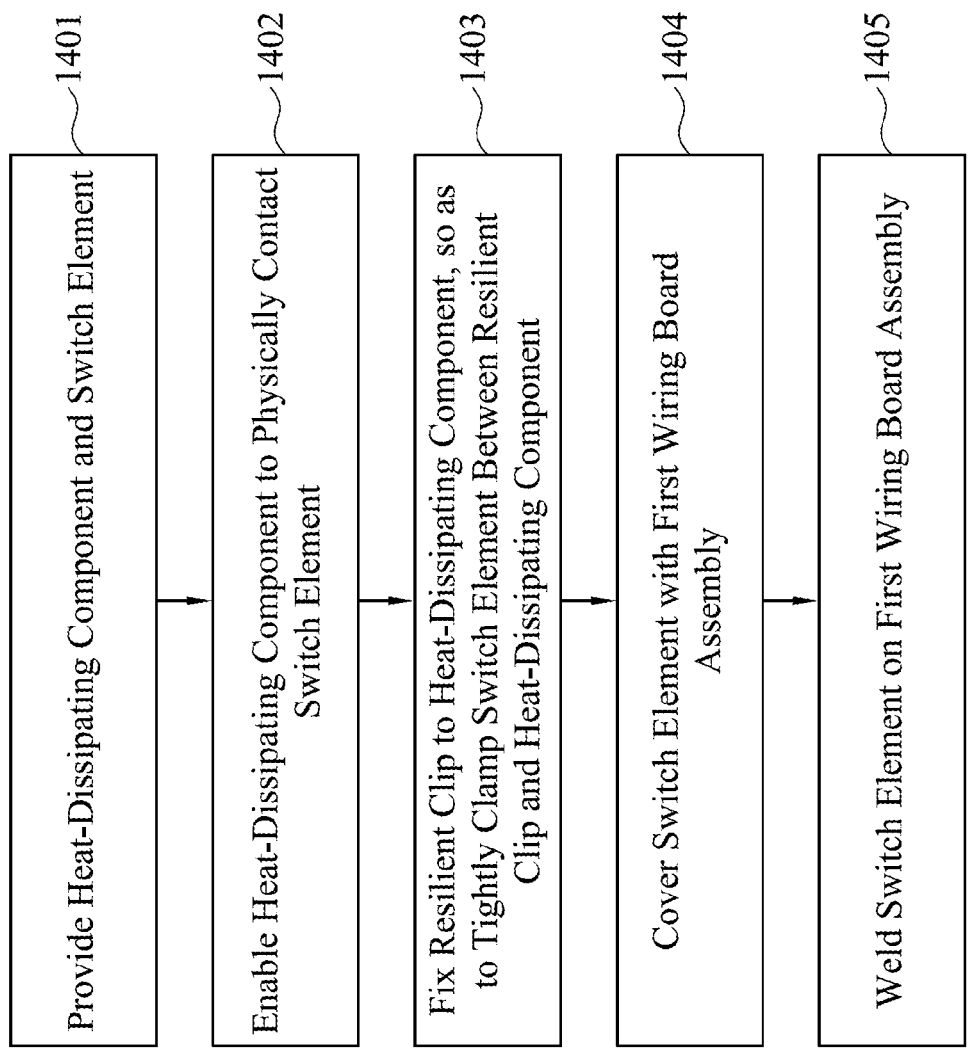
FIG. 38 is a flow chart of a method for assembling an electronic device in another sequence according to one embodiment of this disclosure.

FIG. 38 is a flow chart of a method for assembling an electronic device in another sequence according to one embodiment of this disclosure. FIGS. 39A to 39D are diagrams of intermediate sequential stages showing the method of FIG. 38. As shown in FIG. 38 and FIGS. 39A to 39D, the sequence of the embodiment is based on the configuration shown in FIG. 11, and the method for assembling the electronic device 100 includes the following steps.

Step 1401 is performed to provide the heat-dissipating component 710 and the switching element 730. Step 1402 is performed to enable the heat-dissipating component 710 to physically contact the switching element 730. Step 1403 is performed to fix the elastic clip 720 to the heat-dissipating component 710, so as to tightly clamp the switching element 730 between the elastic clip 720 and the heat-dissipating component 710. Step 1404 is performed to cover the switching element 730 with the first printed wiring board assembly 600. Step 1405 is performed to weld the switching element 730 on the first printed wiring board assembly 600.

Specifically, in step 1401, the heat-dissipating component 710 is a portion of the heat-dissipating base 200 (see FIG. 39A), and the switching element 730 is not mounted on the first printed wiring board assembly 600 yet (see FIG. 39B). In step 1402, the switching element 730 is not welded a surface of the heat-dissipating component 710 of FIG. 39B yet. In step 1403, the elastic clip 720 contacts a surface away from the heat-dissipating component 710 of the switching element 730 (see FIG. 39C), and the elastic clip 720 presses the switching element 730 toward the heat-dissipating component 710 hard and fixes the switching element 730 to the heat-dissipating component 710. In step 1404, the first printed wiring board assembly 600 covers the switching element 730 (see FIG. 39D), such that pin feet 732 of the switching element 730 are inserted in the first printed wiring board assembly 600, so as to perform the welding process in step 1405.

The switching element 730 is supported only by the pin feet 732. By welding the first printed wiring board assembly 600 to the switching element 730 after the heat-dissipating component 710 and the elastic clip 720 are assembled with the switching element 730, the entire structure of the switching element 730 is strengthened, and the risk that the pin feet 732 is deformed due to the inhomogeneous pressure is reduced.

Though in this sequence, the heat-dissipating component 710 is a portion of the heat-dissipating base 200, but embodiments of this disclosure are not limited thereto. In other embodiments, such as the embodiment shown in FIG. 32, if the heat-dissipating component 710' is independent from the heat-dissipating base 200, a step of assembling the heat-dissipating component 710' with the heat-dissipating base 200 is performed before step 1402 or after step 1403.

Figure 40:
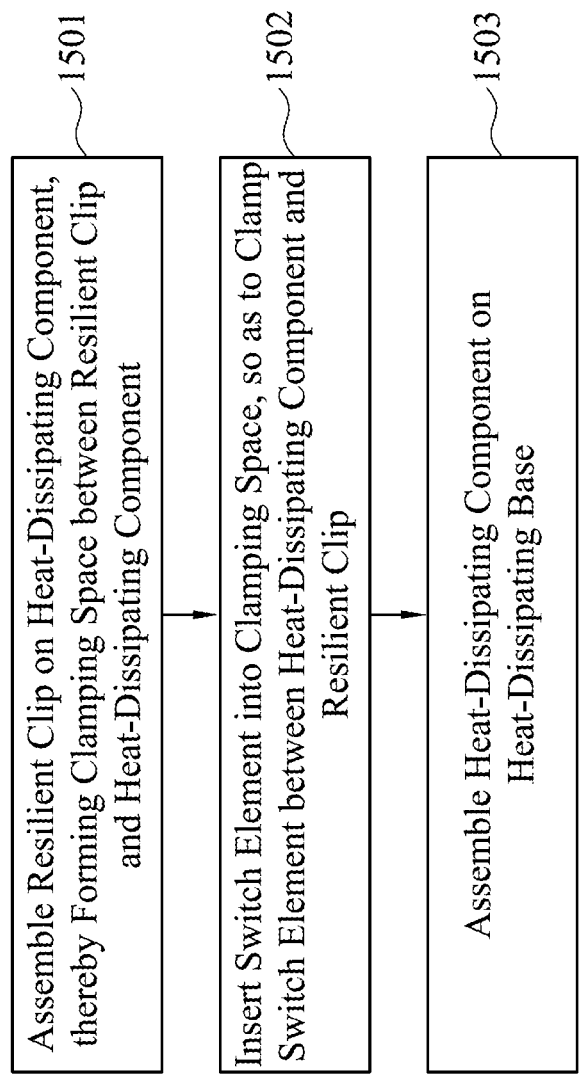
FIG. 40 is a flow chart of a method for assembling an electronic device according to another embodiment of this disclosure.
Figure 41C:
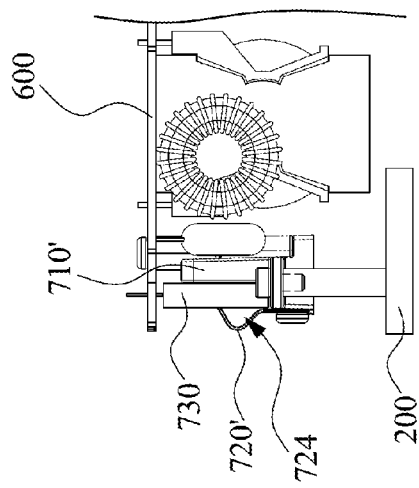
FIGS. 41A to 41C are diagrams of intermediate sequential stages showing the method of FIG. 40.
Figure 41B:
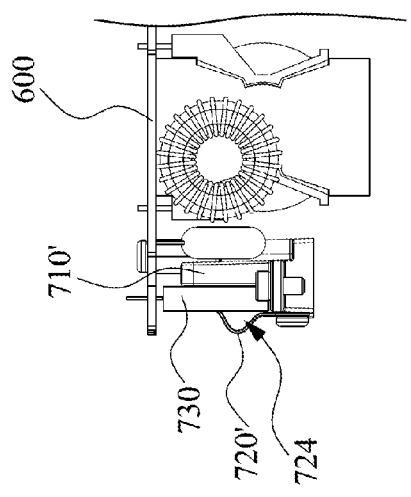
Figure 41A:
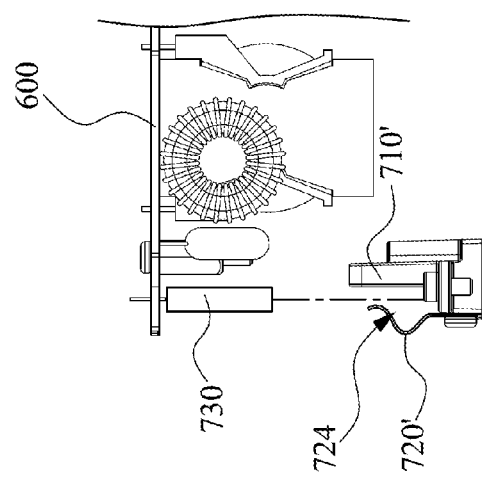

FIG. 40 is a flow chart of a method for assembling an electronic device according to another embodiment of this disclosure. FIGS. 41A to 41C are diagrams of intermediate sequential stages showing the method of FIG. 40. As shown in FIG. 40 and FIGS. 41A to 41C, the embodiment is based on the configuration shown in FIG. 32 or FIG. 33, and the description described herein is based on FIG. 32. The method for assembling the electronic device 100 includes the following steps.

Step 1501 is performed to assemble the elastic clip 720' on the heat-dissipating component 710', thereby forming a clamping space 724 between the elastic clip 720' and the heat-dissipating component 710' (see FIG. 41A). Then, step 1502 is performed to insert the switching element 730 into the clamping space 724, so as to clamp the switching element 730 between the heat-dissipating component 710' and the elastic clip 720' (see FIG. 41B), Then, step 1503 is performed to assemble the heat-dissipating component 710' on the heat-dissipating base 200 (see FIG. 41C). Therefore, after or before the electronic component is welded to the first printed wiring board assembly, by inserting the electronic component into the clamping space between the elastic clip and the heat-dissipating component, the assembling time becomes shorter, and the assembling process for the electronic component becomes more flexible.

Specifically, in steps 1501 and 1502, the elastic clip 720' and the heat-dissipating component 710' of FIG. 41A is moved toward the switching element 730, such that the switching element 730 is inserted in the clamping space 724 and the switching element 730 is clamped between the heat-dissipating component 710' and the elastic clip 720'. In step 1503, the step of assembling the heat-dissipating component 710' of FIG. 41C on the heat-dissipating base 200 is performed after the elastic clip 240 is assembled with the heat-dissipating component 710'.

As shown in FIG. 41A, before step 1502, the method includes welding the switching element 730 on the first printed wiring board assembly 600. The step of welding the switching element 730 to the first printed wiring board assembly 600 may be performed before or after step 1502.

The embodiment is not limited to the aforementioned description. Step 1503 of assembling the heat-dissipating component 710' to the heat-dissipating base 200 may be performed before step 1501.

Though the heat-dissipating component 710' is detachably mounted on the heat-dissipating base 200 in the present method, embodiments of this disclosure are not limited thereto. As shown in FIG. 11, if the heat-dissipating component 710 is a portion of the heat-dissipating base 200, step 1503 of assembling the heat-dissipating component to the heat-dissipating base does not need to be performed.

Because the heat-dissipating base includes a conductive block with a large area, the heat-dissipating base has a grounding effect and may be regarded as a grounding member. Because the heat-dissipating component made of conductive materials is connected to the heat-dissipating base, the heat-dissipating component and the heat-dissipating base have the same potential and both have the grounding function. In the practical application, the first printed wiring board assembly needs to be fixed to the heat-dissipating base or the heat-dissipating component, and there are high voltage devices disposed on the first printed wiring board assembly. Therefore, the first printed wiring board assembly needs to be insulated from the grounding member. An insulating device for fixing the first printed wiring board assembly and the grounding member is provided. That is, by using an insulating struts or a restricting member to fix the first printed wiring board assembly and the grounding member such as the heat-dissipating base or heat-dissipating component, the electronic insulation of the first printed wiring board assembly from the grounding member is achieved by the insulating struts or the collaboration of the insulating struts (or coupling portions), the restricting member, etc.

Figures 42A, 42B:
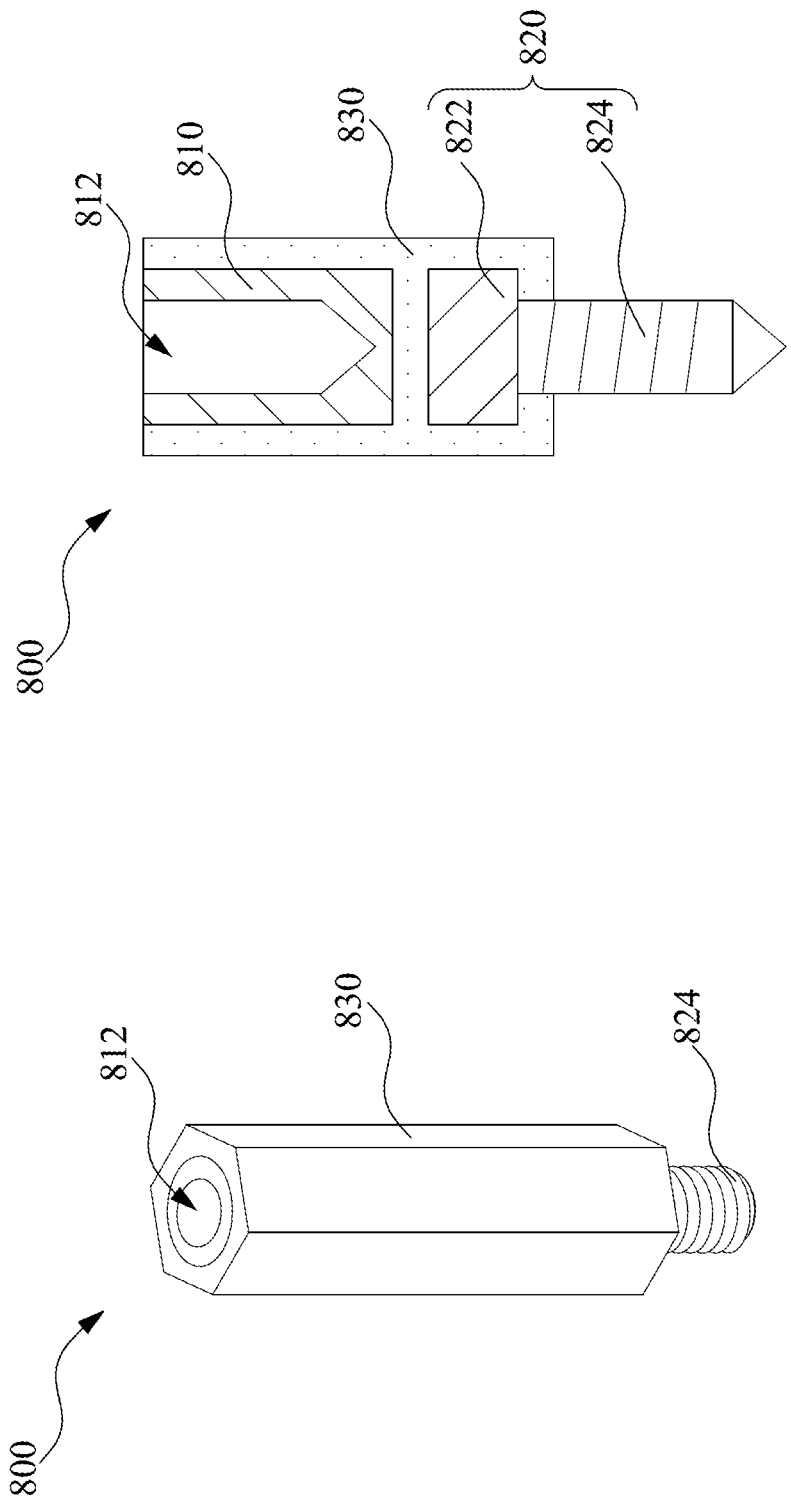
FIG. 42A and FIG. 42B are a 3-D view and a cross-sectional view of the insulated strut used by the electronic device according to another embodiment of this disclosure.

FIG. 42A and FIG. 42B are a 3-D view and a cross-sectional view of the insulated strut 800 used by the electronic device 100 according to another embodiment of this disclosure. As shown in FIG. 42A and FIG. 42B, an insulating strut 800 is provided. The insulating strut 800 includes a first connecting part 810, a second connecting part 820, and a plastic part 830 partially covering the first connecting part 810 and the second connecting part 820. The first connecting part 810 may be connected to the first printed wiring board assembly 600, and the second connecting part

820 may be connected to the heat-dissipating base 200. Therefore, the first printed wiring board assembly 600 is fixed to the heat-dissipating base 200 via the insulating strut 800.

Specifically, the first connecting part 810 may be a nut, and the second connecting part 820 may be a stud. The second connecting part 820 is fixed to the heat-dissipating base 200, and the first printed wiring board assembly 600 is fixed to the first connecting part 810 via a screw. The first connecting part 810 may be a blind-hole nut. The main body of the nut is substantially disposed in the plastic part 830, and only an upper surface of the nut is disposed outside the plastic part 830 to expose a threaded hole 812 in the nut. The second connecting part 820 is a stud, and a head 822 of the stud is disposed in the plastic part 830, and a threaded portion 824 of the stud is disposed outside the plastic part 830 so as to be fixed to a threaded hole on the heat-dissipating base 200.

In order to effectively electrically insulate the first printed wiring board assembly 600 from the heat-dissipating base 200, the first connecting part 810 and the second connecting part 820 are separated by the plastic part 830. That is, though the materials forming the first connecting part 810 and the second connecting part 820 are both metal, the outside air are separated by the plastic part 830 with an insulating material, such that the first connecting part 810 does not directly contact the second connecting part 820 and an adequate safe distance is maintained.

By using the insulating strut 800 as shown in FIG. 42A and FIG. 42B in the electronic device 100, not only is the first printed wiring board assembly 600 fixed to the heat-dissipating base 200, but also a short circuit due to an electrical connection between the first printed wiring board assembly 600 and the heat-dissipating base 200 is avoided. The detailed information is described in the following embodiments.

Figure 43:
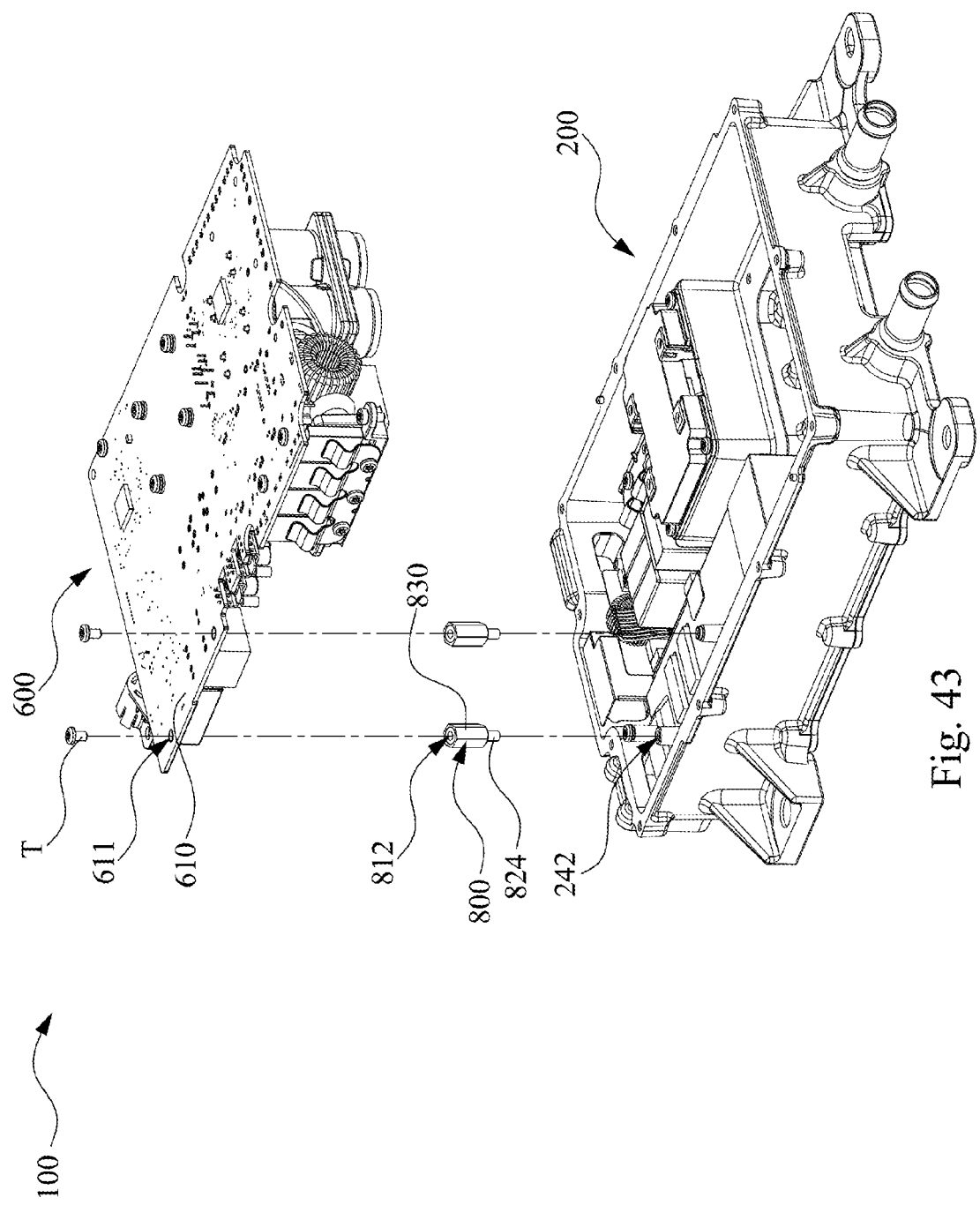
FIG. 43 is an exploded view of the electronic device according to one embodiment of this disclosure.

FIG. 43 is an exploded view of the electronic device 100 according to one embodiment of this disclosure. As shown in FIG. 43, the first printed wiring board assembly 600 is fixed to the heat-dissipating base 210 by using the insulating strut 800. In this embodiment, the heat-dissipating base 200 may be a liquid-cooled heat-dissipating unit.

As shown in FIG. 42B and FIG. 43, the heat-dissipating base 200 has a plurality of positioning threaded holes 242, and the first printed wiring board 610 has a plurality of through holes 611 corresponding to the insulating struts 800. The second connecting part 820 of the insulating strut 800 has a threaded portion 824 disposed outside the plastic part 830. The threaded portion 824 is fixed to the positioning threaded holes 242 to fix the insulating strut 800.

The first connecting part 810 of the insulating strut 800 has a threaded hole 812 disposed outside the plastic part 830. After passing through the through holes 611 of the first printed wiring board 610, the screws T are fixed in the threaded holes 812 of the insulating struts 800. Therefore, the first printed wiring board assembly 600 is fixed to the heat-dissipating base 200.

The insulating strut 800 is used to fix the first printed wiring board assembly 600 and the heat-dissipating base 200 and to maintain the insulation between the first printed wiring board 610 and the heat-dissipating base 200. In the insulating strut 800, the first connecting part 810 and the second connecting part 820 do not physically contact each other and are electrically insulated by the plastic part 830, and thus, even when the electronic component such as the first electronic component 620 of the first printed wiring board assembly 600 is electrically connected to the screws T connected to the first connecting part 810, the electronic component is not electrically connected to the heat-dissipating base 200 as the grounding member, so as to avoid a short circuit.

Figure 44:
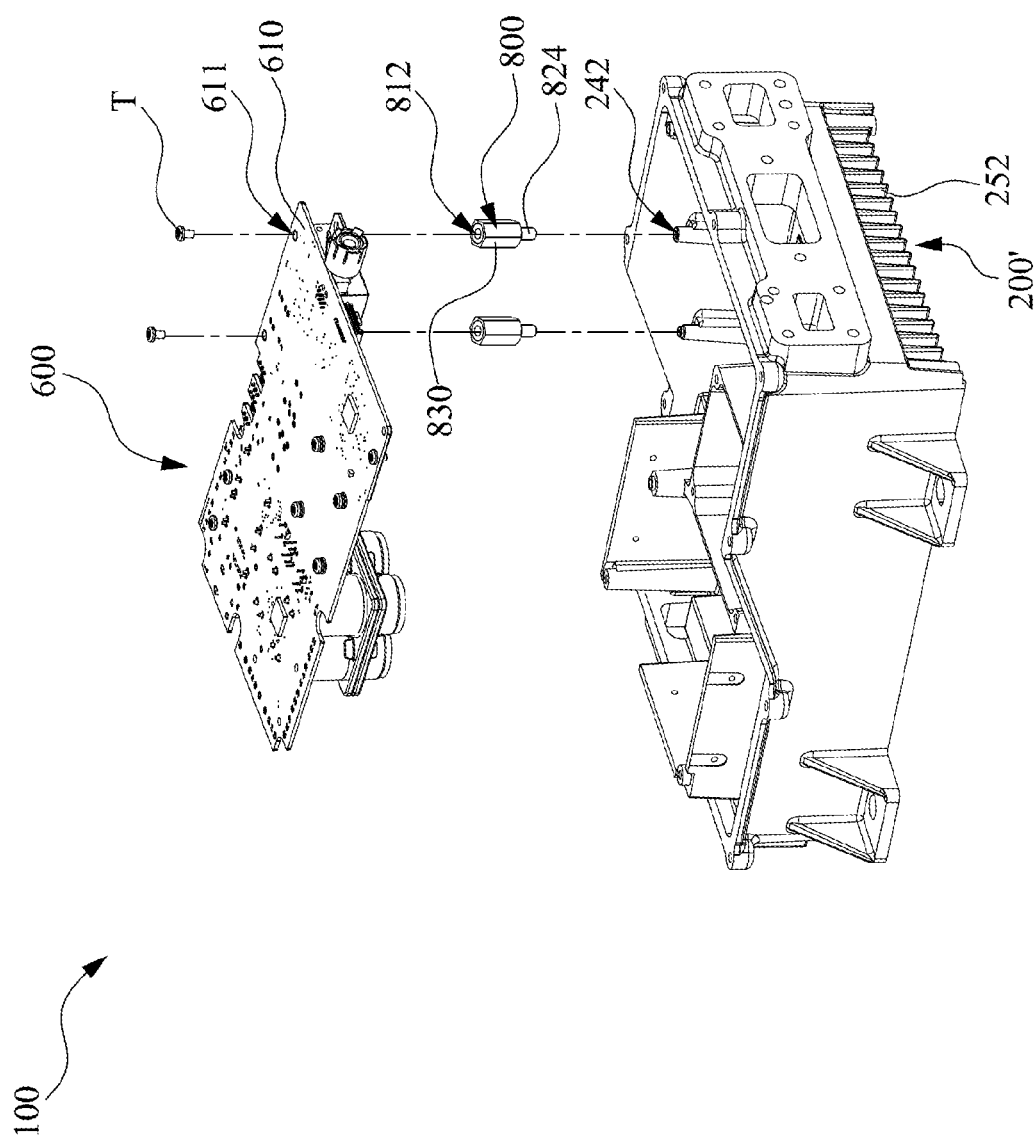
FIG. 44 is an exploded view of the electronic device according to another embodiment of this disclosure.

FIG. 44 is an exploded view of the electronic device 100 according to another embodiment of this disclosure. As shown in FIG. 44, the electronic device 100 includes a heat-dissipating base 200', the first printed wiring board assembly 600, and the insulating strut 800 to fix and electrically insulate the heat-dissipating base 200' and the first printed wiring board assembly 600. The difference between the embodiment and the aforementioned embodiment is that the heat-dissipating base 200' is an air-cooled heat-dissipating unit, and the heat-dissipating base 200' includes positioning threaded holes 242 and a fin 252 to dissipate heat to the ambient air. After the heat generated by the electronic component is transferred to the heat-dissipating base 200', the heat is dissipated by the fin 252. The electronic device 100 optionally includes a cooling fan. The cooling fan drives an air flow to pass through the fin 252 to carry away the heat in the fin 252.

As shown in FIG. 42B and FIG. 44, the second connecting part 820 of the insulating strut 800 is fixed to the positioning threaded hole 242 in heat-dissipating base 200', and then the screw T passes through the through hole 611 in the first printed wiring board 610 and is fixed to the first connecting part 810, such that the first printed wiring board assembly 600 is fixed to and electrically insulated from the heat-dissipating base 200' and the spacing between the two are maintained.

As shown in FIG. 33, the insulating strut 800 may fix the first printed wiring board assembly 600 not only to the heat-dissipating base 200 but also to the heat-dissipating component 710".

Figure 45:
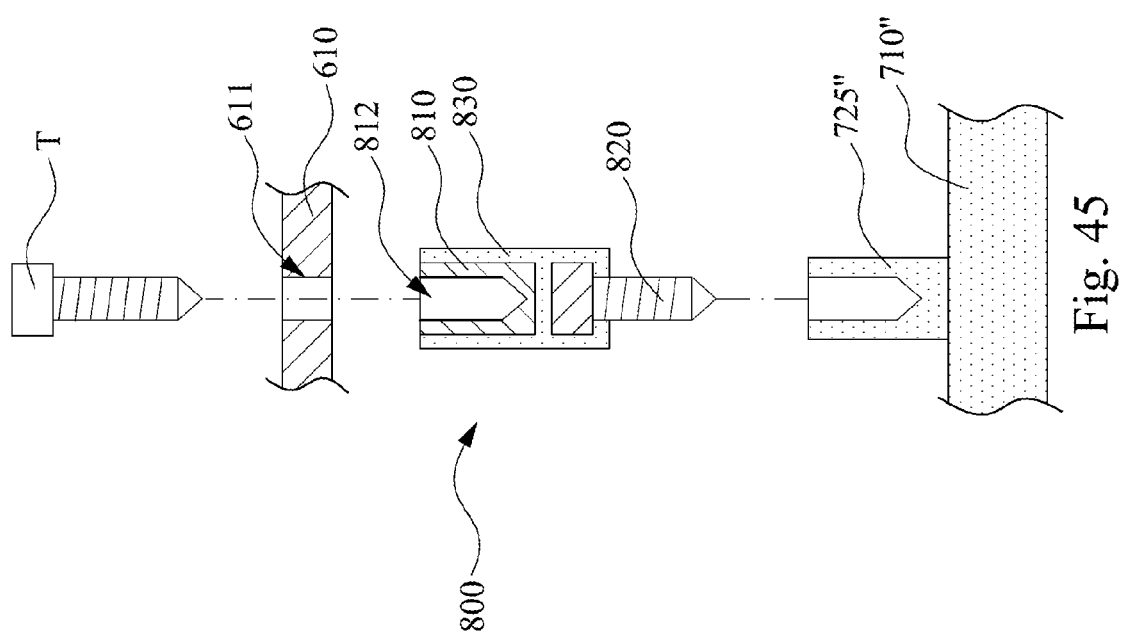
FIG. 45 is a schematic exploded view of FIG. 33 when the insulated strut is assembled.

FIG. 45 is a schematic exploded view of FIG. 33 when the insulated strut 800 is assembled. Specifically, as shown in FIG. 33 and FIG. 45, As shown in FIG. 4 and FIG. 5, the heat-dissipating component 710" has a fixing portion 725". The second connecting part 820 is fixed to the fixing portion 725" of the heat-dissipating component 710", and then the screw T passes through the through hole 611 on the first printed wiring board 610 to be fixed on the first connecting part 810 of the insulating strut 800.

Though in the insulating strut 800 of the aforementioned embodiments, the first connecting part 810 is a nut and the second connecting part 820 is a stud, people having ordinary skill in the art can make proper modification on the first connecting part 810 and the second connecting part 820 according to actual application. For example, the first connecting part 810 may be a stud, and the second connecting part 820 may be a nut. Or, the first connecting part 810 and the second connecting part 820 may both be studs or nuts. The first connecting part 810 and the second connecting part 820 may be integrally formed with the plastic part 830 by insert molding. The material of the plastic part 830 may be any insulating high polymers used in insert molding.

Figure 46:
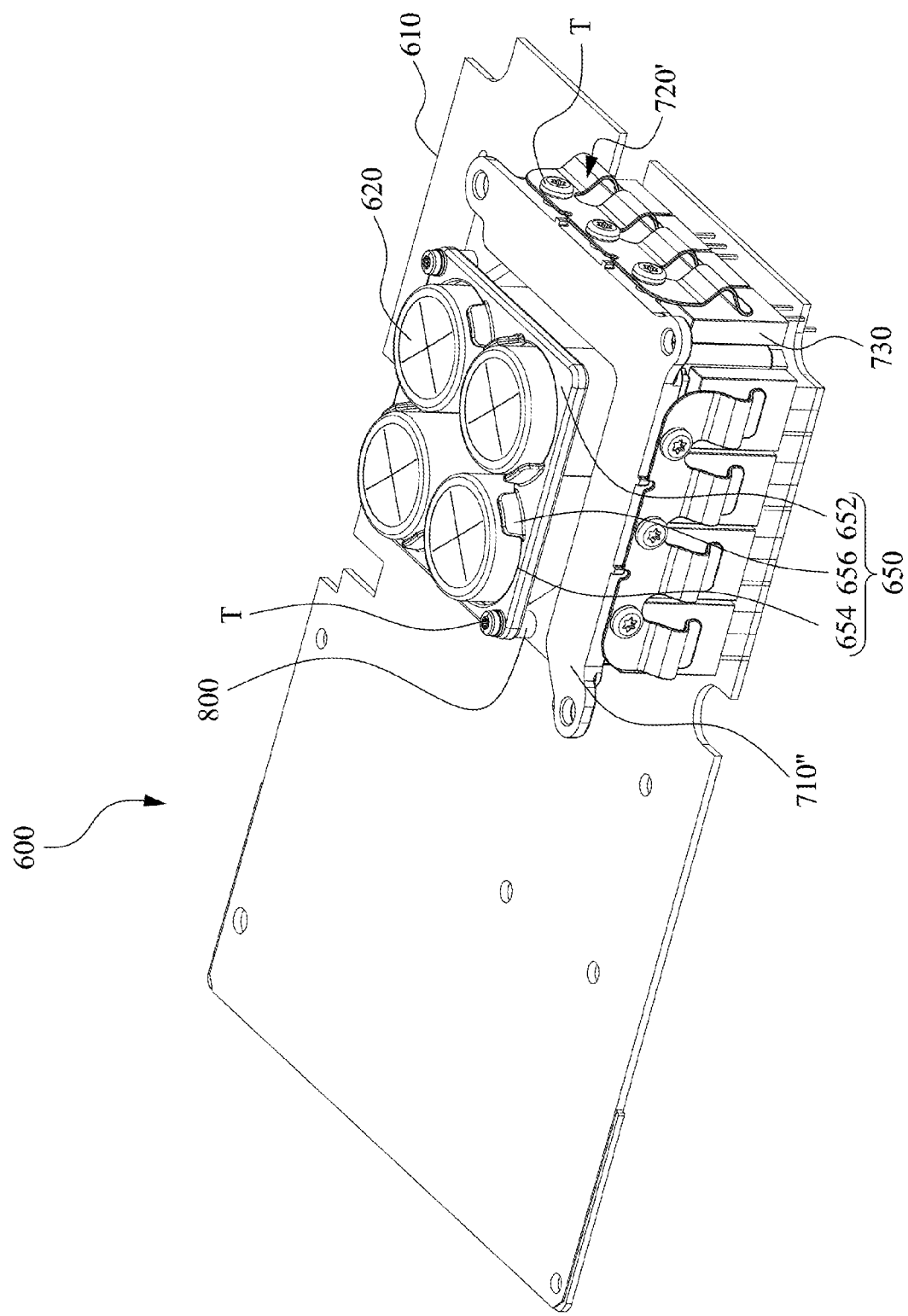
FIG. 46 is a 3-D view of the first printed wiring board assembly according to another embodiment of this disclosure.
Figure 47:
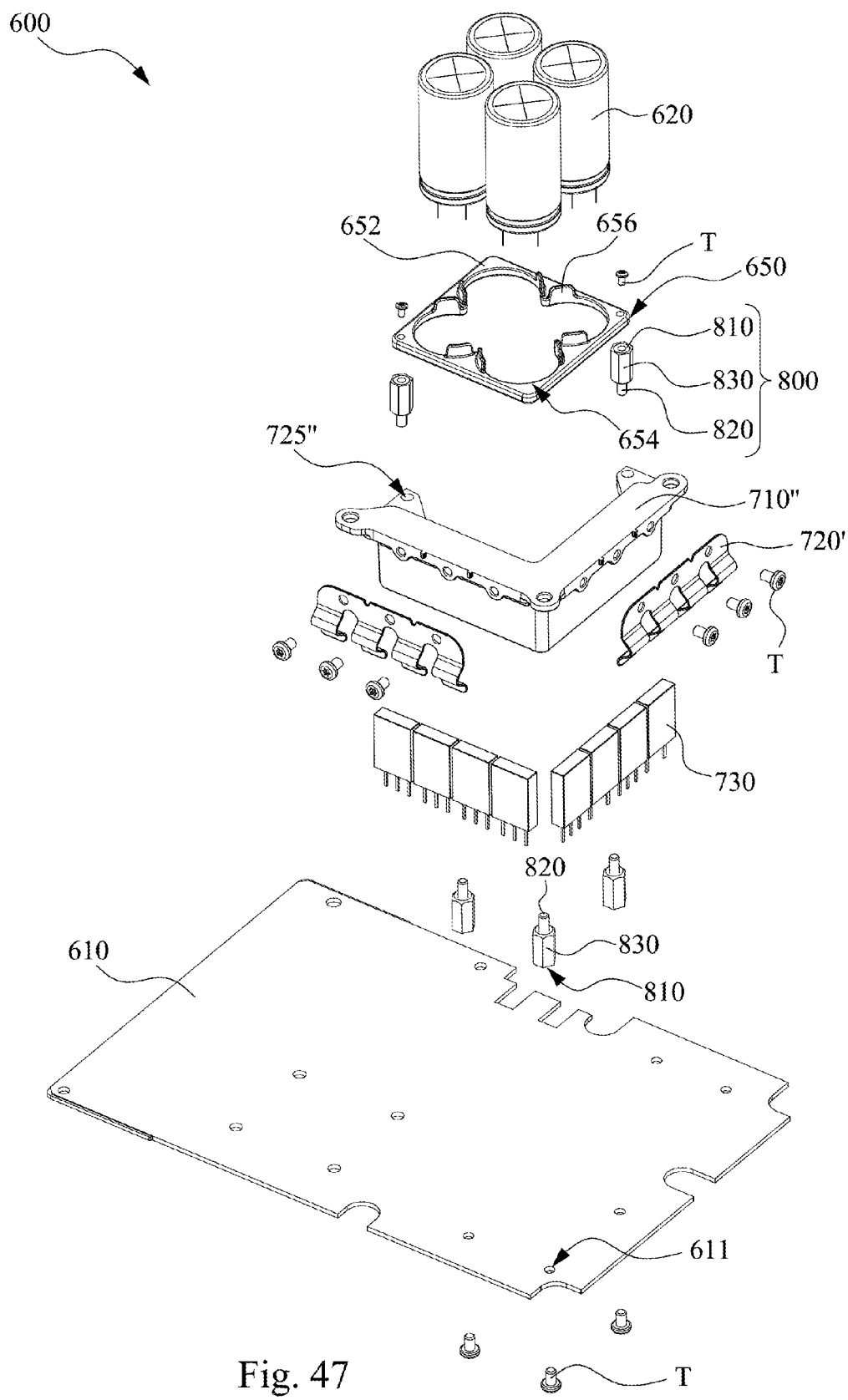
FIG. 47 is an exploded view of the first printed wiring board assembly according to another embodiment of this disclosure.

FIG. 46 is a 3-D view of the first printed wiring board assembly 600 according to another embodiment of this disclosure. FIG. 47 is an exploded view of the first printed wiring board assembly 600 according to another embodiment of this disclosure. As shown in FIG. 46 and FIG. 47, the first printed wiring board assembly 600 further includes the restricting member 650 fixing the first electronic component 620. Because the first printed wiring board assembly 600 is applied in a vehicle power conversion device, the first printed wiring board assembly 600 is often subject to large shocks or vibrations, such that the fracture of the pin feet of the first electronic components 620 happens easily due to external forces. Therefore, the restricting member 650 is needed to strengthen the connection between the first electronic component 620 and the first printed wiring board 610.

For example, the first electronic components 620 may be capacitors, and the first electronic components 620 are fixed to the restricting member 650 in a group of four. The restricting member 650 has a main body 652 and an opening 654 disposed in the main body 652. The shape of the opening 654 corresponds to the fixed first electronic component 620, such as a petal shape corresponding to the first electronic components 620 in the group of four. The first electronic components 620 are disposed in the opening 654, and the first electronic component 620 may keep in contact with the main body 652.

The restriction member 650 further includes a plurality of baffles 656. The baffles 656 are uprightly disposed on the main body 652 and on an outer edge of the opening 654. The baffles 656 may be integrally formed with the main body 652. For example, the material forming the restricting member 650 may be metal, and the restricting member 650 with the opening 654 and the baffles 656 may be obtained by stamping a metal sheet. Or, the material forming the restricting member 650 may be plastic, and the restricting member 650 with the opening 654 and the baffles 656 may be obtained by insert molding.

Every two of the baffles 656 are disposed opposite to each other and on an edge of the opening 654, and an angle formed between the paired baffles 656 may be 180 degrees, but is not limited to this, such that the first electronic component 620 may be fixed between the paired baffles 656. Because the angle formed between the paired baffles 656 is 180 degrees, the capacitor corresponding to the paired baffles 656 is subject to homogeneous forces, such that the capacitors (the first electronic components 620) may not be squeezed together and the pin feet of the capacitors may not be damaged. In addition, ends of the baffles 656 away from the main body 652 are tilted toward a center of the opening 654, such that a larger opening end is formed at the bottom of the baffles 656 and a smaller opening end is formed at the top of the baffles 656. When the first electronic component 620 is assembled, first weld the first electronic component 620 to the first printed wiring board 610 and then dispose the opening 654 of the restricting member 650 from the top of the first electronic component 620. Therefore, the first electronic component 620 enters from the side of the larger opening to the side of the smaller opening, and the baffles 656 are deformed by the first electronic component 620 to provide elastic forces for clamping the first electronic component 620. The number and the deposition configuration of the baffles 420 are not limited to the aforementioned description. People having ordinary skill in the art can make proper modification according to actual application.

The restricting member 650 may fix the first electronic components 620 in a group to prevent external forces from being directly exerted on the first electronic component 620 and to disperse the external forces, so as to protect the first electronic components 620. In addition, the restricting member 650 has the baffles 656, the baffles 656 may not only fix the first electronic component 620 but also provide more support when the first electronic component 620 is subject to external forces to strengthen a bending section modulus of the first electronic components 620, such that the fracture will not occur at the pin feet of the first electronic components.

The material of the heat-dissipating component 710" is metal, and the heat-dissipating component 710" may contact the heat-dissipating base as the grounding member, such that the heat-dissipating component 710" becomes the grounding member as well. To ensure that the first electronic component 620 and the heat-dissipating member 710" are electrically insulated from each other, the restricting member 650 and the heat-dissipating component 710" may be electrically insulated from each other, especially when the material of the restricting member 650 is metal.

In the embodiment, the restricting member 650 is fixed to the heat-dissipating component 710" by the insulating strut 800. The insulating strut 800 physically connects and electrically insulates the restricting member 650 and/from the heat-dissipating component 710".

The first connecting part 810 of the insulating strut 800 is fixed to the fixing portion 725" of the heat-dissipating component 710". Then, the screws T pass through the restricting member 650 and are fixed to the insulating strut 800 to fix the restricting member 650 to the insulating strut 800. Though, in the embodiment, the insulating strut 800 is used to connect and electrically insulate the restricting member 650 and the heat-dissipating member 710", the restricting member 650 and the heat-dissipating component 710" may be fixed to and electrically insulated from each other by other methods such as using plastic screws or foam adhesives.

The heat-dissipating member 710" may be fixed to the first printed wiring board 610 by the insulating strut 800 as well. The second connecting part 820 of the insulating strut 800 is fixed to the heat-dissipating component 710", and then the screws T pass through the through holes 611 of the first printed wiring board 610 and are fixed to the first connecting part 810 of the insulating strut 800. Therefore, the heat-dissipating member 710" is fixed to the first printed wiring board 610.

Figure 48:
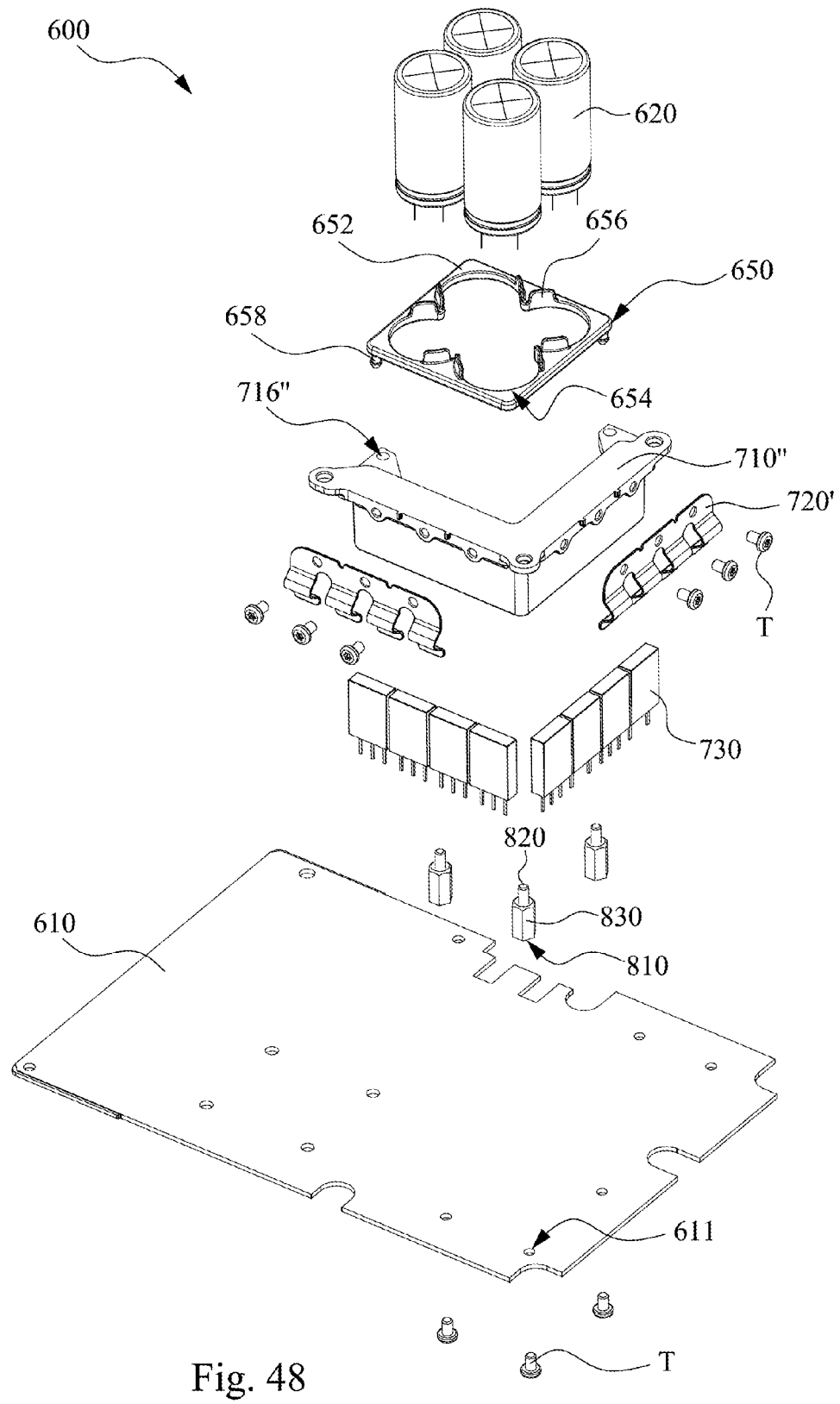
FIG. 48 is an exploded view of the first printed wiring board assembly according to another embodiment of this disclosure.

FIG. 48 is an exploded view of the first printed wiring board assembly 600 according to another embodiment of this disclosure. As shown in FIG. 48, the embodiment is similar to the aforementioned embodiment, the difference is described in the following. The material forming the restricting member 650 may be plastic, and the restricting member 650 may be fixed to the heat-dissipating member 710" by various methods. For example, the restriction member 650 may have a plurality of coupling portions 658, the heat-dissipating component 710" may have a plurality of coupling holes 716" corresponding to the coupling portions 658, and the coupling portions 658 are coupled in the coupling holes 716" to fix the restricting member 650 and the heat-dissipating member 710".

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. An electronic device, comprising:
   a heat-dissipating base;

a heat-dissipating component disposed on the heat-dissipating base;
a first elastic clip partially mounted on the heat-dissipating component;
a first printed wiring board assembly disposed on or above the heat-dissipating base, the first printed wiring board assembly comprising:
a first printed wiring board; and
at least one first electronic component disposed on the first printed wiring board, such that the first printed wiring board assembly has a raised portion and a concave portion relative to the raised portion; and
a second printed wiring board assembly at least partially disposed in the concave portion and disposed between the first printed wiring board and the heat-dissipating base, the second printed wiring board assembly comprising:
a second printed wiring board; and
at least one switching element disposed on the second printed wiring board, wherein the at least one switching element is flatly disposed relative to the second printed wiring board, and one end of the switching element is connected to the second printed wiring board, and the other end of the switching element is clamped between the heat-dissipating component and the first elastic clip.

2. The electronic device of claim 1, wherein the first electronic component is disposed between the first printed wiring board and the heat-dissipating base.

3. The electronic device of claim 1, wherein an orthogonal projection of the second printed wiring board assembly onto the first printed wiring board is separated from the first electronic component.

4. The electronic device of claim 1, wherein the second printed wiring board assembly is flatly disposed relative to the first printed wiring board.

5. The electronic device of claim 1, wherein the first printed wiring board assembly further comprises:
at least one second electronic component disposed on the first printed wiring board, wherein an orthogonal projection of the second printed wiring board assembly onto the first printed wiring board at least partially overlaps with the at least one second electronic component, and a height of the at least one second electronic component is smaller than a height of the first electronic component.

6. The electronic device of claim 1, wherein the first electronic component comprises at least one switching element.

7. The electronic device of claim 6, wherein the switching element of the first electronic component is uprightly disposed relative to the first printed wiring board.

8. The electronic device of claim 7, further comprising:
a second elastic clip partially mounted on the heat-dissipating component, wherein one end of the switching element of the first electronic component is connected to the first printed wiring board, and the other end of the switching element of the first electronic component is clamped between the heat-dissipating component and the second elastic clip.

9. The electronic device of claim 8, further comprising:
a plurality of insulated struts, wherein each of the insulated struts comprises a first connecting part, a second connecting part, and a plastic part partially covering the first connecting part and the second connecting part, and the insulated struts connect and electrically insulate the first printed wiring board and the heat-dissipating component.

10. The electronic device of claim 8, further comprising:
a restriction member having a main body and an opening disposed in the main body, wherein the first electronic component further comprises at least one capacitor, and the at least one capacitor is disposed in the opening.

11. The electronic device of claim 10, wherein the heat-dissipating component is electrically insulated from the restriction member.

12. The electronic device of claim 1, wherein the heat-dissipating base is a liquid-cooled heat-dissipating base, an air-cooled heat-dissipating base, or a combination of the liquid-cooled heat-dissipating base and the air-cooled heat-dissipating base.

13. The electronic device of claim 1, wherein the heat-dissipating base further comprises:
a main body; and
at least one first protrusion disposed on the main body, wherein the at least one first protrusion has at least one first protrusion top surface for thermally contacting at least one of the first printed wiring board assembly and the second printed wiring board assembly.

14. The electronic device of claim 13, wherein the heat-dissipating base further comprises:
at least one second protrusion disposed on the main body, wherein the at least one second protrusion has at least one second protrusion side surface for thermally contacting at least one of the first printed wiring board assembly and the second printed wiring board assembly.

15. The electronic device of claim 1, wherein the first printed wiring board assembly further comprises:
an electromagnetic induction module disposed between the first printed wiring board and the heat-dissipating base and mounted on the heat-dissipating base; and
a fixing assembly fixing the electromagnetic induction module and the first printed wiring board, such that the electromagnetic induction module is electrically connected to the first printed wiring board.

16. The electronic device of claim 15, wherein the electromagnetic induction module further comprises:
a fixing member connected to a magnetic component of the electromagnetic induction module, the fixing member comprising:
a main body having a notch, wherein the fixing member has a first surface and a second surface connected to the first surface, and a normal direction of the first surface and a normal direction of the second surface are interlaced with each other;
at least one first coupling portion disposed on the first surface; and
at least one second coupling portion disposed on the second surface;
at least one terminal, comprising:
a main body having a second through hole therein;
a third coupling portion disposed on the main body of the terminal and detachably coupled with the at least one first coupling portion, such that degrees of freedom in a first direction and a second direction of the terminal are restricted; and
a fourth coupling portion disposed on the main body of the terminal and detachably coupled with the at least one second coupling portion, such that a degree of freedom in a third direction of the terminal are restricted, wherein the first direction, the second direction, and the third direction are linearly independent;

wherein the fixing assembly comprises a nut and a screw, and the nut is disposed in the notch, and the nut has a threaded hole therein; and wherein the first printed wiring board further has a first connecting portion, the first connecting portion has a first through hole therein, and the screw passes through the first through hole of the first printed wiring board and the second through hole of the main body of the terminal, such that the screw and the nut are coupled with each other.

17. The electronic device of claim 16, wherein the terminal further comprises a connecting end, the electromagnetic induction module further comprises a wire, and the connecting end is electrically connected to the wire.

18. The electronic device of claim 1, further comprising:
a plurality of insulated struts, wherein each of the insulated struts comprises a first connecting part, a second connecting part, and a plastic part partially covering the first connecting part and the second connecting part, and the insulated struts connect and electrically insulate the first printed wiring board assembly and the heat-dissipating base.

19. A car battery charger, comprising:
a heat-dissipating base;
a heat-dissipating component disposed on the heat-dissipating base;
a first elastic clip partially mounted on the heat-dissipating component;
an input board assembly adapted to be connected to an input end and receiving an input signal, the input board assembly comprising an input printed wiring board;
an output board assembly adapted to be connected to an output end and outputting an output signal, the output board assembly comprising an output printed wiring board, at least one of the input board assembly and the output board assembly further comprising a switching element disposed on the input printed wiring board or the output printed wiring board, wherein one end of the switching element is connected to the input printed wiring board or the output printed wiring board, and the other end of the switching element is clamped between the heat-dissipating component and the first elastic clip; and
a main power board assembly disposed on the heat-dissipating base and electrically connected to the input board assembly and the output board assembly for converting the input signal to the output signal, the main power board assembly comprising:
a main printed wiring board; and
at least one first electronic component disposed on the main printed wiring board, such that the main power board assembly has a raised portion and a concave portion relative to the raised portion, wherein at least one of the input board assembly and the output board assembly is at least partially disposed in the concave portion.

20. The car battery charger of claim 19, wherein the first electronic component is disposed between the main printed wiring board and the heat-dissipating base.

21. The car battery charger of claim 19, wherein at least one of the input board assembly and the output board assembly is disposed between the main printed wiring board and the heat-dissipating base.

22. The car battery charger of claim 19, wherein an orthogonal projection of at least one of the input board assembly and the output board assembly onto the main printed wiring board is separated from the first electronic component.

23. The car battery charger of claim 19, wherein at least one of the input board assembly and the output board assembly is flatly disposed relative to the main printed wiring board.

24. The car battery charger of claim 19, wherein the main power board assembly further comprises:
at least one second electronic component disposed on the main printed wiring board, wherein an orthogonal projection of at least one of the input board assembly and the output board assembly onto the main printed wiring board at least partially overlaps with the at least one second electronic component, and a height of the at least one second electronic component is smaller than a height of the first electronic component.

25. The car battery charger of claim 19, wherein the first electronic component comprises at least one switching element.

26. The car battery charger of claim 25, wherein the switching element of the first electronic component is uprightly disposed relative to the main printed wiring board.

27. The car battery charger of claim 26, further comprising:
a second elastic clip partially mounted on the heat-dissipating component, wherein one end of the switching element of the first electronic component is connected to the main printed wiring board, and the other end of the switching element of the first electronic component is damped between the heat-dissipating component and the second elastic clip.

28. The car battery charger of claim 27, further comprising:
a plurality of insulated struts, wherein each of the insulated struts comprises a first connecting part, a second connecting part, and a plastic part partially covering the first connecting part and the second connecting part, and the insulated struts connect and electrically insulate the main printed wiring board and the heat-dissipating component.

29. The car battery charger of claim 19, further comprising:
a restriction member having a main body and an opening disposed in the main body, wherein the first electronic component further comprises at least one capacitor, and the at least one capacitor is disposed in the opening.

30. The car battery charger of claim 29, wherein the heat-dissipating component is electrically insulated from the restriction member.

31. The car battery charger of claim 19, wherein the heat-dissipating base is a liquid-cooled heat-dissipating base, an air-cooled heat-dissipating base, or a combination of the liquid-cooled heat-dissipating base and the air-cooled heat-dissipating base.

32. The car battery charger of claim 19, wherein the heat-dissipating base further comprises:
a main body; and
at least one first protrusion disposed on the main body, wherein the at least one first protrusion has at least one first protrusion top surface for thermally contacting at least one of the main power board assembly, the input board assembly, and the output board assembly.

33. The car battery charger of claim 32, wherein the heat-dissipating base further comprises:
at least one second protrusion disposed on the main body, wherein the second protrusion has at least one second protrusion side surface for thermally contacting at least one of the main power board assembly, the input board assembly, and the output board assembly.

34. The car battery charger of claim 19, wherein the main power board assembly further comprises:

an electromagnetic induction module disposed between the main printed wiring board and the heat-dissipating base and mounted on the heat-dissipating base; and a fixing assembly fixing the electromagnetic induction module and the main printed wiring board, such that the electromagnetic induction module is electrically connected to the main printed wiring board.

35. The car battery charger of claim 34, wherein the electromagnetic induction module further comprises:

a fixing member connected to a magnetic component of the electromagnetic induction module, the fixing member comprising:

a main body having a notch, wherein the fixing member has a first surface and a second surface connected to the first surface, and a normal direction of the first surface and a normal direction of the second surface are interlaced with each other;

at least one first coupling portion disposed on the first surface; and at least one second coupling portion disposed on the second surface;

at least one terminal, comprising:

a main body having a second through hole therein;

a third coupling portion disposed on the main body of the terminal and detachably coupled with the at least one first coupling portion, such that degrees of freedom in a first direction and a second direction of the terminal are restricted; and a fourth coupling portion disposed on the main body of the terminal and detachably coupled with the at least one second coupling portion, such that a degree of freedom in a third direction of the terminal are restricted, wherein the first direction, the second direction, and the third direction are linearly independent;

wherein the fixing assembly comprises a nut and a screw, and the nut is disposed in the notch, and the nut has a threaded hole therein; and wherein the first printed wiring board further has a first connecting portion, the first connecting portion has a first through hole therein, and the screw passes the first through hole of the main printed wiring board and the second through hole of the main body of the terminal, such that the screw and the nut are coupled with each other.

36. The car battery charger of claim 35, wherein the terminal further comprises a connecting end, the electromagnetic induction module further comprises a wire, and the connecting end is electrically connected to the wire.

37. The car battery charger of claim 19, further comprising:

a plurality of insulated struts, wherein each of the insulated struts comprises a first connecting part, a second connecting part, and a plastic part partially covering the first connecting part and the second connecting part, and the insulated struts connect and electrically insulate the main power board assembly and the heat-dissipating base.

* * * * *